(12) United States Patent
Todorokihara

(10) Patent No.: US 12,163,975 B2
(45) Date of Patent: Dec. 10, 2024

(54) SIGNAL PROCESSING METHOD, SIGNAL PROCESSING DEVICE, PHYSICAL QUANTITY MEASUREMENT DEVICE, AND SENSOR MODULE

(71) Applicant: Seiko Epson Corporation, Tokyo (JP)

(72) Inventor: Masayoshi Todorokihara, Suwa (JP)

(73) Assignee: SEIKO EPSON CORPORATION (JP)

( * ) Notice: Subject to any disclaimer, the term of this patent is extended or adjusted under 35 U.S.C. 154(b) by 206 days.

(21) Appl. No.: 17/562,060

(22) Filed: Dec. 27, 2021

(65) Prior Publication Data

US 2022/0214373 A1    Jul. 7, 2022

(30) Foreign Application Priority Data

Dec. 28, 2020 (JP) ................. 2020-219506

(51) Int. Cl.
  G01D 1/12 (2006.01)
  G01D 1/16 (2006.01)
  G01P 15/08 (2006.01)
  H03M 3/00 (2006.01)

(52) U.S. Cl.
  CPC ............ *G01P 15/0802* (2013.01); *G01D 1/12* (2013.01); *G01D 1/16* (2013.01); *G01P 2015/0865* (2013.01); *G01P 2015/0882* (2013.01); *H03M 3/30* (2013.01)

(58) Field of Classification Search
  CPC .......... G01D 1/12; G01D 1/16; G01P 15/097; H03M 3/30
  See application file for complete search history.

(56) References Cited

U.S. PATENT DOCUMENTS

| | | | |
|---|---|---|---|
| 7,355,481 B2 | 4/2008 | Takekawa | |
| 8,279,190 B2 * | 10/2012 | Chang | G06F 3/044 345/173 |
| 2006/0220745 A1 | 10/2006 | Takekawa | |
| 2015/0160011 A1* | 6/2015 | Nakajima | G01C 19/5776 702/56 |
| 2019/0145818 A1* | 5/2019 | Kobayashi | G01D 3/022 702/56 |
| 2019/0331491 A1 | 10/2019 | Todorokihara et al. | |

FOREIGN PATENT DOCUMENTS

JP    2006-279768 A    10/2006

OTHER PUBLICATIONS

K. M. M. Prabhu, Window Functions and Their Applications in Signal Processing, 2014, CRC Press, pp. 1-38 (Year: 2014).*
Pete Sopcik and Dara O'Sullivan, "How Sensor Performance Enables Condition-Based Monitoring Solutions", Analog Dialogue 53-06, Jun. 2019, 12 pgs.

* cited by examiner

*Primary Examiner* — Mi'schita' Henson
(74) *Attorney, Agent, or Firm* — Harness, Dickey & Pierce, P.L.C.

(57) ABSTRACT

A signal processing method includes a processing target signal generation step of generating a processing target signal which is a time-series signal based on a source signal which is a time-series signal output from an object, and a vibration rectification error calculation step of calculating a plurality of vibration rectification errors by performing product-sum operation processing of a first signal based on the processing target signal and a second signal based on a phase-shifted signal of the processing target signal a plurality of times by changing a shift amount.

11 Claims, 27 Drawing Sheets

SIGNAL PROCESSING METHOD, SIGNAL PROCESSING DEVICE, PHYSICAL QUANTITY MEASUREMENT DEVICE, AND SENSOR MODULE

BACKGROUND

The present application is based on, and claims priority from JP Application Serial Number 2020-219506, filed Dec. 28, 2020, the disclosure of which is hereby incorporated by reference herein in its entirety.

1. Technical Field

The present disclosure relates to a signal processing method, a signal processing device, a physical quantity measurement device, and a sensor module.

2. Related Art

Synchronous addition is known as a method for reducing components that are asynchronous with a target stationary repetitive waveform. However, this method has a problem that waveform components that are correlated with the repetitive waveform but are not synchronized with a synchronous addition timing are also reduced. As a method of dealing with this problem, in Pete Sopcik and Dara O'Sullivan, "How Sensor Performance Enables Condition-Based Monitoring Solutions", Analog Dialogue 53-06, June 2019, a method has been proposed in which envelope processing is performed on a target stationary repetitive time-series waveform and spectral analysis is performed on the obtained waveform.

However, in the envelope processing, it is necessary to perform the smoothing processing after rectifying the time-series waveform, and it is necessary to appropriately select the cutoff frequency of a smoothing filter so that a desired signal component is appropriately extracted, and therefore, the method described in Pete Sopcik and Dara O'Sullivan, "How Sensor Performance Enables Condition-Based Monitoring Solutions", Analog Dialogue 53-06, June 2019 complicates the calculation.

SUMMARY

A signal processing method according to an aspect of the present disclosure includes a processing target signal generation step of generating a processing target signal which is a time-series signal based on a source signal which is a time-series signal output from an object, and a vibration rectification error calculation step of calculating a plurality of vibration rectification errors by performing product-sum operation processing of a first signal based on the processing target signal and a second signal based on a phase-shifted signal of the processing target signal a plurality of times by changing a shift amount.

A signal processing device according to another aspect of the present disclosure includes a processing target signal generation circuit of generating a processing target signal which is a time-series signal based on a source signal which is a time-series signal output from an object, and a vibration rectification error calculation circuit of generating a plurality of vibration rectification errors by performing product-sum operation processing of a first signal based on the processing target signal and a second signal based on a phase-shifted signal of the processing target signal a plurality of times by changing a shift amount.

A physical quantity measurement device according to still another aspect of the present disclosure includes a reference signal generation circuit that outputs a reference signal, a frequency delta-sigma modulation circuit that performs frequency delta-sigma modulation on the reference signal by using a measured signal to generate a frequency delta-sigma modulated signal, a first filter that operates in synchronization with the measured signal and has a variable group delay amount, and a second filter that operates in synchronization with the reference signal, in which the first filter is provided on a signal path from an output of the frequency delta-sigma modulation circuit to an input of the second filter, and the device has a first operation mode for measuring a frequency ratio of the measured signal and the reference signal, and a second operation mode in which a cutoff frequency of the second filter is lower than that in the first operation mode.

A sensor module according to still another aspect of the present disclosure includes the physical quantity measurement device according to still another aspect, and a physical quantity sensor, in which the measured signal is a signal based on an output signal of the physical quantity sensor.

DESCRIPTION OF EXEMPLARY EMBODIMENTS

Hereinafter, an exemplary embodiment of the present disclosure will be described in detail with reference to drawings. The embodiments described below do not unduly limit the contents of the present disclosure described in the aspects. In addition, not all of the configurations described below are essential constituent requirements of the present disclosure.

Hereinafter, the signal processing method according to the present disclosure will be described assuming that an object for signal processing is a sensor module. The type of the object is not particularly limited as long as the object generates a signal having periodicity, and may be, for example, various devices such as a motor, a structure such as a bridge or a building, or an electric circuit, in addition to the sensor module.

1. First Embodiment 1-1. Structure of Sensor Module

First, an example of the structure of a sensor module, which is an example of the object to which a signal processing method of the present embodiment is applied, will be described.

Figure 1:
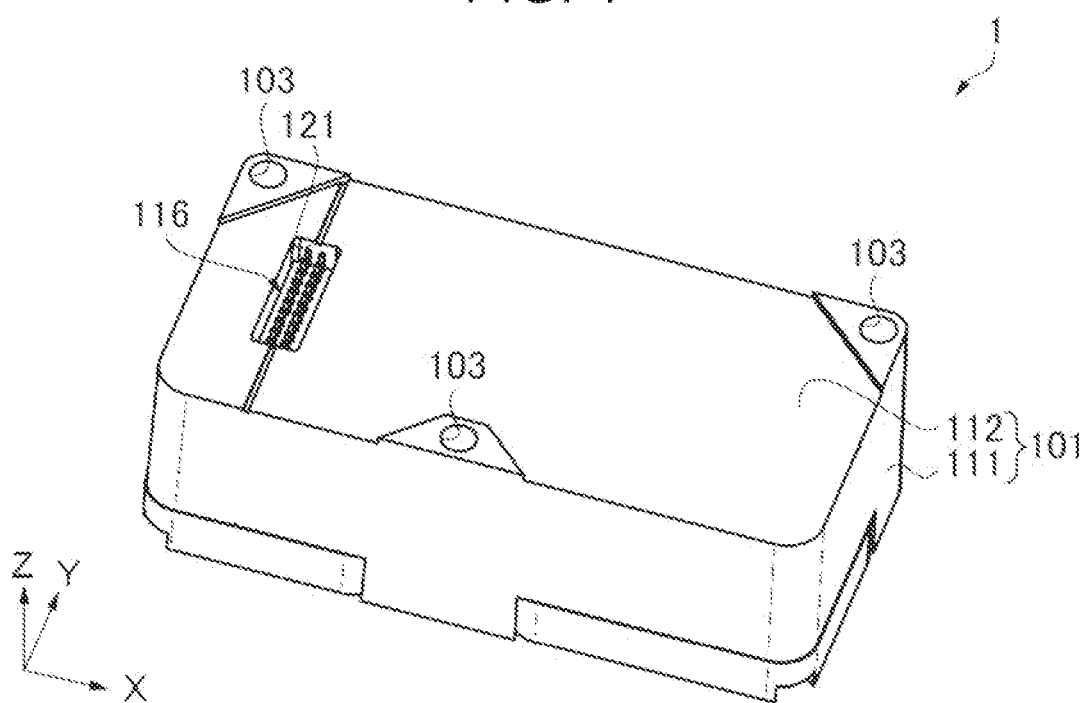
FIG. 1 is a perspective view of a sensor module.

FIG. 1 is a perspective view of a sensor module 1 when viewed from a mounting target surface side to which the sensor module 1 is fixed. In the following description, a direction along a long side of the sensor module 1 that forms a rectangle in a plan view will be described as an X-axis direction, a direction orthogonal to the X-axis direction in a plan view will be described as a Y-axis direction, and a thickness direction of the sensor module 1 will be described as a Z-axis direction.

The sensor module 1 is a rectangular parallelepiped having a rectangular planar shape, and has a long side along the X-axis direction and a short side along the Y-axis direction orthogonal to the X-axis direction. Screw holes 103 are formed at two locations near each end portion of one long side and at one location in a central portion of the other long side. Each of the screw holes 103 at three locations is used in a state of being fixed to a mounting target surface of a mounting target body of a structure such as a building, a bulletin board, or various devices via a fixing screw.

As illustrated in FIG. 1, an opening portion 121 is provided at a front surface of the sensor module 1 viewed from the mounting target surface side. A plug-type connector 116 is disposed inside the opening portion 121. The connector 116 has a plurality of pins arranged in two rows, and in each row, the plurality of pins are arranged in the Y-axis direction. A socket-type connector (not illustrated) is coupled to the connector 116 from the mounting target body, and an electric signal such as a drive voltage of the sensor module 1 and detection data is transmitted and received.

Figure 2:
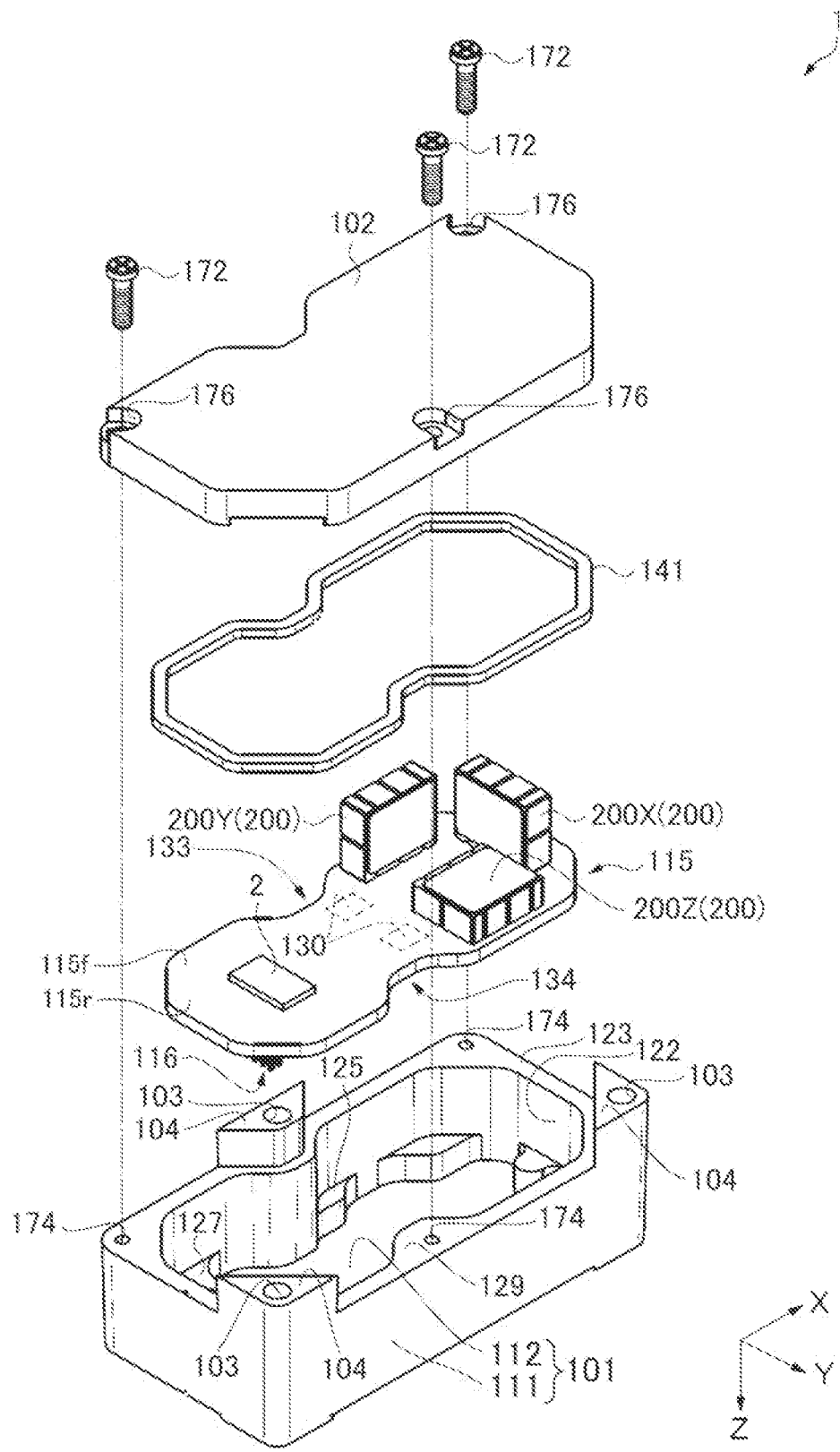
FIG. 2 is an exploded perspective view of the sensor module.

FIG. 2 is an exploded perspective view of the sensor module 1. As illustrated in FIG. 2, the sensor module 1 includes a container 101, a lid 102, a sealing member 141, a circuit substrate 115, and the like. More specifically, in the sensor module 1, the circuit substrate 115 is attached to the inside of the container 101 with a fixing member 130 interposed, and an opening of the container 101 is covered with the lid 102 via the sealing member 141 having buffering properties.

For example, the container 101 is an accommodation container for the circuit substrate 115 made of aluminum and formed into a box shape having an internal space. Similar to an overall shape of the sensor module 1 described above, an outer shape of the container 101 is a rectangular parallelepiped having a substantially rectangular planar shape, and fixed protrusions 104 are provided at two locations near both end portions of one long side and at one location in a central portion of the other long side. The screw hole 103 is formed in each of the fixed protrusions 104.

The container 101 is a box shape whose outer shape is a rectangular parallelepiped and opened on one side. The inside of the container 101 is an internal space surrounded by a bottom wall 112 and a side wall 111. In other words, the container 101 has a box shape in which one surface facing the bottom wall 112 is an opening surface 123. The container 101 is disposed so that an outer edge of the circuit substrate 115 is disposed along an inner surface 122 of the side wall 111, and the lid 102 is fixed thereto so as to cover the opening. On the opening surface 123, the fixed protrusions 104 are erected at two locations near both end portions of one long side of the container 101 and at one location in the central portion of the other long side. An upper surface of the fixed protrusion 104, that is, a surface exposed in the −Z direction protrudes from the upper surface of the container 101.

In addition, the internal space of the container 101 is provided with a protrusion 129 that protrudes from the side wall 111 toward the internal space from the bottom wall 112 to the opening surface 123 at the central portion of one long side facing the fixed protrusion 104 provided in the central portion of the other long side. A female screw 174 is provided on an upper surface of the protrusion 129. The lid 102 is fixed to the container 101 via the sealing member 141 with a screw 172 and the female screw 174 inserted through a through-hole 176. The protrusion 129 and the fixed protrusion 104 are provided at positions facing constricted portions 133 and 134 of the circuit substrate 115 described later.

In the internal space of the container 101, a first pedestal 127 and a second pedestal 125 are provided that protrude from the bottom wall 112 toward the opening surface 123 in a stepped manner. The first pedestal 127 is provided at a position facing a disposition region of the plug-type connector 116 attached to the circuit substrate 115. The first pedestal 127 is provided with the opening portion 121 illustrated in FIG. 1, and a plug-type connector 116 is inserted into the opening portion 121. The first pedestal 127 functions as a pedestal for fixing the circuit substrate 115 to the container 101.

The second pedestal 125 is located on a side opposite to the first pedestal 127 with respect to the fixed protrusion 104 and the protrusion 129 located in the central portion of the long side, and is provided in the vicinity of the fixed protrusion 104 and the protrusion 129. The second pedestal 125 functions as a pedestal for fixing the circuit substrate 115 to the container 101 on the side opposite to the first pedestal 127 with respect to the fixed protrusion 104 and the protrusion 129.

The outer shape of the container 101 is described as a box-shaped rectangular parallelepiped having the substantially rectangular planar shape with no lid, and is not limited thereto. The planar shape of the outer shape of the container 101 may be a square, a hexagon, an octagon, or the like. In addition, in the planar shape of the outer shape of the container 101, the corners of the polygonal apex portion may be chamfered, and furthermore, any one of the sides may be a planar shape made of a curve. In addition, the planar shape inside the container 101 is not limited to the shape described above, and may be another shape. Furthermore, the planar shape of the outer shape and the inside of the container 101 may be similar or may not be similar to each other.

The circuit substrate 115 is a multilayer substrate in which a plurality of through-holes and the like are formed. For example, a glass epoxy substrate, a composite substrate, a ceramic substrate, or the like is used.

The circuit substrate 115 includes a second surface 115r on the bottom wall 112 side, and a first surface 115f that has a front-rear relationship with the second surface 115r. On the first surface 115f of the circuit substrate 115, the physical quantity measurement device 2, three physical quantity sensors 200, and other electronic components (not illustrated) are mounted. In addition, the connector 116 is mounted on the second surface 115r of the circuit substrate 115. Although illustration and description thereof are omitted, the circuit substrate 115 may be provided with other wirings, terminal electrodes, and the like.

The circuit substrate 115 is provided with the constricted portions 133 and 134 in which the outer edge of the circuit substrate 115 is constricted in the central portion in the X-axis direction along the long side of the container 101 in a plan view. The constricted portions 133 and 134 are provided on both sides in the Y-axis direction of the circuit substrate 115 in a plan view, and are constricted from the outer edge of the circuit substrate 115 toward the center. In addition, the constricted portions 133 and 134 are provided to face the protrusion 129 and the fixed protrusion 104 of the container 101.

The circuit substrate 115 is inserted into the internal space of the container 101 with the second surface 115r facing the first pedestal 127 and the second pedestal 125. The circuit substrate 115 is supported by the container 101 by the first pedestal 127 and the second pedestal 125.

Each of the three physical quantity sensors 200 is a frequency change type sensor in which the frequency of the output signal changes according to an applied physical quantity. Of the three physical quantity sensors 200, a physical quantity sensor 200X detects a physical quantity in the X-axis direction, a physical quantity sensor 200Y detects a physical quantity in the Y-axis direction, and a physical quantity sensor 200Z detects a physical quantity in the Z-axis direction. Specifically, the physical quantity sensor 200X is erected so that the front and rear surfaces of a package face in the X-axis direction and the side surface faces the first surface 115f of the circuit substrate 115. The physical quantity sensor 200X outputs a signal corresponding to the detected physical quantity in the X-axis direction. The physical quantity sensor 200Y is erected so that the front and rear surfaces of a package face the Y-axis direction and the side surface faces the first surface 115f of the circuit substrate 115. The physical quantity sensor 200Y outputs a signal corresponding to the detected physical quantity in the Y-axis direction. The physical quantity sensor 200Z is provided so that the front and rear surfaces of a package face the Z-axis direction, that is, the front and rear surfaces of the package face the first surface 115f of the circuit substrate 115. The physical quantity sensor 200Z outputs a signal corresponding to the detected physical quantity in the Z-axis direction.

The physical quantity measurement device 2 is electrically coupled to the physical quantity sensors 200X, 200Y, and 200Z via wiring and electronic components (not illustrated). Further, the physical quantity measurement device 2 generates physical quantity data in which a vibration rectification error is reduced based on the output signals of the physical quantity sensor 200X, 200Y, and 200Z.

1-2. Structure of Physical Quantity Sensor

Next, an example of a structure of the physical quantity sensor 200 will be described by taking the case where the physical quantity sensor 200 is an acceleration sensor as an example. The three physical quantity sensors 200 illustrated in FIG. 2, that is, the physical quantity sensors 200X, 200Y, and 200Z may have the same structure to one another.

Figure 3:
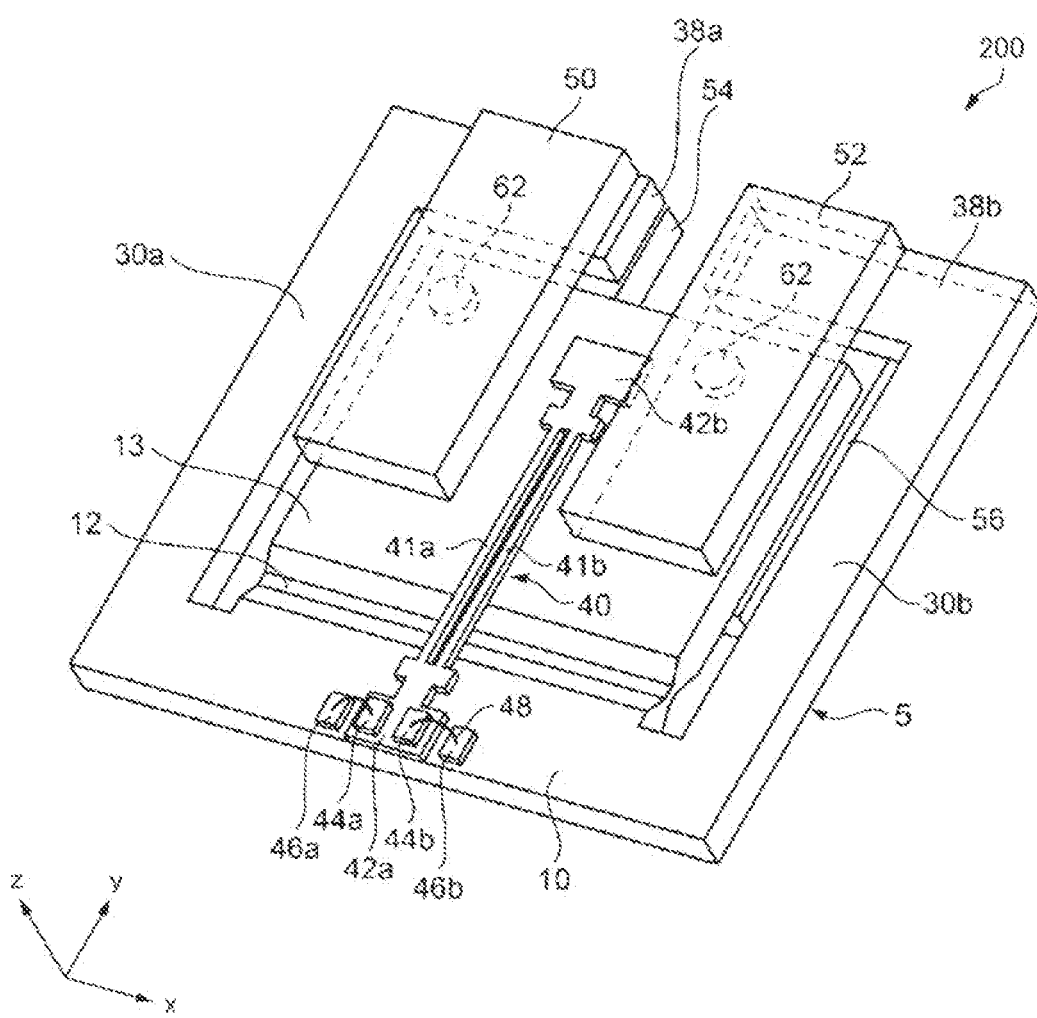
FIG. 3 is a perspective view of a physical quantity sensor.
Figure 4:
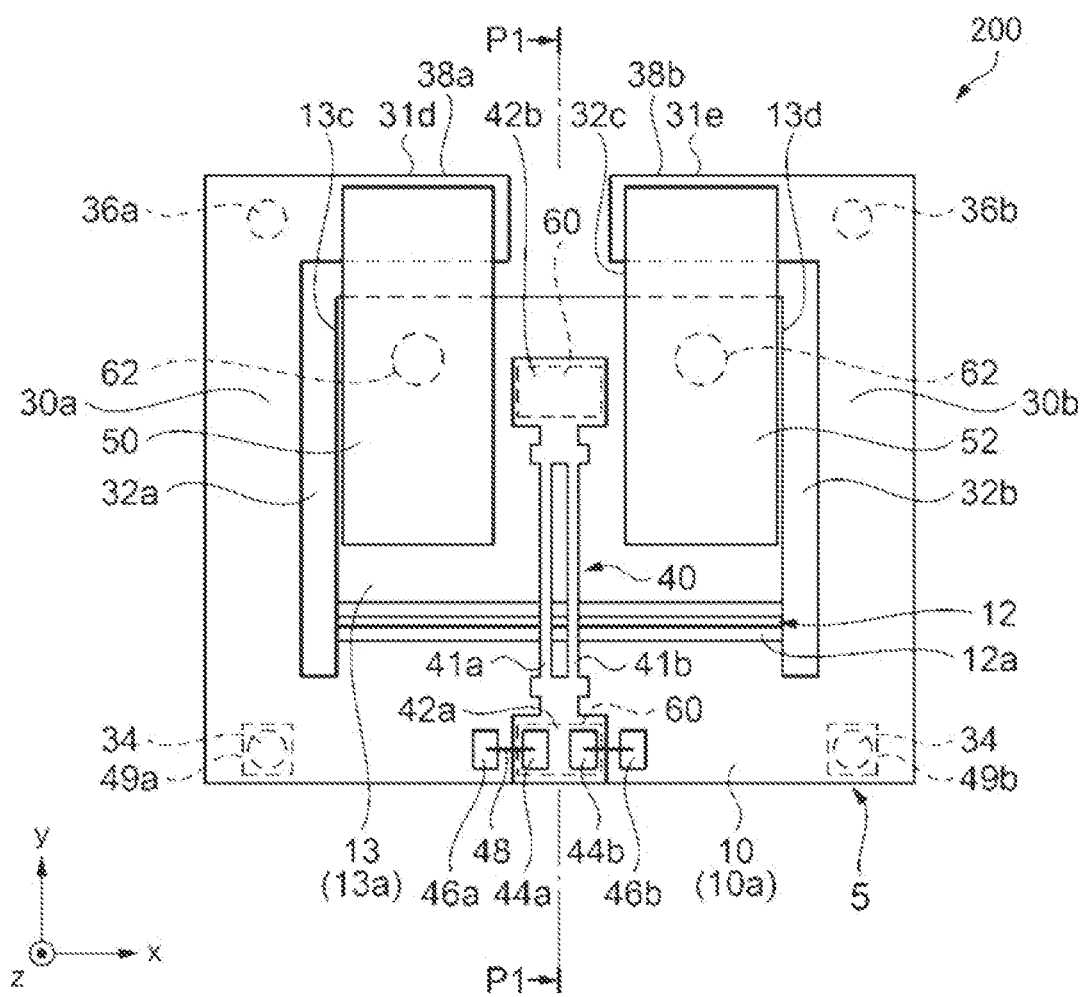
FIG. 4 is a plan view of the physical quantity sensor.
Figure 5:
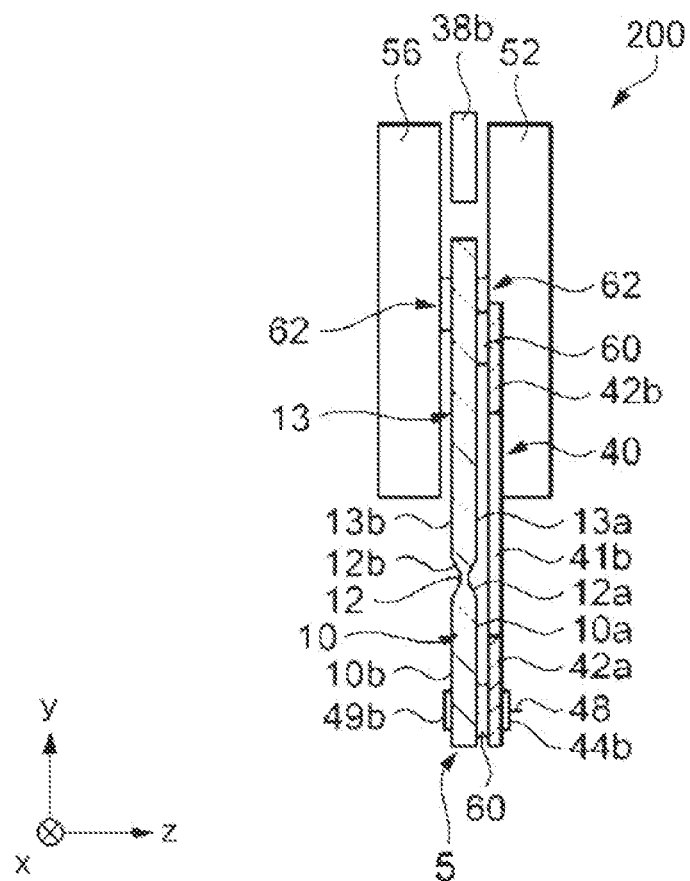
FIG. 5 is a cross-sectional view taken along line P1-P1 in FIG. 4.

FIG. 3 is a perspective view of the physical quantity sensor 200, FIG. 4 is a plan view of the physical quantity sensor 200, and FIG. 5 is a cross-sectional view taken along line P1-P1 of FIG. 4. FIGS. 3 to 5 illustrate only the inside of the package of the physical quantity sensor 200. In the subsequent drawings, for convenience of description, the x axis, the y axis, and the z axis are illustrated as three axes orthogonal to each other. In addition, in the following description, for convenience of description, a plan view when viewed from the z-axis direction as a thickness direction of extension portions 38a and 38b is simply referred to as "plan view".

As illustrated in FIGS. 3 to 5, the physical quantity sensor 200 includes a substrate portion 5 and four weights 50, 52, 54, and 56.

The substrate portion 5 is provided with a plate-like base portion 10 having principal surfaces 10a and 10b extending in the x-axis direction and facing opposite to each other, a joining portion 12 extending from the base portion 10 in the y-axis direction, a movable portion 13 extending in a rectangular shape from the joining portion 12 in a direction opposite to the base portion 10, two support portions 30a and 30b extending along an outer edge of the movable portion 13 from both ends of the base portion 10 in the x-axis direction, and a physical quantity detection element 40 spanned from the base portion 10 to the movable portion 13 and joined to the base portion 10 and the movable portion 13.

In the two support portions 30a and 30b, the support portion 30a is provided with a bonding portion 36a extending along the y axis with the movable portion 13 and a gap 32a therebetween and fixing the support portion 30a, and the extension portion 38a extending along the x axis with the movable portion 13 and a gap 32c therebetween. In other words, the support portion 30a is provided with the extension portion 38a extending along the y axis with the movable portion 13 and the gap 32a therebetween and extending along the x axis with the movable portion 13 and the gap 32c therebetween, and the bonding portion 36a is provided from the support portion 30a to the extension portion 38a. In addition, the support portion 30b is provided with a bonding portion 36b extending along the y axis with the movable portion 13 and a gap 32b therebetween and fixing the support portion 30b, and the extension portion 38b extending along the x axis with the movable portion 13 and the gap 32c therebetween. In other words, the support portion 30b is provided with the extension portion 38b extending along the y axis with the movable portion 13 and the gap 32b therebetween and extending along the x axis with the movable portion 13 and the gap 32c therebetween, and the bonding portion 36b is provided from the support portion 30b to the extension portion 38b.

The bonding portions 36a and 36b provided on the support portions 30a and 30b are for mounting the substrate portion 5 of the physical quantity sensor 200 on an external member such as a package. In addition, the base portion 10, the joining portion 12, the movable portion 13, the support portions 30a and 30b, and the extension portions 38a and 38b may be formed integrally.

The movable portion 13 is surrounded by the support portions 30a and 30b and the base portion 10, and is coupled to the base portion 10 via the joining portion 12 and is cantilevered. The movable portion 13 includes the principal surfaces 13a and 13b facing opposite to each other, a side surface 13c along the support portion 30a, and a side surface 13d along the support portion 30b. The principal surface 13a is a surface facing the same side as the principal surface 10a of the base portion 10, and the principal surface 13b is a surface facing the same side as the principal surface 10b of the base portion 10.

The joining portion 12 is provided between the base portion 10 and the movable portion 13 and couples the base portion 10 to the movable portion 13. The joining portion 12 is formed to have a smaller thickness than those of the base portion 10 and the movable portion 13. The joining portion 12 has grooves 12a and 12b. The grooves 12a and 12b are formed along the X axis. In the joining portion 12, when the movable portion 13 is displaced with respect to the base portion 10, the grooves 12a and 12b function as fulcrums, that is, intermediate hinges. Such a joining portion 12 and the movable portion 13 function as cantilever.

In addition, the physical quantity detection element 40 is fixed to a surface from the principal surface 10a of the base portion 10 to the principal surface 13a of the movable portion 13 by a bonding agent 60. The fixed positions of the physical quantity detection element 40 are two locations of the central positions in the x-axis direction of the principal surface 10a and the principal surface 13a, respectively.

The physical quantity detection element 40 includes a base portion 42a fixed to the principal surface 10a of the base portion 10 with a bonding agent 60, a base portion 42b fixed to the principal surface 13a of the movable portion 13 with a bonding agent 60, and vibration beams 41a and 41b for detecting a physical quantity between the base portion 42a and the base portion 42b. In this case, the shapes of the vibration beams 41a and 41b are prismatic shapes, and when an AC voltage drive signal is applied to excitation electrodes (not illustrated) provided on the vibration beams 41a and 41b, flexural vibration is caused to be separated from or close to each other along the x axis. That is, the physical quantity detection element 40 is a tuning fork type vibrator element.

On the base portion 42a of the physical quantity detection element 40, lead electrodes 44a and 44b are provided. These lead electrodes 44a and 44b are electrically coupled to excitation electrodes (not illustrated) provided on the vibration beams 41a and 41b. The lead electrodes 44a and 44b are electrically coupled to connection terminals 46a and 46b provided on the principal surface 10a of the base portion 10 by metal wires 48. The connection terminals 46a and 46b are electrically coupled to external connection terminals 49a and 49b by wiring (not illustrated). The external connection terminals 49a and 49b are provided on the principal surface 10b side of the base portion 10 that is a surface side on which the physical quantity sensor 200 is mounted on a package or the like so as to overlap a package bonding portion 34 in a plan view. The package bonding portion 34 is for mounting the substrate portion 5 of the physical quantity sensor 200 on an external member such as a package, and is provided at two locations on end portions at both end sides of the base portion 10 in the x-axis direction.

The physical quantity detection element 40 is formed by patterning a quartz crystal substrate cut out at a predetermined angle from a quartz crystal ore or the like by a photolithography technique and an etching technique. In this case, the physical quantity detection element 40 is preferably made of the same material as the base portion 10 and the movable portion 13 in consideration of reducing a difference between the linear expansion coefficient between the base portion 10 and the movable portion 13.

The weights 50, 52, 54, and 56 are rectangular in a plan view, and are provided on the movable portion 13. The weights 50 and 52 are fixed to the principal surface 13a of the movable portion 13 by a bonding member 62, and the weights 54 and 56 are fixed to the principal surface 13b of the movable portion 13 by the bonding member 62. Here, in the weight 50 fixed to the principal surface 13a, the directions of one side as a rectangular edge side and the side surface 13c of the movable portion 13 are aligned, and the directions of the other side and the side surface 31d of the extension portion 38a are aligned in a plan view. By aligning the directions in this manner, the weight 50 is disposed on the side surface 13c side of the movable portion 13, and the weight 50 and the extension portion 38a are disposed so as to overlap each other in a plan view. Similarly, in the weight 52 fixed to the principal surface 13a, the directions of one side as a rectangular edge side and the side surface 13d side of the movable portion 13 are aligned, and the directions of the other side and the side surface 31e of the extension portion 38b are aligned in a plan view. As a result, the weight 52 is disposed on the side surface 13d of the movable portion 13, and the weight 52 and the extension portion 38b are disposed so as to overlap each other in a plan view. In the weight 54 fixed to the principal surface 13b, the directions of one side of a rectangle and the side surface 13c side of the movable portion 13 are aligned, and the directions of the other side and the side surface 31d of the extension portion 38a are aligned in a plan view. As a result, the weight 54 is disposed on the side surface 13c of the movable portion 13, and the weight 54 and the extension portion 38a are disposed so as to overlap each other in a plan view. Similarly, in the weight 56 fixed to the principal surface 13b, the directions of one side of a rectangle and the side surface 13d side of the movable portion 13 are aligned, and the directions of the other side and the side surface 31e of the extension portion 38b are aligned in a plan view. As a result, the weight 56 is disposed on the side surface 13d of the movable portion 13, and the weight 56 and the extension portion 38b are disposed so as to overlap each other in a plan view.

In the weights 50, 52, 54, and 56 disposed in this manner, the weights 50 and 52 are disposed symmetrically with respect to the physical quantity detection element 40, and the weights 54 and 56 are disposed so as to overlap the weights 50 and 52, respectively, in a plan view. These weights 50, 52, 54, and 56 are fixed to the movable portion 13 by bonding members 62 provided at the positions of the center of gravity of the weights 50, 52, 54, and 56, respectively. In addition, the weights 50 and 54 and the extension portion 38a and the weights 52 and 56 and the extension portion 38b overlap each other respectively, in a plan view. Therefore, when an excessive physical quantity is applied, the weights 50, 52, 54, and 56 abut on the extension portions 38a and 38b, and the displacement amounts of the weights 50, 52, 54, and 56 can be suppressed.

The bonding member 62 is made of a silicone resin thermosetting adhesive or the like. The bonding member 62 is applied to the principal surface 13a and the principal surface 13b of the movable portion 13 at two locations, respectively, and the weights 50, 52, 54, and 56 are placed thereon. Thereafter, the weights 50, 52, 54, and 56 are fixed to the movable portion 13 by being cured by heating. Bonding surfaces of the weights 50, 52, 54, and 56 facing the principal surface 13a and the principal surface 13b of the movable portion 13 are rough surfaces. As a result, when the weights 50, 52, 54, and 56 are fixed to the movable portion 13, a bonding area on the bonding surface is increased, and the bonding strength can be improved.

Figure 6:
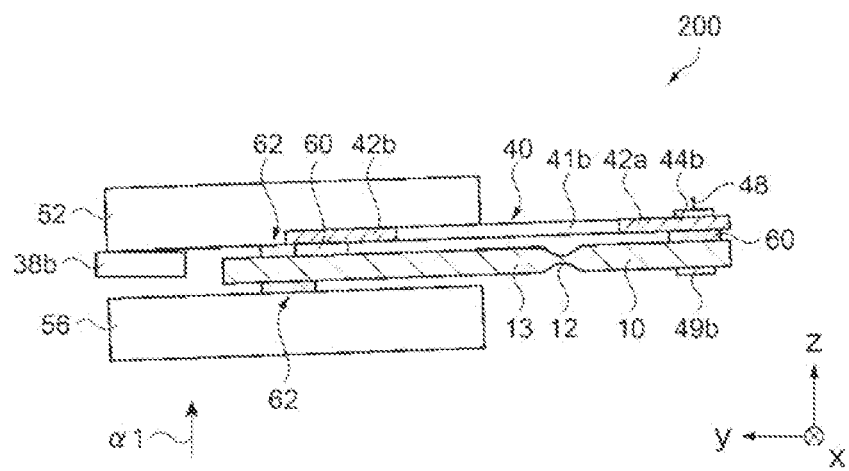
FIG. 6 is an explanatory diagram of an operation of the physical quantity sensor.

As illustrated in FIG. 6, when the acceleration in the +Z direction represented by the arrow α1 is applied to the physical quantity sensor 200 configured as described above, a force acts on the movable portion 13 in the −Z direction, and the movable portion 13 is displaced in the −Z direction with the joining portion 12 as a fulcrum. As a result, a force in a direction where the base portion 42a and the base portion 42b are separated from each other along the Y axis is applied to the physical quantity detection element 40, and tensile stress is generated in the vibration beams 41a and 41b. Therefore, the frequency at which the vibration beams 41a and 41b vibrate increases.

Figure 7:
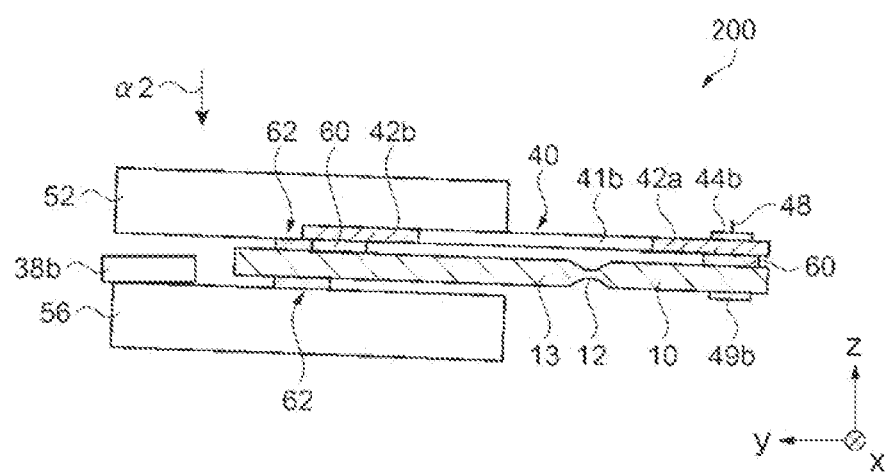
FIG. 7 is an explanatory diagram of an operation of the physical quantity sensor.

On the other hand, as illustrated in FIG. 7, when acceleration in the −Z direction represented by the arrow α2 is applied to the physical quantity sensor 200, a force acts on the movable portion 13 in the +Z direction, and the movable portion 13 is displaced in the +Z direction with the joining portion 12 as a fulcrum. As a result, a force in a direction where the base portion 42a and the base portion 42b approach each other along the Y axis is applied to the physical quantity detection element 40, and compressive stress is generated in the vibration beams 41a and 41b. Therefore, the frequency at which the vibration beams 41a and 41b vibrate decreases.

When the frequency at which the vibration beams 41a and 41b vibrate changes according to the acceleration, the frequency of signals output from the external connection terminals 49a and 49b of the physical quantity sensor 200 changes. The sensor module 1 can calculate the value of the acceleration applied to the physical quantity sensor 200 based on the change in the frequency of the output signal of the physical quantity sensor 200.

In order to increase the detection accuracy of acceleration which is a physical quantity, the joining portion 12 that connects the base portion 10 as a fixed portion and the movable portion 13 is preferably a quartz crystal that is a member having a high Q value. For example, the base portion 10, the support portions 30a and 30b, and the movable portion 13 may be formed of a quartz crystal plate, and the grooves 12a and 12b of the joining portion 12 may be formed by half etching from both surfaces of the quartz crystal plate.

1-3. Functional Configuration of Sensor Module

Figure 8:
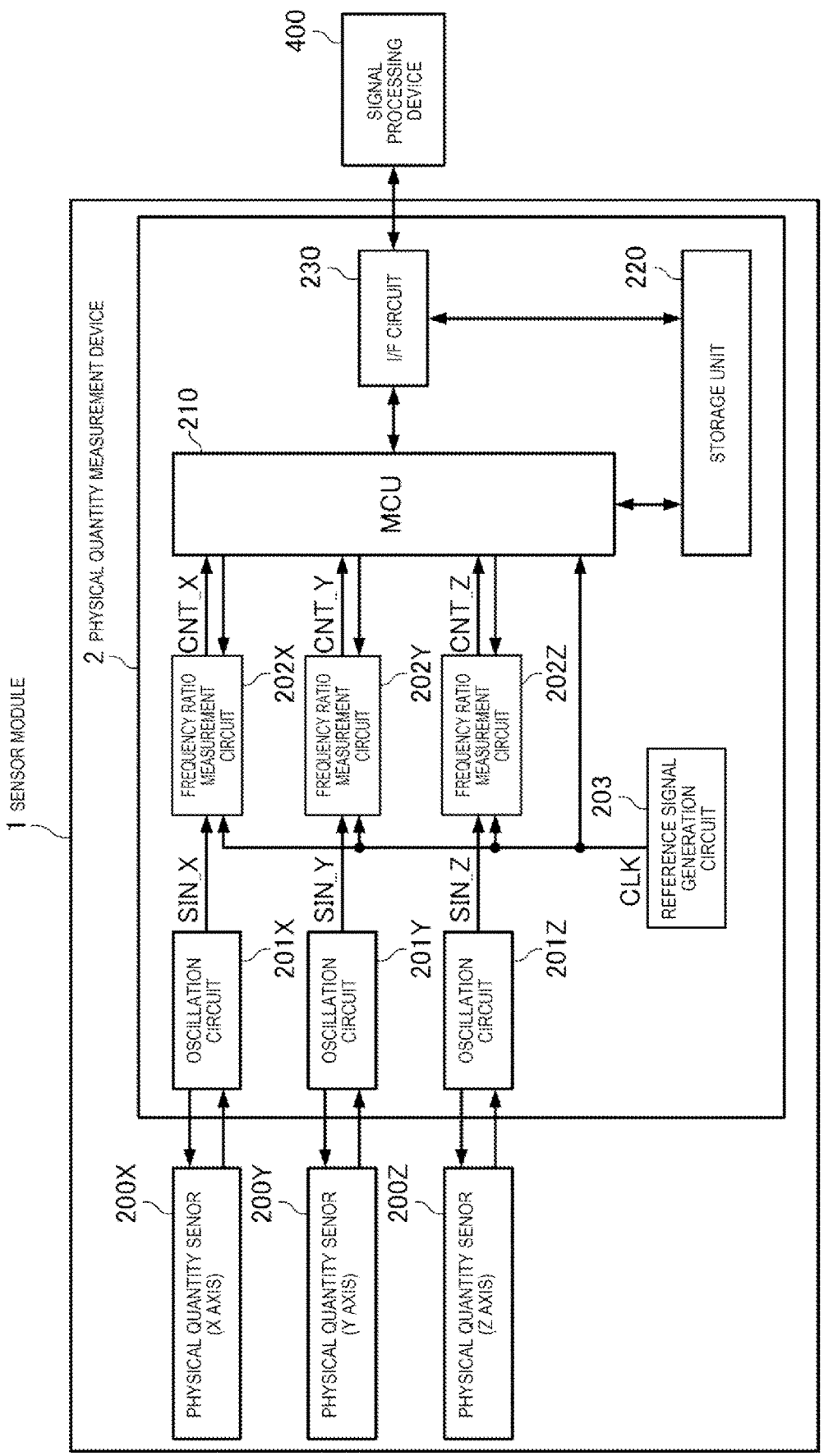
FIG. 8 is a functional block diagram of the sensor module.

FIG. 8 is a functional block diagram of the sensor module 1. As described above, the sensor module 1 includes physical quantity sensor 200X, 200Y, and 200Z and a physical quantity measurement device 2.

The physical quantity measurement device 2 includes an oscillation circuit 201X, 201Y, and 201Z, a frequency ratio measurement circuit 202X, 202Y, and 202Z, a micro-control unit 210, a storage unit 220, and an interface circuit 230.

The oscillation circuit 201X amplifies the output signal of the physical quantity sensor 200X to generate a drive signal, and applies the drive signal to the physical quantity sensor 200X. Due to the drive signal, the vibration beams 41a and 41b of the physical quantity sensor 200X vibrate at a frequency corresponding to the acceleration in the X-axis direction, and a signal of the frequency is output from the physical quantity sensor 200X. Further, the oscillation circuit 201X outputs a measured signal SIN_X, which is a rectangular wave signal obtained by amplifying the output signal of the physical quantity sensor 200X, to the frequency ratio measurement circuit 202X. The measured signal SIN_X is a signal based on the output signal of the physical quantity sensor 200X.

Similarly, the oscillation circuit 201Y amplifies the output signal of the physical quantity sensor 200Y to generate a drive signal, and applies the drive signal to the physical quantity sensor 200Y. Due to the drive signal, the vibration beams 41a and 41b of the physical quantity sensor 200Y vibrate at a frequency corresponding to the acceleration in the Y-axis direction, and a signal of the frequency is output from the physical quantity sensor 200Y. Further, the oscillation circuit 201Y outputs a measured signal SIN_Y, which is a rectangular wave signal obtained by amplifying the output signal of the physical quantity sensor 200Y, to the frequency ratio measurement circuit 202Y. The measured signal SIN_Y is a signal based on the output signal of the physical quantity sensor 200Y.

Similarly, the oscillation circuit 201Z amplifies the output signal of the physical quantity sensor 200Z to generate a drive signal, and applies the drive signal to the physical quantity sensor 200Z. Due to the drive signal, the vibration beams 41a and 41b of the physical quantity sensor 200Z vibrate at a frequency corresponding to the acceleration in the Z-axis direction, and a signal of the frequency is output from the physical quantity sensor 200Z. Further, the oscillation circuit 201Z outputs a measured signal SIN_Z, which is a rectangular wave signal obtained by amplifying the output signal of the physical quantity sensor 200Z, to the frequency ratio measurement circuit 202Z. The measured signal SIN_Z is a signal based on the output signal of the physical quantity sensor 200Z.

The reference signal generation circuit 203 generates and outputs a reference signal CLK having a constant frequency. In the present embodiment, the frequency of the reference signal CLK is higher than the frequencies of the measured signals SIN_X, SIN_Y, and SIN_Z. The reference signal CLK preferably has high frequency accuracy, and the reference signal generation circuit 203 may be, for example, a temperature compensated crystal oscillator.

The frequency ratio measurement circuit 202X counts the number of pulses of the reference signal CLK included in a predetermined period of the measured signal SIN_X, which is a signal based on the signal output from the oscillation circuit 201X, and outputs a count value CNT_X. The count value CNT_X is a reciprocal count value corresponding to the frequency ratio of the measured signal SIN_X and the reference signal CLK.

The frequency ratio measurement circuit 202Y counts the number of pulses of the reference signal CLK included in a predetermined period of the measured signal SIN_Y output from the oscillation circuit 201Y, and outputs a count value CNT_Y. The count value CNT_Y is a reciprocal count value corresponding to the frequency ratio of the measured signal SIN_Y and the reference signal CLK.

The frequency ratio measurement circuit 202Z counts the number of pulses of the reference signal CLK included in a predetermined period of the measured signal SIN_Z output from the oscillation circuit 201Z, and outputs a count value CNT_Z. The count value CNT_Z is a reciprocal count value corresponding to the frequency ratio of the measured signal SIN_Z and the reference signal CLK.

The storage unit 220 stores programs and data, and may include a volatile memory such as SRAM or DRAM. SRAM is an abbreviation for static random access memory, and DRAM is an abbreviation for dynamic random access memory.

In addition, the storage unit 220 may include a non-volatile memory such as a semiconductor memory such as EEPROM or flash memory, a magnetic storage device such as a hard disk device, or an optical storage device such as an optical disk device. EEPROM is an abbreviation for electrically erasable programmable read only memory.

The micro-control unit 210 operates in synchronization with the reference signal CLK, and performs predetermined arithmetic processing and control processing by executing a program (not illustrated) stored in the storage unit 220. For example, the micro-control unit 210 measures the physical quantities detected by the physical quantity sensors 200X, 200Y, and 200Z, respectively based on the count value CNT_X output from the frequency ratio measurement circuit 202X, the count value CNT_Y output from the frequency ratio measurement circuit 202Y, and the count value CNT_Z output from the frequency ratio measurement circuit 202Z. Specifically, the micro-control unit 210 converts the count value CNT_X, the count value CNT_Y, and the count value CNT_Z into a measurement value of the physical quantity in the X-axis direction, a measurement value of the physical quantity in the Y-axis direction, and a measurement value of the physical quantity in the Z-axis direction, respectively. For example, the storage unit 220 stores table information that defines the correspondence relationship between the count value and the measurement value of the physical quantity, or information on the relational expression between the count value and the measurement value of the physical quantity, and the micro-control unit 210 may convert each count value into a measurement value of a physical quantity with reference to the information.

The micro-control unit 210 may transmit the measurement value of the physical quantity in the X-axis direction, the measurement value of the physical quantity in the Y-axis direction, and the measurement value of the physical quantity in the Z-axis direction to the signal processing device 400 via the interface circuit 230. Alternatively, the micro-control unit 210 may write the measurement value of the physical quantity in the X-axis direction, the measurement value of the physical quantity in the Y-axis direction, and the measurement value of the physical quantity in the Z-axis direction to the storage unit 220, respectively, and the signal processing device 400 may read out each measurement value via the interface circuit 230.

Since the configuration and operation of the frequency ratio measurement circuits 202X, 202Y, and 202Z are the same, any one of the frequency ratio measurement circuits 202X, 202Y, and 202Z will be referred to as a frequency ratio measurement circuit 202 hereafter. Further, any one of the measured signals SIN_X, SIN_Y, and SIN_Z input to the frequency ratio measurement circuit 202 is referred to as a measured signal SIN, and any one of the count values CNT_X, CNT_Y, and CNT_Z output from the frequency ratio measurement circuit 202 is referred to as a count value CNT.

1-4. Vibration Rectification Error

A vibration rectification error corresponds to the DC offset generated during rectification due to the non-linearity of the response of the sensor module 1 to vibration, and is observed as an abnormal shift of the output offset of the sensor module 1. The vibration rectification error causes a serious measurement error in an application such as an inclinometer using the sensor module 1 in which the DC output of the sensor module 1 is a measurement target as it is. There are three main mechanisms that cause a vibration rectification error: 1. due to asymmetric rails, 2. due to non-linearity of scale factors, and 3. due to structural resonance of the physical quantity sensor 200.

1. Vibration Rectification Error Due to Asymmetric Rails

When the sensitivity axis of the physical quantity sensor 200 is in the direction of gravitational acceleration, the measurement value of the sensor module 1 has an offset corresponding to the gravitational acceleration of 1 g=9.8 m/s$^2$. For example, if the dynamic range of the physical quantity sensor 200 is 2 g, vibration can be measured up to 1 g without clipping. If vibration exceeding 1 g is applied in this state, clipping occurs asymmetrically, and therefore the measurement value includes a vibration rectification error.

When the dynamic range is as wide as 15 g, for example, clipping is rarely a problem in a normal usage environment. On the other hand, the physical quantity sensor 200 has a built-in physical protection mechanism for the purpose of preventing damage to the physical quantity detection element 40, and when the vibration level exceeds a certain threshold value, the protection mechanism works, and therefore clipping occurs. In order to prevent clipping, it is necessary to devise an attachment for installing the sensor module 1 and take measures such as damping the vibration of a resonance frequency band.

2. Vibration Rectification Error Due to Non-Linearity of Scale Factors

Figure 9:
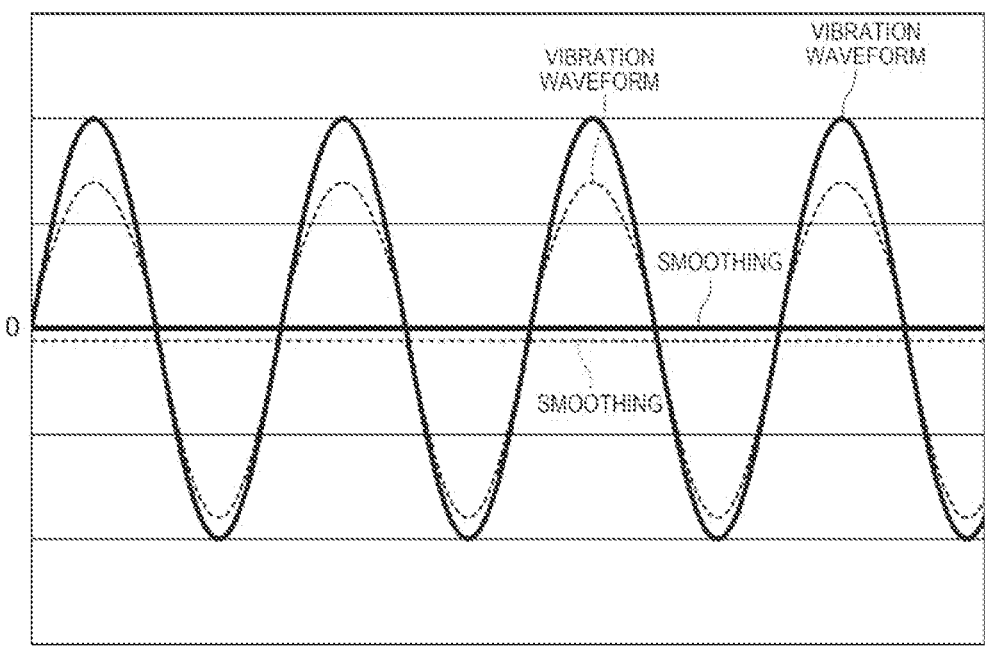
FIG. 9 is a diagram illustrating in principle that a vibration rectification error occurs due to output waveform distortion.

FIG. 9 is a diagram illustrating in principle that a vibration rectification error occurs due to output waveform distortion. In FIG. 9, the solid line indicates a sinusoidal vibration waveform and a smoothed waveform of the vibration waveform, and the broken line indicates an asymmetrical vibration waveform above and below the center of vibration and a smoothed waveform of the vibration waveform. The smoothed waveform indicated by the solid line is 0, while the smoothed waveform indicated by the broken line has a negative value, and an offset occurs during smoothing.

The physical quantity sensor 200 is a frequency change type sensor, and the count value CNT corresponding to the frequency ratio of the measured signal SIN and the reference signal CLK is a reciprocal count value. The relationship between the acceleration applied to the physical quantity sensor 200 and the reciprocal count value has non-linearity. The broken line in FIG. 10 indicates the non-linearity between the applied acceleration and the reciprocal count value. The broken line in FIG. 11 indicates the non-linearity between the applied acceleration and the oscillation frequency of the physical quantity sensor 200. The broken line in FIG. 12 indicates the non-linearity between the oscillation frequency of the physical quantity sensor 200 and the reciprocal count value. The broken line in FIG. 10 is obtained by combining the broken line in FIG. 11 and the broken line in FIG. 12.

Figure 10:
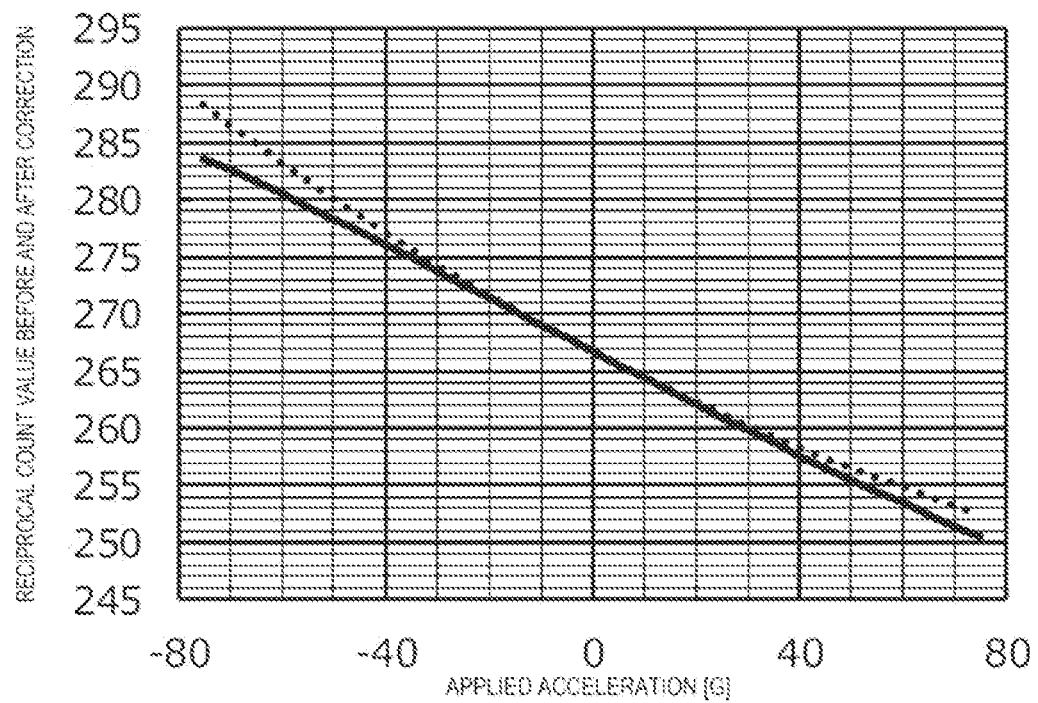
FIG. 10 is a diagram illustrating the non-linearity between applied acceleration and a reciprocal count value.
Figure 11:
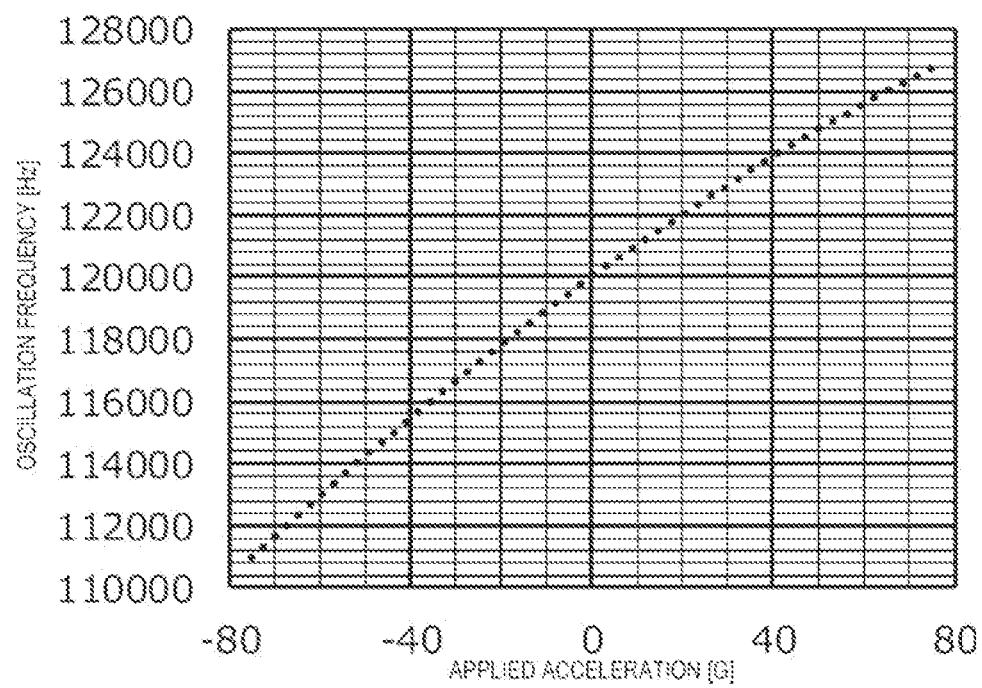
FIG. 11 is a diagram illustrating the non-linearity between applied acceleration and the oscillation frequency of the physical quantity sensor.
Figure 12:
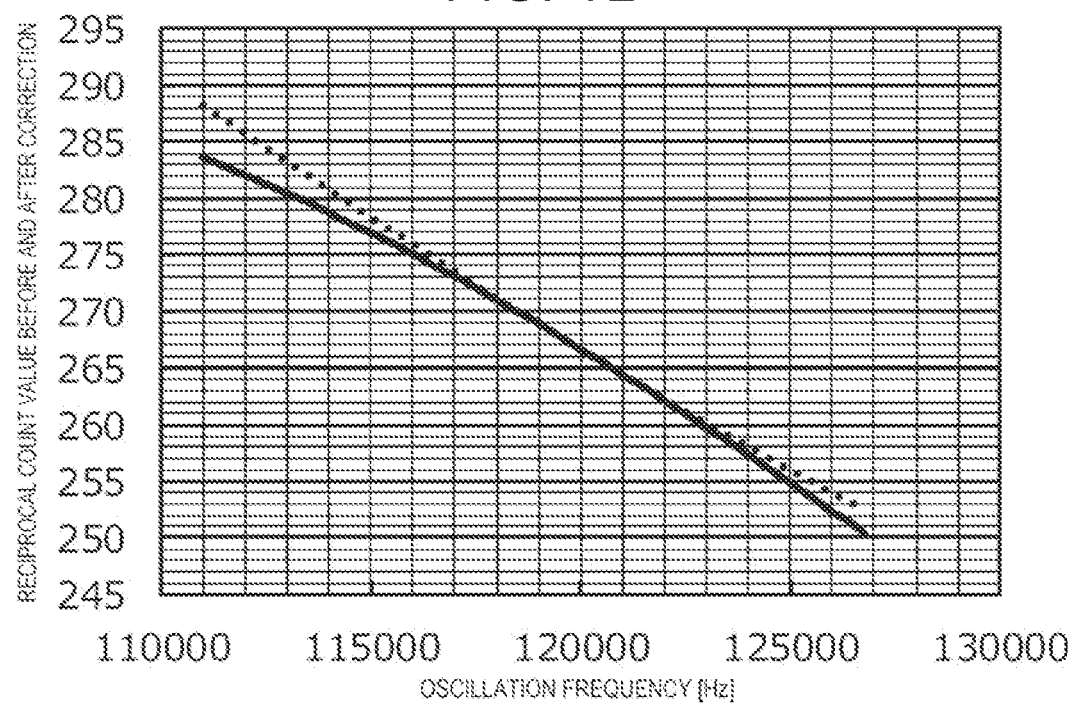
FIG. 12 is a diagram illustrating the non-linearity between the oscillation frequency of the physical quantity sensor and the reciprocal count value.

Here, by correcting the relationship between the oscillation frequency and the reciprocal count value as indicated by the solid line in FIG. 12, the relationship between the acceleration and the reciprocal count value can be made linear as indicated by the solid line in FIG. 10. Specifically, the above-mentioned micro-control unit 210 can correct the count value CNT by using the correction function represented by Equation (1).

$$Y=\{c-d\}^2 \qquad (1)$$

In Equation (1), c is the count value before correction corresponding to the broken line in FIG. 10, Y is the count value after correction corresponding to the solid line in FIG. 10, and d is a coefficient that determines the degree of correction illustrated in FIG. 12. For example, the coefficient d is stored in the storage unit 220 or set by the signal processing device 400.

3. Vibration Rectification Error Caused by Cantilever Resonance

As a principle of detecting acceleration, the physical quantity sensor 200 changes the tension acting on the physical quantity detection element 40 by transmitting the deflection of the cantilever with a weight due to the acceleration to the physical quantity detection element 40 which is a twin tuning fork resonator, thereby changing the oscillation frequency. Therefore, the physical quantity detection element 40 has a resonance frequency due to the structure of the cantilever, and when the cantilever resonance is excited, an inherent vibration rectification error occurs. The cantilever resonance has a frequency higher than the frequency bandwidth corresponding to the range of detectable acceleration, and the vibration component thereof is removed by the low-pass filter inside the physical quantity measurement device 2, but a vibration rectification error occurs as a bias offset that reflects the asymmetry of vibration. As the amplitude of the cantilever resonance increases, the asymmetry of the output waveform of the physical quantity sensor 200 increases, and therefore the vibration rectification error also increases. Therefore, it is an important issue to reduce the vibration rectification error caused by the cantilever resonance.

In the present embodiment, since the frequency ratio measurement circuit 202 is a reciprocal counting system that counts the number of pulses of the reference signal CLK included in a predetermined period of the measured signal SIN, the timing of acquiring this count value is synchronized with the measured signal SIN. On the other hand, the count value CNT output from the frequency ratio measurement circuit 202 needs to be synchronized with the frequency division signal of the reference signal CLK, and resampling is required because the timing of acquiring the count value of the number of pulses of the reference signal CLK and the frequency division signal of the reference signal CLK are not synchronized. By devising the configuration required for resampling in the frequency ratio measurement circuit 202, it is possible to generate the count value CNT_in which the vibration rectification error caused by the cantilever resonance is corrected.

1-5. Configuration of Frequency Ratio Measurement Circuit

Figure 13:
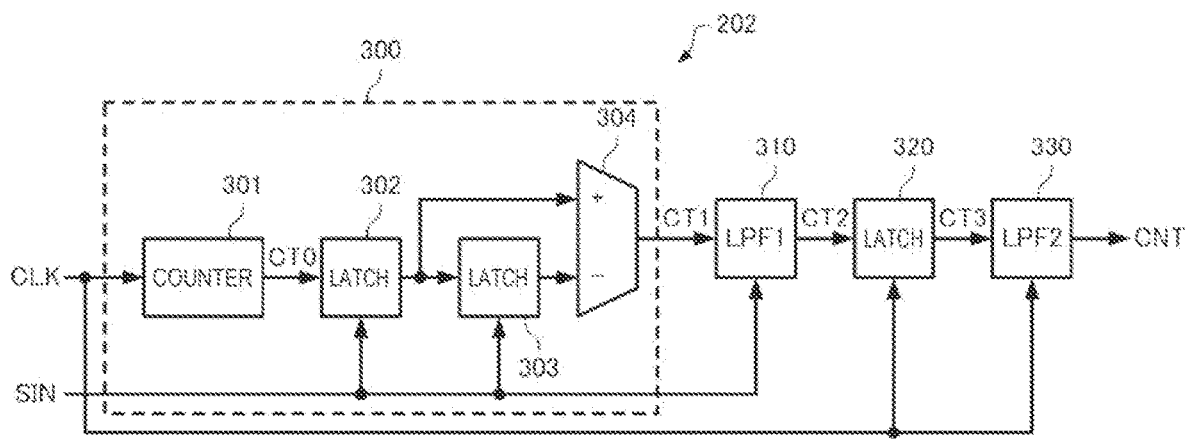
FIG. 13 is a diagram illustrating a configuration example of a frequency ratio measurement circuit.

The frequency ratio measurement circuit 202 measures the frequency ratio of the measured signal SIN and the reference signal CLK by the reciprocal counting system. FIG. 13 is a diagram illustrating a configuration example of the frequency ratio measurement circuit 202. As illustrated in FIG. 13, the frequency ratio measurement circuit 202 includes a frequency delta-sigma modulation circuit 300, a first low-pass filter 310, a latch circuit 320, and a second low-pass filter 330.

The frequency delta-sigma modulation circuit 300 performs frequency delta-sigma modulation on the reference signal CLK by using the measured signal SIN to generate a frequency delta-sigma modulated signal. The frequency delta-sigma modulation circuit 300 includes a counter 301, a latch circuit 302, a latch circuit 303, and a subtractor 304. The counter 301 counts the rising edge of the reference signal CLK and outputs a count value CT0. The latch circuit 302 latches and holds the count value CT0 in synchronization with the rising edge of the measured signal SIN. The latch circuit 303 latches and holds the count value held by the latch circuit 302 in synchronization with the rising edge of the measured signal SIN. The subtractor 304 subtracts the count value held by the latch circuit 303 from the count value held by the latch circuit 302 to generate and output a count value CT1. This count value CT1 is a frequency delta-sigma modulated signal generated by the frequency delta-sigma modulation circuit 300.

This frequency delta-sigma modulation circuit 300 is also called a primary frequency delta-sigma modulator, and latches the count value of the number of pulses of the reference signal CLK twice by the measured signal SIN, and sequentially holds the count value of the number of pulses of the reference signal CLK, triggered by the rising edge of the measured signal SIN. Here, the frequency delta-sigma modulation circuit 300 has been described as performing the latch operation at the rising edge of the measured signal SIN, but the latch operation may be performed at the falling edge or both the rising edge and the falling edge. Further, the subtractor 304 calculates the difference between the two count values held in the latch circuits 302 and 303 to output an increment of the count value of the number of pulses of the reference signal CLK observed during one period of the measured signal SIN_with the passage of time without a dead period. When the frequency of the measured signal SIN is fx and the frequency of the reference signal CLK is fc, the frequency ratio is fc/fx. The frequency delta-sigma modulation circuit 300 outputs a frequency delta-sigma modulated signal indicating the frequency ratio as a digital signal sequence.

The first low-pass filter 310 operates in synchronization with the measured signal SIN, and outputs a count value CT2 from which the noise component included in the count value CT1 which is the frequency delta-sigma modulated signal output from the frequency delta-sigma modulation circuit 300 is removed or reduced. In FIG. 13, the first low-pass filter 310 is provided immediately after the frequency delta-sigma modulation circuit 300, but may be provided on the signal path from the output of the frequency delta-sigma modulation circuit 300 to the input of the second low-pass filter 330.

The latch circuit 320 latches the count value CT2 output from the first low-pass filter 310 in synchronization with the rising edge of the reference signal CLK, and holds the latched value as a count value CT3.

The second low-pass filter 330 operates in synchronization with the reference signal CLK, and outputs a count value obtained by removing or reducing a noise component included in the count value CT3 held by the latch circuit 320. The count value output from the second low-pass filter 330 is output to the micro-control unit 210 as the count value CNT.

Figure 14:
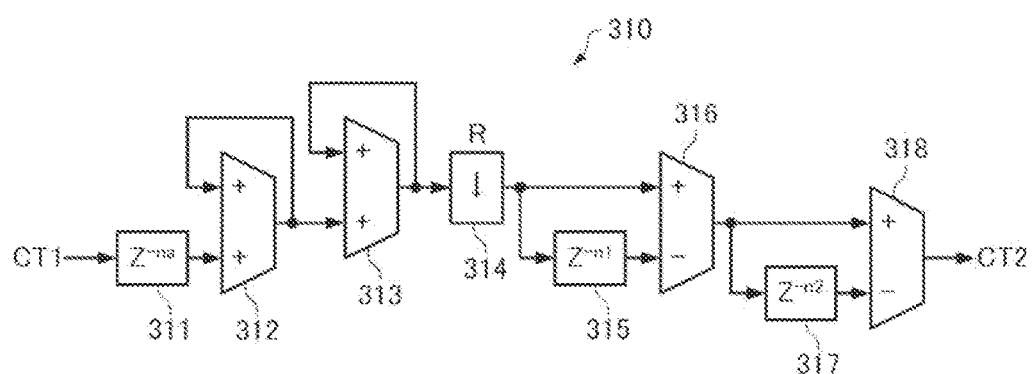
FIG. 14 is a diagram illustrating a configuration example of a first low-pass filter.

FIG. 14 is a diagram illustrating a configuration example of the first low-pass filter 310. In the example of FIG. 14, the first low-pass filter 310 includes a delay element 311, an integrator 312, an integrator 313, a decimator 314, a delay element 315, a differentiator 316, a delay element 317, and a differentiator 318. Each part of the first low-pass filter 310 operates in synchronization with the measured signal SIN.

The delay element 311 outputs a count value obtained by delaying the count value CT1 in synchronization with the measured signal SIN. The number of taps of the delay element 311 is na. For example, the delay element 311 is realized by a shift register in which na registers are serially coupled.

The integrator 312 outputs a count value obtained by integrating the count values output from the delay element 311 in synchronization with the measured signal SIN.

The integrator 313 outputs a count value obtained by integrating the count values output from the integrator 312 in synchronization with the measured signal SIN.

The decimator 314 outputs a count value obtained by decimating the count value output from the integrator 313 to a rate of 1/R in synchronization with the measured signal SIN.

The delay element 315 outputs a count value obtained by delaying the count value output from the decimator 314 in synchronization with the measured signal SIN. The number of taps of the delay element 315 is n1. For example, the delay element 315 is realized by a shift register in which n1 registers are serially coupled.

The differentiator 316 outputs a count value obtained by subtracting the count value output from the delay element 315 from the count value output from the decimator 314.

The delay element 317 outputs a count value obtained by delaying the count value output from the differentiator 316 in synchronization with the measured signal SIN. The number of taps of the delay element 317 is n2. For example, the delay element 317 is realized by a shift register in which n2 registers are serially coupled.

The differentiator 318 outputs the count value CT2 obtained by subtracting the count value output from the delay element 317 from the count value output from the differentiator 316.

The number of taps n1 and n2 and a decimation ratio R are fixed, and the number of taps na is variable. For example, the number of taps na is stored in the storage unit 220 or set by the signal processing device 400.

The first low-pass filter 310 configured in this way functions as a CIC filter in which the group delay amount is variable depending on the number of taps na. CIC is an abbreviation for cascaded integrator comb.

Figure 15:
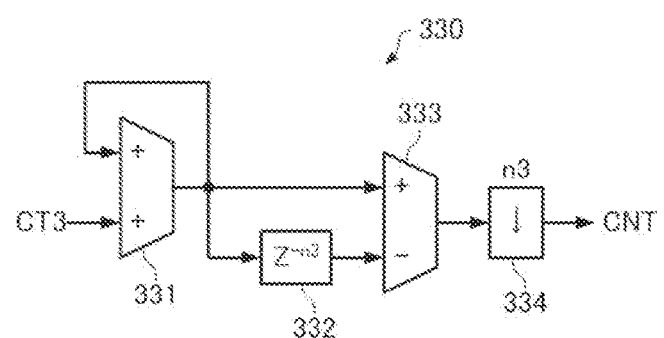
FIG. 15 is a diagram illustrating a configuration example of a second low-pass filter.

FIG. 15 is a diagram illustrating a configuration example of the second low-pass filter 330. In the example of FIG. 15, the second low-pass filter 330 includes an integrator 331, a delay element 332, a differentiator 333, and a decimator 334. Each part of the second low-pass filter 330 operates in synchronization with the reference signal CLK.

The integrator 331 outputs a count value obtained by integrating the count values CT3 in synchronization with the reference signal CLK.

The delay element 332 outputs a count value obtained by delaying the count value output from the integrator 331 in synchronization with the reference signal CLK. The number of taps of the delay element 332 is n3. For example, the delay element 332 is realized by a shift register in which n3 registers are serially coupled.

The differentiator 333 outputs a count value obtained by subtracting the count value output from the delay element 332 from the count value output from the integrator 331.

The decimator 334 outputs the count value CNT obtained by decimating the count value output from the differentiator 333 to a rate of 1/n3 in synchronization with the reference signal CLK.

The number of taps and the decimation ratio n3 are fixed.

Since the second low-pass filter 330 configured in this way integrates the count values CT3 while resampling the count values CT3 with the reference signal CLK, the second low-pass filter 330 functions as a weighted moving average filter for weighting the count values CT3 by the duration thereof.

Since the first low-pass filter 310 operates in synchronization with the measured signal SIN, and the second low-pass filter 330 performs resampling synchronized with the reference signal CLK n this way, non-linearity occurs in the input and the output of the frequency ratio measurement circuit 202. Therefore, the count value CNT output from the frequency ratio measurement circuit 202 includes a vibration rectification error due to this non-linearity. This vibration rectification error can be adjusted by adjusting the number of taps na of the delay element 311 included in the first low-pass filter 310.

FIGS. 16A to 16D are diagrams illustrating that the vibration rectification error due to the non-linearity of the input and the output of the frequency ratio measurement circuit 202 can be adjusted. FIGS. 16A to 16D illustrate examples of the case where the period of the measured signal SIN is longer than the period of the reference signal CLK and the update period of the count value CNT is longer than the period of the measured signal SIN, and the horizontal-axis direction corresponds to the passage of time. In FIGS. 16A to 16D, regarding the reference signal CLK, the timing of the rising edge is indicated by the short vertical line. Further, regarding the count values CT1 and CT2, the timing at which the values change is indicated by the short vertical line. In FIGS. 16A to 16D, for the purpose of describing the adjustment mechanism of the vibration rectification error, simplified numerical values are used for easy understanding. Further, it is described that the count value CT2 is fixed before the count value CT1 is fixed although the count value CT2 is not fixed until after the count value CT1 is fixed. But the actual calculation of the count value CT2 is executed after the count value CT1 is fixed.

Figure 16A:
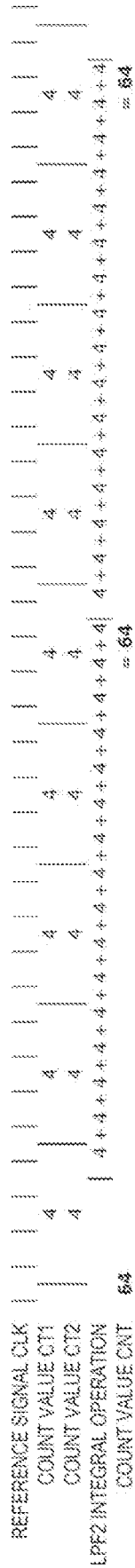
FIGS. 16A to 16D are diagrams illustrating that the mvibration rectification error due to the non-linearity of an input and an output of the frequency ratio measurement circuit can be adjusted.
Figure 16B:
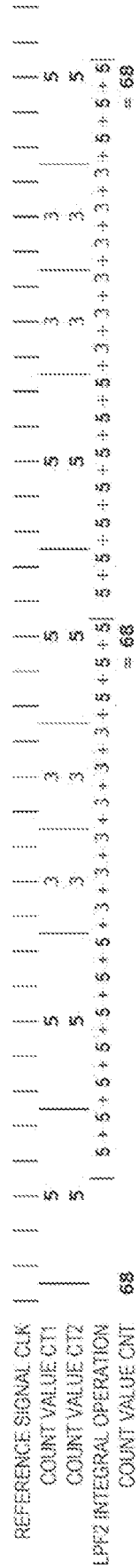
Figure 16C:
Figure 16D:
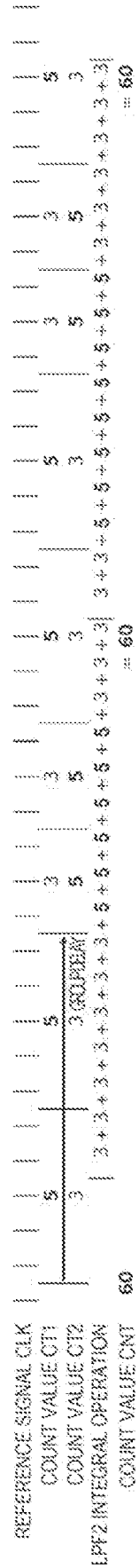

In FIGS. 16A to 16D, FIG. 16A is an example of the case where the period of the measured signal SIN is constant, and FIGS. 16B, 16C, and 16D are examples of the case where the measured signal SIN is frequency-modulated. In FIGS. 16B, 16C, and 16D, the group delay amounts of the first low-pass filters 310 are different from each other. For the sake of simplicity, the period of the reference signal CLK and the period of the measured signal SIN are set to a simple integer ratio, and the count value CT1 input to the first low-pass filter 310 is output as it is with a constant group delay. The second low-pass filter 330 integrates the count values CT3 in which the count value CT2 output from the first low-pass filter 310 is latched in synchronization with the reference signal CLK, and outputs the accumulated value for 16 times as the count value CNT.

In the example of FIG. 16A, the count value CT2 is always 4, and the count value CNT is 4×16=64. In the example of FIG. 16B, since the measured signal SIN is frequency-modulated and the group delay of the first low-pass filter 310 is set to 0, the count value CT2 repeats 5, 5, 3, and 3. Since weighting is performed by time at the time of integration, the count value CNT is 5×10+3×6=68, which is larger than the count value CNT of FIG. 16A. In the example of FIG. 16C, the count value CT2 repeats 5, 5, 3, and 3, as in the example of FIG. 16B, but the case where a group delay occurs in the first low-pass filter 310 is illustrated. As a result of weighting by time at the time of integration, the count value CNT is 5×8+3×8=64, which is the same value as the count value CNT in FIG. 16A. In the example of FIG. 16D, the count value CT2 repeats 5, 5, 3, and 3, as in the examples of FIGS. 16B and 16C, but the case where the group delay occurring in the first low-pass filter 310 is larger than that of the example of FIG. 16C is illustrated. In the example of FIG. 16D, the count value CNT is 5×6+3×10=60, which is smaller than the count value CNT of FIG. 16A.

From the consideration using FIGS. 16A to 16D, it can be qualitatively understood that the vibration rectification error due to the non-linearity of the input and the output of the frequency ratio measurement circuit 202 changes depending on the group delay amount of the first low-pass filter 310. By adjusting the group delay amount of the first low-pass filter 310 so that the vibration rectification error due to the non-linearity of the input and the output of the frequency ratio measurement circuit 202 has the opposite phase to the vibration rectification error caused by the cantilever resonance, it is possible to cancel each other's vibration rectification errors. The group delay amount of the first low-pass filter 310 can be adjusted by setting the number of taps na of the delay element 311.

Figure 17:
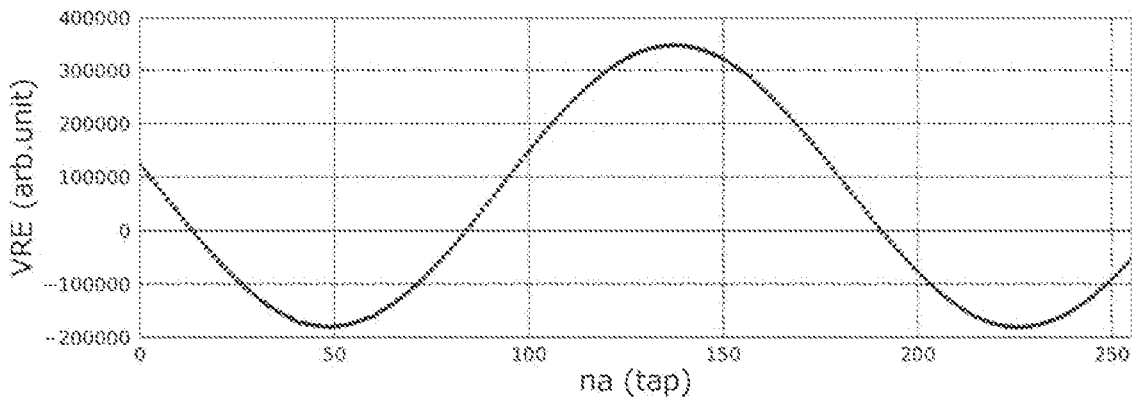
FIG. 17 is a diagram illustrating the dependence of the vibration rectification error included in a measurement value on the number of taps.

FIG. 17 is a diagram illustrating the dependence of the vibration rectification error included in the measurement value by the physical quantity measurement device 2 on the number of taps na. In FIG. 17, the horizontal axis is the number of taps na, and the vertical axis is the vibration rectification error. VRE on the vertical axis is an abbreviation for vibration rectification error. From FIG. 17, if the number of taps na is set appropriately, it is possible to correct the vibration rectification error and bring the error closer to 0.

1-6. Configuration of Signal Processing Device

Figure 18:
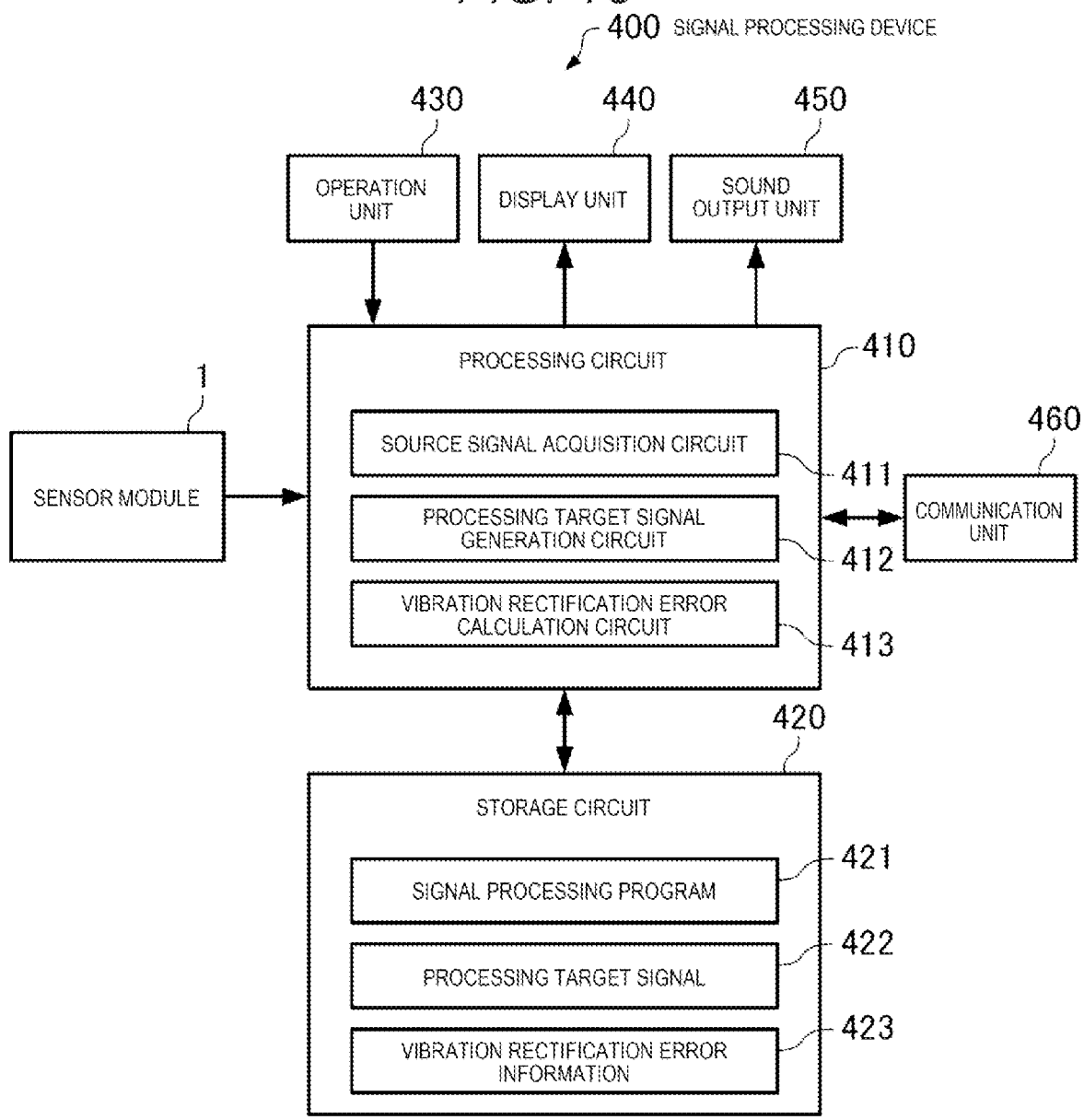
FIG. 18 is a diagram illustrating a configuration example of a signal processing device of a first embodiment.

In the present embodiment, the signal processing device 400 performs processing of detecting a signal component having periodicity included in the signal output from the sensor module 1. FIG. 18 is a diagram illustrating a configuration example of the signal processing device 400. As illustrated in FIG. 18, the signal processing device 400 includes a processing circuit 410, a storage circuit 420, an operation unit 430, a display unit 440, a sound output unit 450, and a communication unit 460. The signal processing device 400 may have a configuration in which some of the components of FIG. 18 are omitted or changed, or other components are added.

The processing circuit 410 acquires a source signal, which is a digital time-series signal output from the sensor module 1, and performs signal processing on the source signal. Specifically, the processing circuit 410 executes a signal processing program 421 stored in the storage circuit 420, and performs various calculation processing on the source signal. In addition, the processing circuit 410 performs various processing according to the operation signals from the operation unit 430, processing of transmitting display signals for displaying various information to the display unit 440, processing of transmitting sound signals for causing the sound output unit 450 to generate various sounds, processing of controlling the communication unit 460 to perform data communication with other devices, and the like. The processing circuit 410 is realized by, for example, a CPU or a DSP. CPU is an abbreviation for central processing unit, and DSP is an abbreviation for digital signal processor.

By executing the signal processing program 421, the processing circuit 410 functions as a source signal acquisition circuit 411, a processing target signal generation circuit 412, and a vibration rectification error calculation circuit 413. That is, the signal processing device 400 includes the source signal acquisition circuit 411, the processing target signal generation circuit 412, and the vibration rectification error calculation circuit 413.

The source signal acquisition circuit 411 acquires a source signal which is a time-series signal output from the sensor module 1. The source signal is a signal containing a signal component having periodicity. For example, the source signal may be a signal including a signal component of the structural resonance frequency of the sensor module 1, specifically, the cantilever resonance frequency of the physical quantity sensor 200. For example, the source signal acquisition circuit 411 may acquire time-series data of the count value CT1 which is a delta-sigma modulated signal input to the first low-pass filter 310 in the physical quantity measurement device 2 as the source signal.

The processing target signal generation circuit 412 generates a processing target signal which is a time-series signal, based on the source signal acquired by the source signal acquisition circuit 411. For example, the processing target signal generation circuit 412 may cut out a part of the time-series signal included in the source signal to generate the processing target signal. Alternatively, the processing target signal may be the source signal itself. The processing target signal generated by the processing target signal generation circuit 412 is stored in the storage circuit 420 as processing target signal 422.

The vibration rectification error calculation circuit 413 performs the product-sum operation processing of the first signal based on the processing target signal and the second signal based on the phase-shifted signal of the processing target signal a plurality of times by changing the shift amount to calculate a plurality of vibration rectification errors. The plurality of vibration rectification errors calculated by the vibration rectification error calculation circuit 413 are stored in the storage circuit 420 as vibration rectification error information 423.

The first signal may be the processing target signal itself. Further, the first signal may be a signal obtained by filtering the processing target signal. For example, a filtering process may be a smoothing filtering process. Further, the first signal may be a signal obtained by removing or reducing the DC component of the processing target signal. Further, the first signal may be a signal obtained by removing or reducing the DC component of the processing target signal and filtering the signal.

The second signal may be the phase-shifted signal itself of the processing target signal. Further, the second signal may be a signal obtained by filtering a phase-shifted signal of the processing target signal. For example, a filtering process may be a smoothing filtering process. Further, the second signal may be a signal obtained by removing or reducing the DC component of the phase-shifted signal of the processing target signal. Further, the second signal may be a signal obtained by removing or reducing the DC component of the phase-shifted signal of the processing target signal and filtering the signal.

Assuming that an i-th sample value of the processing target signal having N samples is S(i), the i-th sample value of the phase-shifted signal of the processing target signal is S(i+k). N is an integer of 2 or more, and i is each integer of 1 or more and N or less. For example, when the first signal is the processing target signal itself and the second signal is the phase-shifted signal itself of the processing target signal, a k-th vibration rectification error VRE(k) of the M vibration rectification errors is calculated by Equation (2). M is an integer of 2 or more, and k is each integer of 1 or more and M or less. In Equation (2), S(i) is the i-th sample value of the first signal, and S(i+k) is the i-th sample value of the second signal.

$$VRE(k)=(1/N)\Sigma_{i=0}^{N-1} s(i) \cdot s(i+k) \quad (2)$$

Further, for example, when the first signal is a signal obtained by removing or reducing the DC component of the processing target signal and the second signal is the phase-shifted signal itself of the processing target signal, a k-th vibration rectification error VRE(k) is calculated by Equation (3). In Equation (3), $f_{HPF}(S(i))$ is the i-th sample value of the first signal, and S(i+k) is the i-th sample value of the second signal.

$$VRE(k)=(1/N)\Sigma_{i=0}^{N-1} f_{HPF}(s(i)) \cdot s(i+k) \quad (3)$$

Further, for example, when the first signal is a signal obtained by removing or reducing the DC component of the processing target signal, and smoothing and filtering the signal and the second signal is the phase-shifted signal itself of the processing target signal, the k-th vibration rectification error VRE(k) is calculated by Equation (4). In Equation (4), $f_{LPF}(f_{HPF}(S(i)))$ is the i-th sample value of the first signal, and S(i+k) is the i-th sample value of the second signal.

$$VRE(k)=(1/N)\Sigma_{i=0}^{N-1} f_{LPF}(f_{HPF}(s(i))) \cdot s(i+k) \quad (4)$$

Further, for example, when the first signal is a signal obtained by removing or reducing the DC component of the processing target signal and smoothing and filtering the signal and the second signal is a signal obtained by smoothing and filtering the phase-shifted signal of the processing target signal, the k-th vibration rectification error VRE(k) is calculated by Equation (5). In Equation (5), $f_{LPF}(f_{HPF}(S(i)))$ is the i-th sample value of the first signal, and $f_{LPF}(S(i+k))$ is the i-th sample value of the second signal.

$$VRE(k)=(1/N)\Sigma_{i=0}^{N-1} f_{LPF}(f_{HPF}(s(i))) \cdot f_{LPF}(s(i+k)) \quad (5)$$

In Equations (2), (3), (4), and (5), division by N may be omitted.

Ergodic signal components such as noise are attenuated by such product-sum operation processing, and a signal having periodicity included in the processing target signal appears as a vibration rectification error according to the phase difference between the first signal and the second signal. Specifically, assuming that the period of the signal having periodicity included in the processing target signal is T, when the first signal and the second signal have a phase difference corresponding to an even multiple of T/2, the vibration rectification error obtained by the product-sum operation processing is maximized. Further, when the first signal and the second signal have a phase difference corresponding to an odd multiple of T/4, the vibration rectification error obtained by the product-sum operation processing becomes 0. Further, when the first signal and the second signal have a phase difference corresponding to an odd multiple of T/2, the vibration rectification error obtained by the product-sum operation processing is minimized. Therefore, if a plurality of vibration rectification errors calculated while changing the phase difference between the first signal and the second signal are plotted, since the value of the vibration rectification error changes with a period T, it is possible to detect a signal component having periodicity included in the processing target signal.

When it is desired to detect the signal component of the structural resonance of the sensor module 1, specifically, the signal component of the cantilever resonance as a signal having periodicity, in the vibration rectification error calculation circuit 413, it is preferable that the number of additions N in the product-sum operation processing is larger than the value obtained by dividing the sampling frequency of the source signal by the resonance frequency. The sampling frequency of the source signal is, for example, the frequency of the measured signal SIN, which is the sampling signal of the count value CT1 input to the first low-pass filter 310. In this way, the signal component of the resonance frequency is integrated for one period or more in the product-sum operation processing, and the signal component of the resonance frequency is effectively detected. Further, the cantilever resonance is excited even in a general environment, but since the vibration rectification error calculated when the excitation level of the cantilever resonance changes also changes, it is preferable that the signal processing device 400 performs the product-sum operation processing by using the source signal acquired in a stable environment.

The storage circuit 420 includes a ROM and a RAM (not illustrated). ROM is an abbreviation for read only memory, and RAM is an abbreviation for random access memory. The ROM stores various programs such as the signal processing program 421 and predetermined data, and the RAM stores the signal generated by the processing circuit 410 such as the processing target signal 422 and the vibration rectification error information 423, and the calculated information. The RAM is also used as a work area of the processing circuit 410, and stores programs and data read from the ROM, data input from the operation unit 430, and signals and data temporarily generated by the processing circuit 410.

The operation unit 430 is an input device composed of operation keys, button switches, and the like, and outputs an operation signal corresponding to the operation by a user to the processing circuit 410.

The display unit 440 is a display device composed of an LCD or the like, and displays various information based on a display signal output from the processing circuit 410. LCD is an abbreviation for liquid crystal display. The display unit 440 may be provided with a touch panel that functions as the operation unit 430. For example, the display unit 440 may display an image in which the vibration rectification error information 423 is plotted based on the display signal output from the processing circuit 410.

The sound output unit 450 is composed of a speaker or the like, and generates various sounds based on the sound signal output from the processing circuit 410. For example, the sound output unit 450 may generate a sound indicating the start or end of signal processing based on the sound signal output from the processing circuit 410.

The communication unit 460 performs various controls for establishing data communication between the processing circuit 410 and another device. For example, the communication unit 460 may transmit the vibration rectification error information 423 to another device.

At least a part of the source signal acquisition circuit 411, the processing target signal generation circuit 412, and the vibration rectification error calculation circuit 413 may be realized by dedicated hardware. Further, the signal processing device 400 may be a single device or may be composed of a plurality of devices. Further, for example, the processing circuit 410 and the storage circuit 420 are realized by a device such as a cloud server, the device calculates the vibration rectification error information 423, and the calculated vibration rectification error information 423 may be transmitted to a terminal including the operation unit 430, the display unit 440, the sound output unit 450, and the communication unit 460 via a communication line.

1-7. Signal Processing Method

Figure 19:
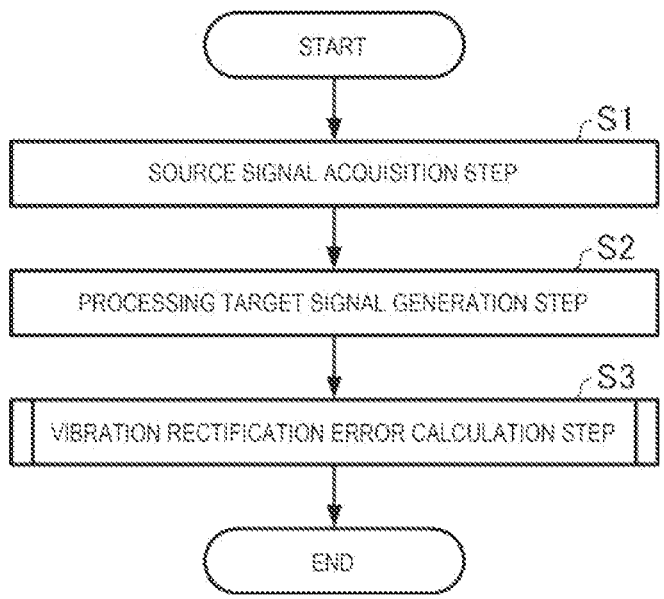
FIG. 19 is a flowchart illustrating a procedure of a signal processing method of the first embodiment.

FIG. 19 is a flowchart illustrating a procedure of a signal processing method of the first embodiment. As illustrated in FIG. 19, the signal processing method of the first embodiment includes a source signal acquisition step S1, a processing target signal generation step S2, and a vibration rectification error calculation step S3. The signal processing method of the present embodiment is performed by, for example, the signal processing device 400.

First, in the source signal acquisition step S1, the signal processing device 400 acquires a source signal which is a time-series signal output from the sensor module 1 which is an object.

Next, in the processing target signal generation step S2, the signal processing device 400 generates a processing target signal which is a time-series signal based on the source signal acquired in step S1.

Finally, in the vibration rectification error calculation step S3, the signal processing device 400 performs the product-sum operation processing of the first signal based on the processing target signal generated in step S2 and the second signal based on the phase-shifted signal of the processing target signal a plurality of times by changing a shift amount, and calculates a plurality of vibration rectification errors.

Figure 20:
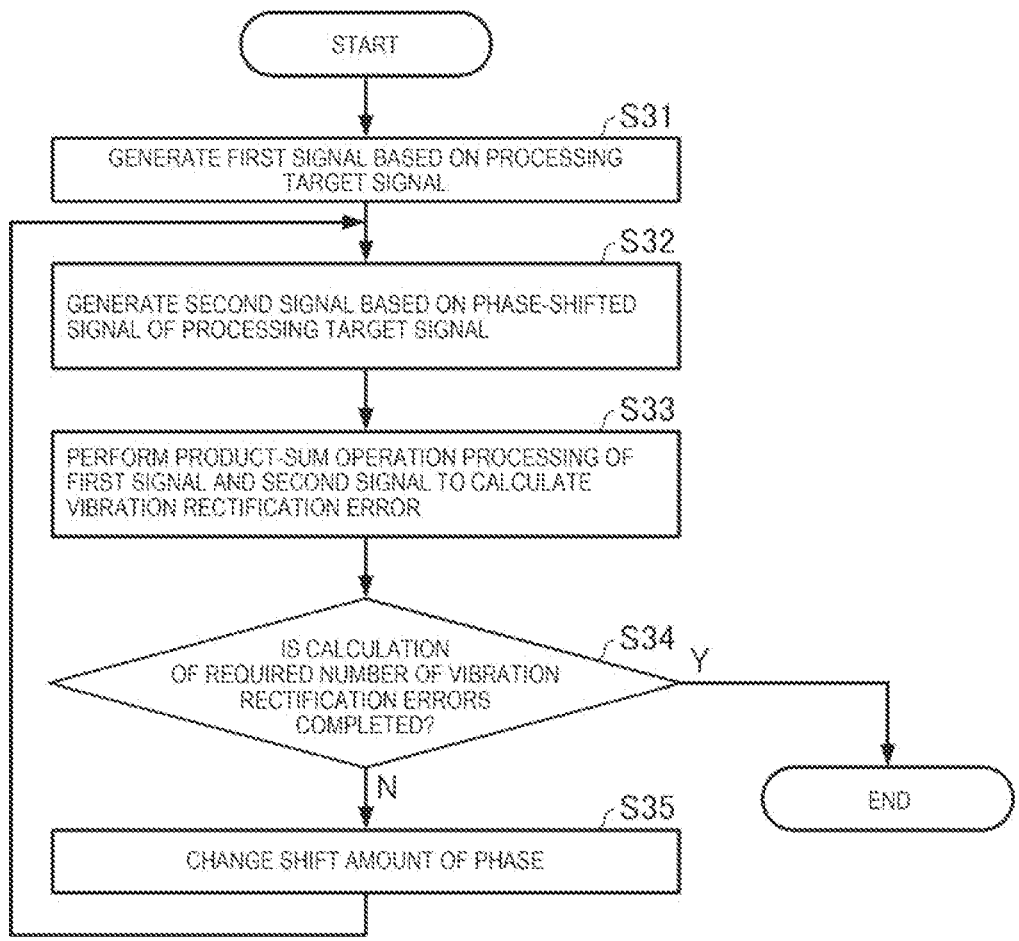
FIG. 20 is a flowchart illustrating an example of a procedure of a vibration rectification error calculation step S3 of FIG. 19.

FIG. 20 is a flowchart illustrating an example of the procedure of the vibration rectification error calculation step S3 of FIG. 19.

As illustrated in FIG. 20, first, in step S31, the signal processing device 400 generates a first signal based on the processing target signal generated in step S2.

Next, in step S32, the signal processing device 400 generates a second signal based on the phase-shifted signal of the processing target signal generated in step S2.

Next, in step S33, the signal processing device 400 performs product-sum operation processing of the first signal generated in step S31 and the second signal generated in step S32, and calculates the vibration rectification error.

Next, in step S33, the signal processing device 400 determines whether or not the calculation of the required number of vibration rectification errors has been completed.

When the calculation of the required number of vibration rectification errors has not been completed, the signal processing device 400 changes the phase shift amount in step S34, and repeats the processing after step S32 until the calculation of the required number of vibration rectification errors is completed.

1-8. Specific Example of Calculated Vibration Rectification Error Information

Below, a specific example in which the signal processing device 400 acquires the count value CT1 input to the first low-pass filter 310 in the physical quantity measurement device 2 of the sensor module 1 as a source signal to plot a plurality of calculated vibration errors will be given.

Figure 21:
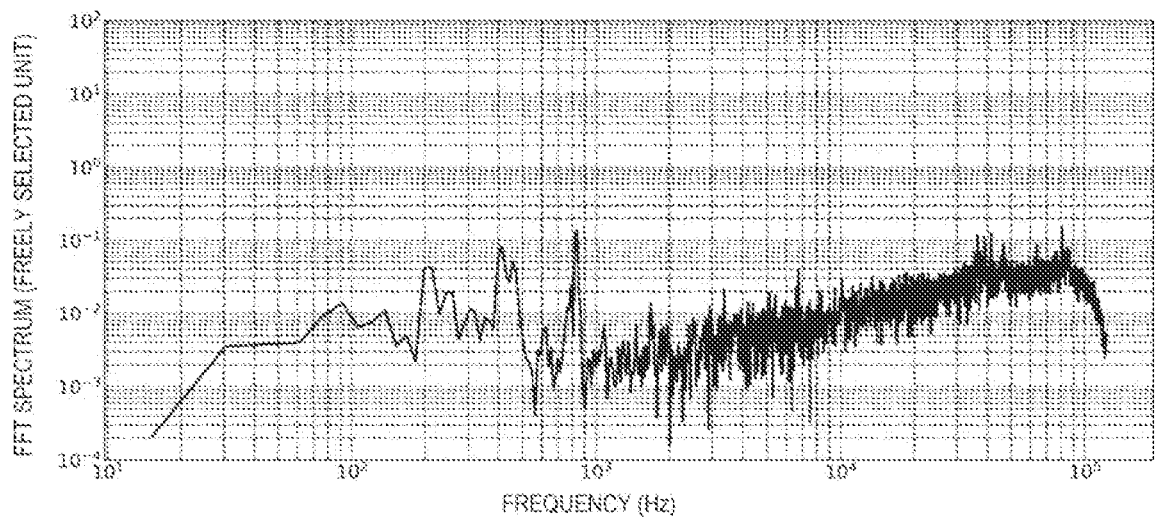
FIG. 21 is a diagram illustrating a frequency spectrum obtained by performing FFT on a source signal.
Figure 22:
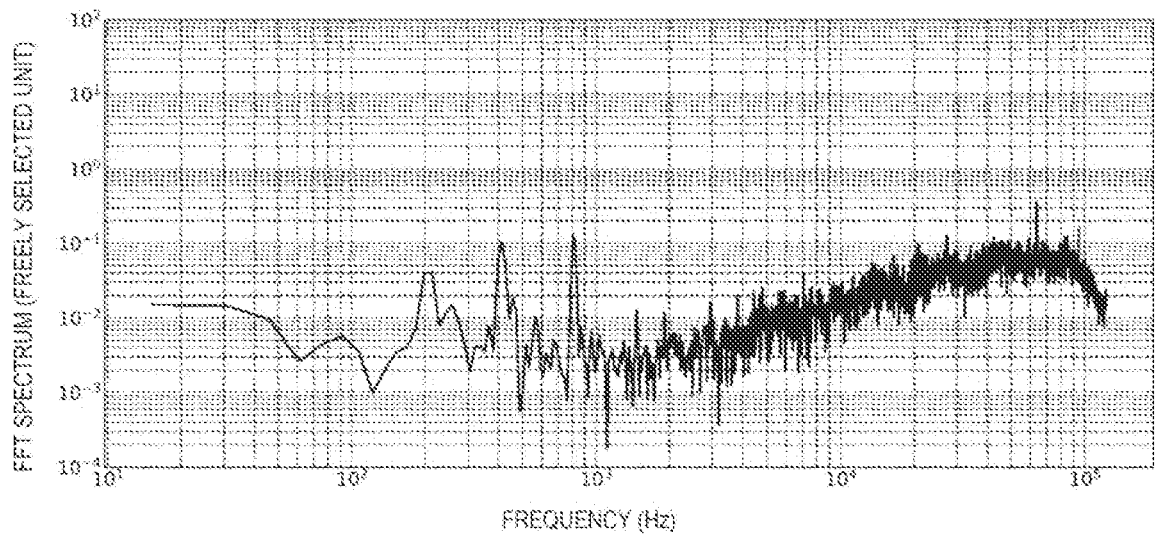
FIG. 22 is a diagram illustrating a frequency spectrum obtained by performing FFT on the source signal.
Figure 23:
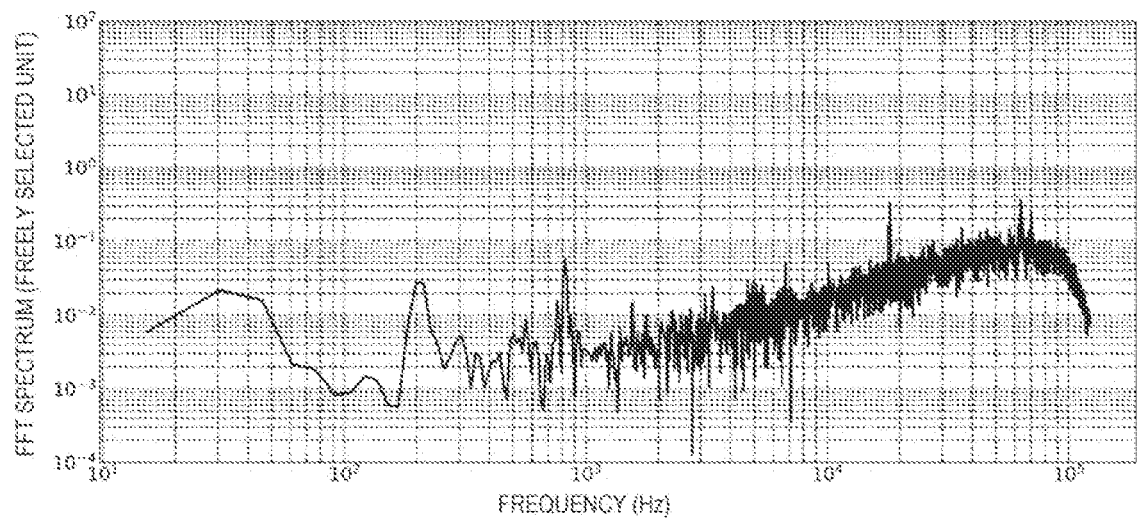
FIG. 23 is a diagram illustrating a frequency spectrum obtained by performing FFT on the source signal.
Figure 24:
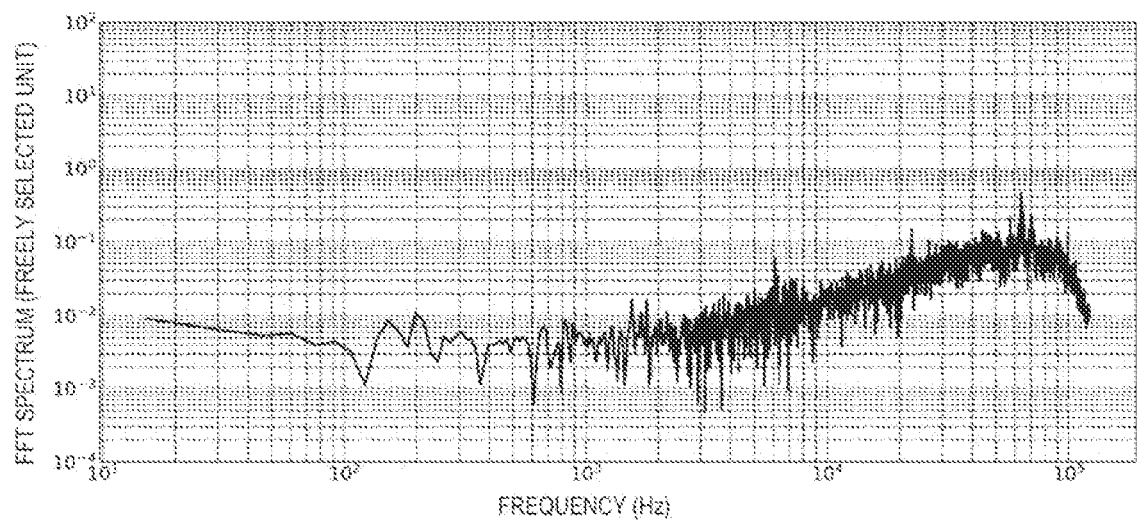
FIG. 24 is a diagram illustrating a frequency spectrum obtained by performing FFT on the source signal.

FIGS. 21 to 24 are diagrams illustrating frequency spectrum obtained by performing FFT on the source signal acquired under four measurement condition. The cantilever resonance frequency of the physical quantity sensor 200 is 850 Hz, and as illustrated in FIG. 21, the signal component due to the cantilever resonance included in the source signal acquired under the first measurement condition has a high intensity. Further, as illustrated in FIG. 22, the signal component due to the cantilever resonance included in the source signal acquired under the second measurement condition has a slightly lower intensity than the signal component due to the cantilever resonance included in the source signal acquired under the first measurement condition. Further, as illustrated in FIG. 23, the signal component due to the cantilever resonance included in the source signal acquired under the third measurement condition is even smaller than the signal component due to the cantilever resonance included in the source signal acquired under the second measurement condition. Further, as illustrated in FIG. 24, the signal component due to the cantilever resonance included in the source signal acquired under the fourth measurement condition is even smaller than the signal component due to the cantilever resonance included in the source signal acquired under the third measurement condition.

Figure 25:
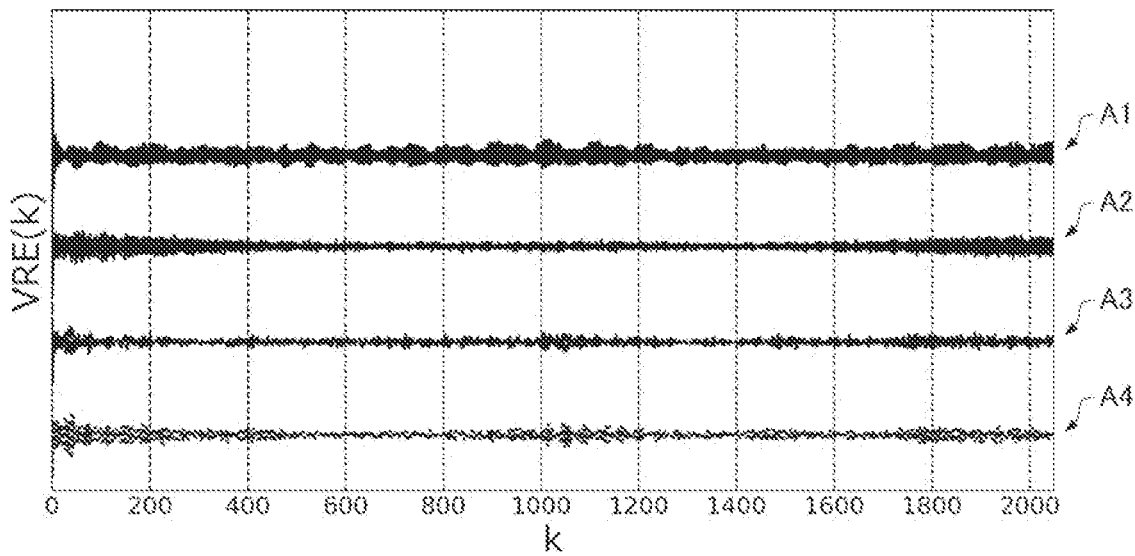
FIG. 25 is a diagram plotting vibration rectification errors in the first embodiment.
Figure 26:
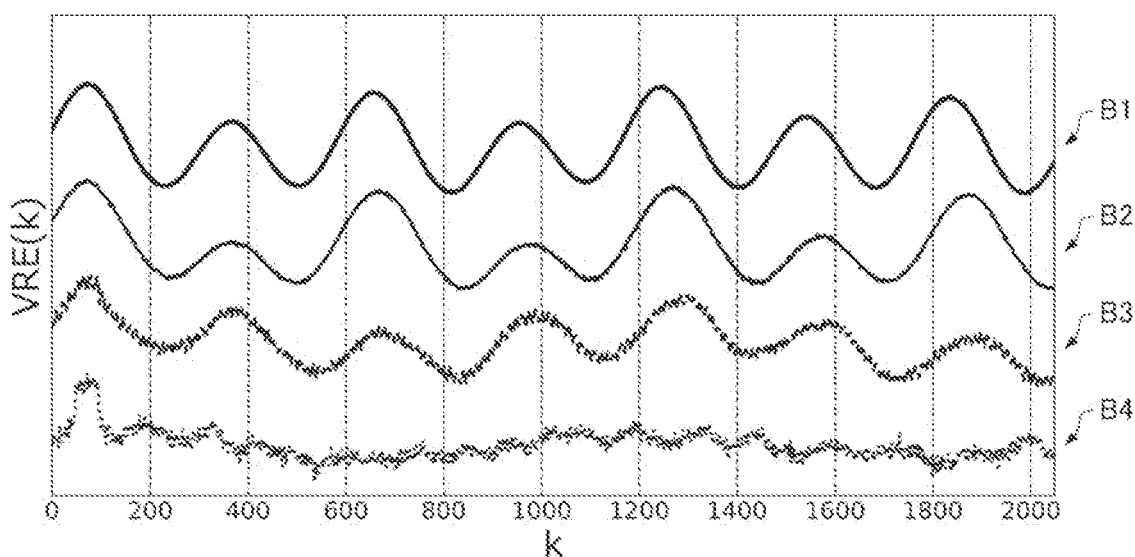
FIG. 26 is a diagram plotting vibration rectification errors in the first embodiment.
Figure 27:
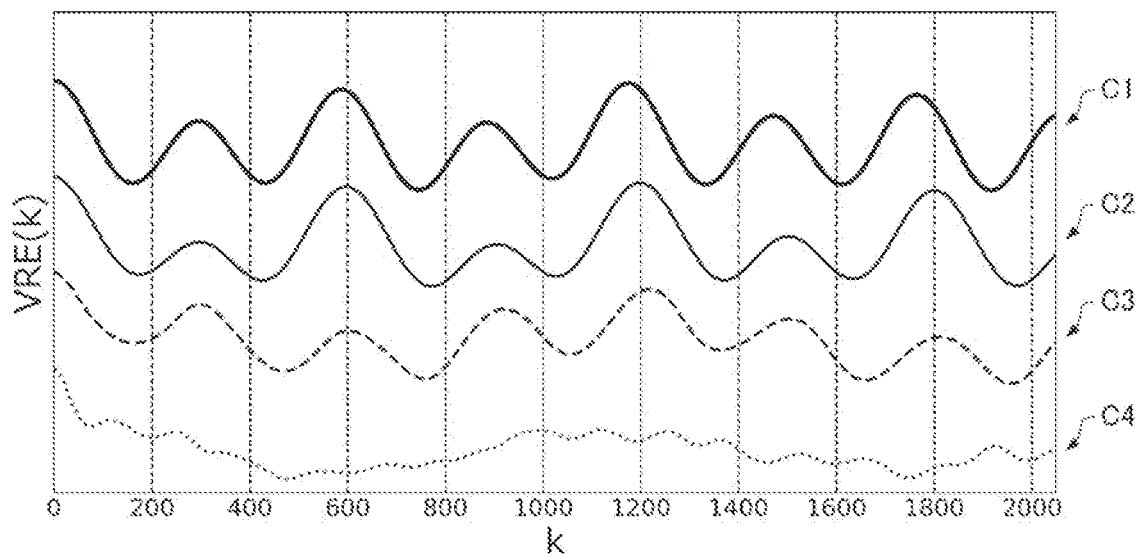
FIG. 27 is a diagram plotting vibration rectification errors in the first embodiment.

FIGS. 25 to 27 are diagrams plotting the vibration rectification error VRE(k) obtained by the product-sum operation with k=1 to 2048 and N=2048 by using the source signal acquired under each of the four measurement conditions. In FIGS. 25 to 27, the horizontal axis is k, the vertical axis is VRE(k), and VRE(k) is standardized so that the difference between the maximum value and the minimum value is a constant value. In FIGS. 25 to 27, the equation of the product-sum operation used to calculate the vibration rectification error VRE(k) is different.

FIG. 25 is a diagram plotting the vibration rectification error VRE(k) obtained by the product-sum operation of the above Equation (3). In FIG. 25, A1 is a vibration rectification error VRE(k) obtained by using the source signal acquired under the first measurement condition. A2 is a vibration rectification error VRE(k) obtained by using the source signal acquired under the second measurement condition. A3 is a vibration rectification error VRE(k) obtained by using the source signal acquired under the third measurement condition. A4 is a vibration rectification error VRE(k) obtained by using the source signal acquired under the fourth measurement condition. In any of A1 to A4, the periodicity of the vibration rectification error VRE(k) cannot be clearly confirmed.

FIG. 26 is a diagram plotting the vibration rectification error VRE(k) obtained by the product-sum operation of the above Equation (4). In FIG. 26, B1 is a vibration rectification error VRE(k) obtained by using the source signal acquired under the first measurement condition. B2 is a vibration rectification error VRE(k) obtained by using the source signal acquired under the second measurement condition. B3 is a vibration rectification error VRE(k) obtained by using the source signal acquired under the third measurement condition. B4 is a vibration rectification error VRE(k) obtained by using the source signal acquired under the fourth measurement condition. The noise component included in the first signal is reduced by performing the smoothing filtering process on the processing target signal, and the periodicity of the vibration rectification error VRE(k) can be confirmed in B1 to B3. The distance between two adjacent maximum values of the vibration rectification error VRE (k) corresponds to the period of cantilever resonance. In B4, the periodicity of the vibration rectification error VRE (k) is unclear. Further, it can be seen from B1 to B4 that the larger the signal component due to the cantilever resonance included in the source signal, the clearer the periodicity of the vibration rectification error VRE(k). In FIGS. 21 and 22, the source signal includes a signal component having a frequency of ½ of the cantilever resonance frequency, and due to the influence of this signal component, the maximum value of the vibration rectification error VRE(k) increases or decreases in B1 and B2.

FIG. 27 is a diagram plotting the vibration rectification error VRE(k) obtained by the product-sum operation of the above Equation (5). In FIG. 27, C1 is a vibration rectification error VRE (k) obtained by using the source signal acquired under the first measurement condition. C2 is a vibration rectification error VRE (k) obtained by using the source signal acquired under the second measurement condition. C3 is a vibration rectification error VRE (k) obtained by using the source signal acquired under the third measurement condition. C4 is a vibration rectification error VRE (k) obtained by using the source signal acquired under the fourth measurement condition. The noise component included in the first signal is reduced by performing the smoothing filtering process on the processing target signal, the noise component included in the second signal is reduced by performing the smoothing filtering process on the phase-shifted signal of the processing target signal, and in any of C1 to C4, the periodicity of the vibration rectification error VRE (k) can be confirmed. Further, as compared with B1 to B4 of FIG. 26, the periodicity of the vibration rectification error VRE(k) is clearer in C1 to C4. Further, it can be seen from C1 to C4 that the larger the signal component due to the cantilever resonance included in the source signal, the clearer the periodicity of the vibration rectification error VRE(k).

In any of FIGS. 25 to 27, the periodicity of the vibration rectification error VRE(k) is clear in the order of the first measurement condition, the second measurement condition, the third measurement condition, and the fourth measurement condition, and it can be seen that the larger the signal component due to cantilever resonance, the higher the detection accuracy of the signal component.

Figure 28:
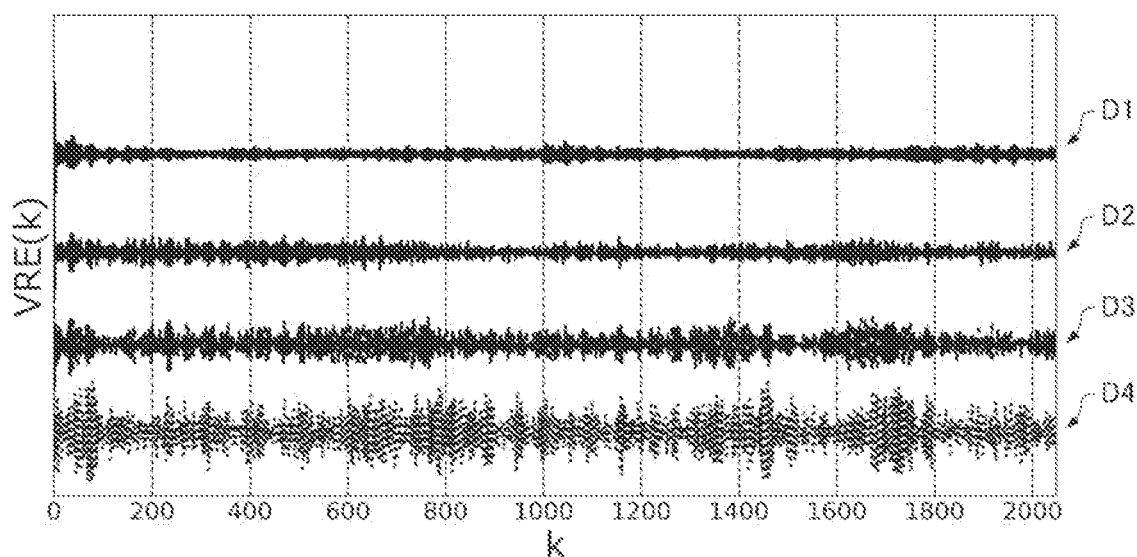
FIG. 28 is a diagram plotting vibration rectification errors in the first embodiment.
Figure 29:
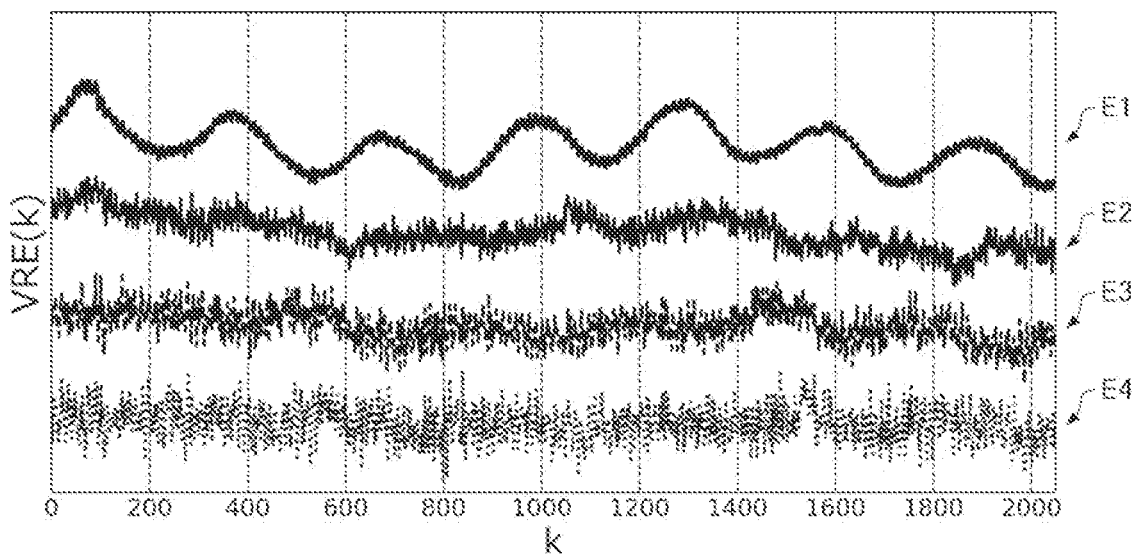
FIG. 29 is a diagram plotting vibration rectification errors in the first embodiment.
Figure 30:
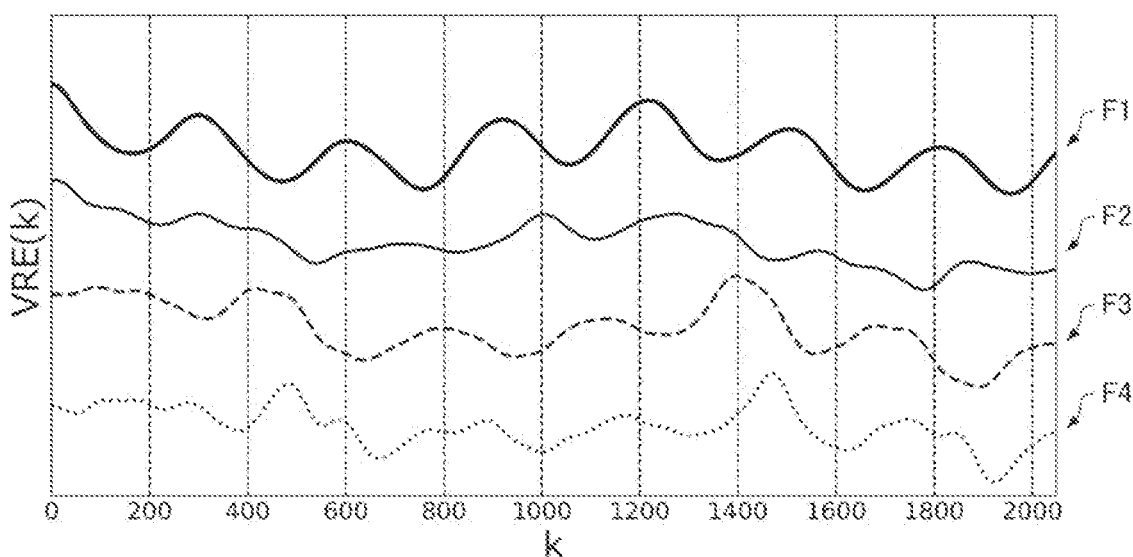
FIG. 30 is a diagram plotting vibration rectification errors in the first embodiment.

FIGS. 28 to 30 are diagrams plotting the vibration rectification error VRE(k) obtained by the product-sum operation in 4 cases of N=2048, 512, 128, and 32 with k=1 to 2048 by using the source signal acquired under the second measurement condition. In FIGS. 28 to 30, the horizontal axis is k, the vertical axis is VRE(k), and VRE(k) is standardized so that the difference between the maximum value and the minimum value is a constant value. In FIGS. 28 to 30, the equation of the product-sum operation used to calculate the vibration rectification error VRE(k) is different.

FIG. 28 is a diagram plotting the vibration rectification error VRE(k) obtained by the product-sum operation of the above Equation (3). In FIG. 28, D1 is the vibration rectification error VRE(k) obtained with N=2048. D2 is the vibration rectification error VRE(k) obtained with N=512. D3 is the vibration rectification error VRE(k) obtained with N=128. D4 is the vibration rectification error VRE(k) obtained with N=32. In any of D1 to D4, the periodicity of the vibration rectification error VRE(k) cannot be clearly confirmed.

FIG. 29 is a diagram plotting the vibration rectification error VRE(k) obtained by the product-sum operation of the above Equation (4). In FIG. 29, E1 is the vibration rectification error VRE(k) obtained with N=2048. E2 is the vibration rectification error VRE(k) obtained with N=512. E3 is the vibration rectification error VRE(k) obtained with N=128. E4 is the vibration rectification error VRE(k) obtained with N=32. The noise component included in the first signal is reduced by performing the smoothing filtering process on the processing target signal, and the periodicity of the vibration rectification error VRE(k) can be confirmed in E1. In E2 to E4, the number of additions N of the product-sum operation is insufficient, and the periodicity of the vibration rectification error VRE(k) is unclear.

FIG. 30 is a diagram plotting the vibration rectification error VRE(k) obtained by the product-sum operation of the above Equation (5). In FIG. 30, F1 is the vibration rectification error VRE(k) obtained with N=2048. F2 is the vibration rectification error VRE(k) obtained with N=512. F3 is the vibration rectification error VRE(k) obtained with N=128. F4 is the vibration rectification error VRE(k) obtained with N=32. The noise component included in the first signal is reduced by performing the smoothing filtering process on the processing target signal, the noise component included in the second signal is reduced by performing the smoothing filtering process on the phase-shifted signal of the processing target signal, and in F1, the periodicity of the vibration rectification error VRE(k) can be clearly confirmed compared with E1 in FIG. 29. In F2 to F4, the number of additions N of the product-sum operation is insufficient, and the periodicity of the vibration rectification error VRE(k) is unclear.

Figure 31:
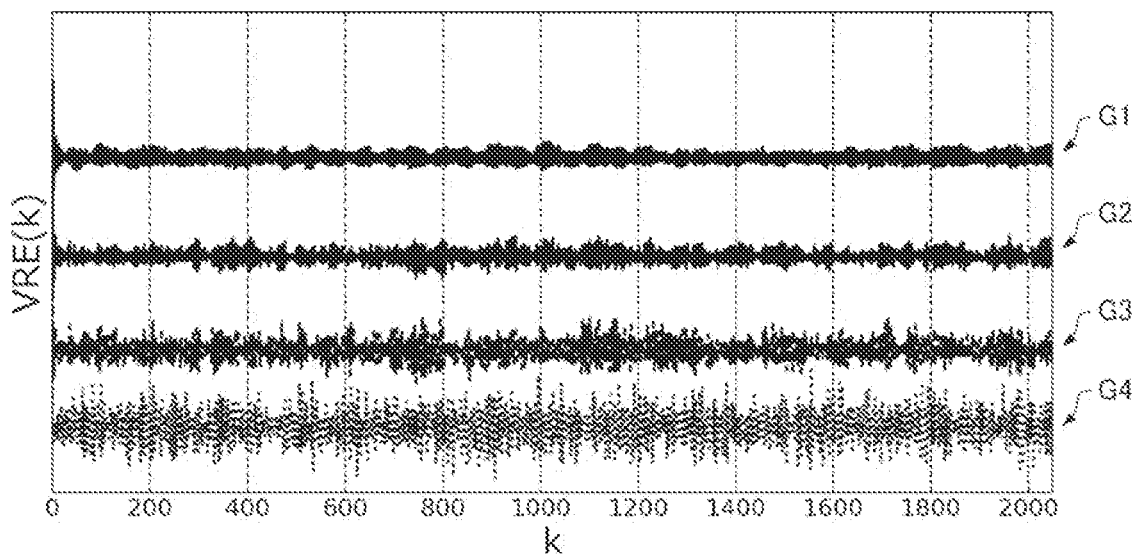
FIG. 31 is a diagram plotting vibration rectification errors in the first embodiment.
Figure 32:
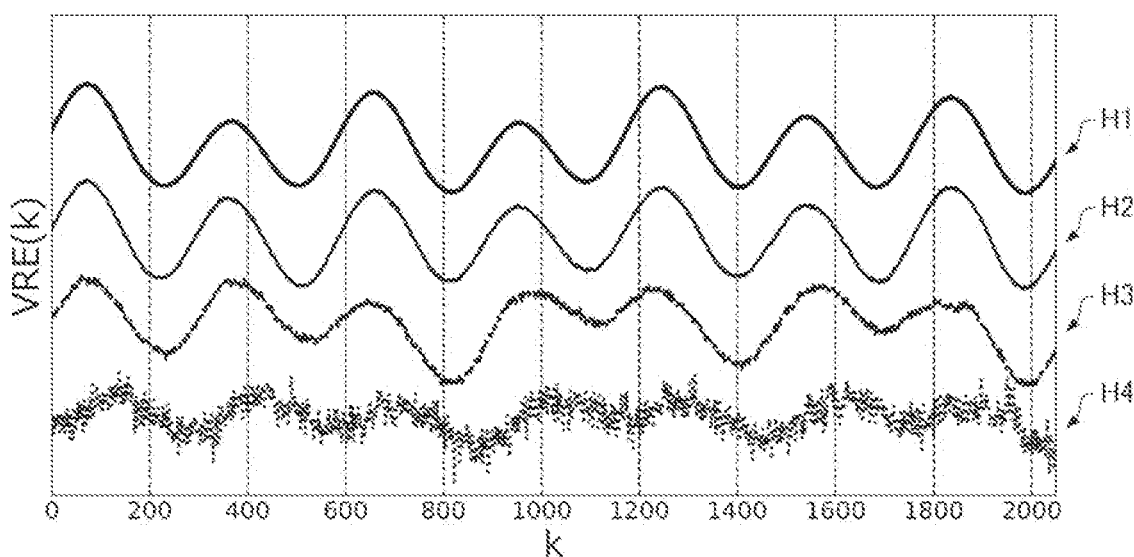
FIG. 32 is a diagram plotting vibration rectification errors in the first embodiment.
Figure 33:
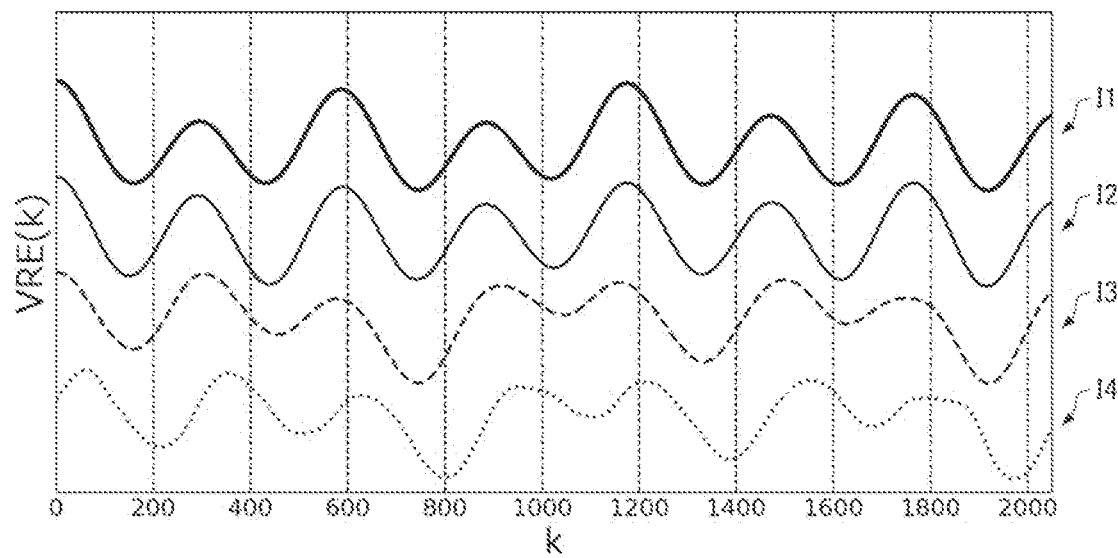
FIG. 33 is a diagram plotting vibration rectification errors in the first embodiment.

FIGS. 31 to 33 are diagrams plotting the vibration rectification error VRE(k) obtained by the product-sum operation in 4 cases of N=2048, 512, 128, and 32 with k=1 to 2048 by using the source signal acquired under the first measurement condition. In FIGS. 31 to 33, the horizontal axis is k, the vertical axis is VRE(k), and VRE(k) is standardized so that the difference between the maximum value and the minimum value is a constant value. In FIGS. 31 to 33, the equation of the product-sum operation used to calculate the vibration rectification error VRE(k) is different.

FIG. 31 is a diagram plotting the vibration rectification error VRE(k) obtained by the product-sum operation of the above Equation (3). In FIG. 31, G1 is the vibration rectification error VRE(k) obtained with N=2048. G2 is the vibration rectification error VRE(k) obtained with N=512. G3 is a vibration rectification error VRE(k) obtained with N=128. G4 is the vibration rectification error VRE(k)

obtained with N=32. In any of G1 to G4, the periodicity of the vibration rectification error VRE(k) cannot be clearly confirmed.

FIG. 32 is a diagram plotting the vibration rectification error VRE(k) obtained by the product-sum operation of the above Equation (4). In FIG. 32, H1 is the vibration rectification error VRE(k) obtained with N=2048. H2 is the vibration rectification error VRE(k) obtained with N=512. H3 is the vibration rectification error VRE(k) obtained with N=128. H4 is the vibration rectification error VRE(k) obtained with N=32. The noise component included in the first signal is reduced by performing the smoothing filtering process on the processing target signal, and the periodicity of the vibration rectification error VRE(k) can be confirmed in H1 to H3. In H4, the number of additions N of the product-sum operation is insufficient, and the periodicity of the vibration rectification error VRE(k) is unclear. Further, since the signal component due to the cantilever resonance included in the source signal is larger than that in the case of FIG. 29, it can be seen that the periodicity of the vibration rectification error VRE (k) is clearer in H1 to H3 as compared with E1 to E3 in FIG. 29.

FIG. 33 is a diagram plotting the vibration rectification error VRE(k) obtained by the product-sum operation of the above Equation (5). In FIG. 33, I1 is the vibration rectification error VRE(k) obtained with N=2048. I2 is the vibration rectification error VRE(k) obtained with N=512. I3 is the vibration rectification error VRE(k) obtained with N=128. I4 is the vibration rectification error VRE(k) obtained with N=32. The noise component included in the first signal is reduced by performing the smoothing filtering process on the processing target signal, the noise component included in the second signal is reduced by performing the smoothing filtering process on the phase-shifted signal of the processing target signal, and in any of I1 to I4, the periodicity of the vibration rectification error VRE(k) can be confirmed. Further, as compared with H1 to H4 in FIG. 32, in I1 to I4, the periodicity of the vibration rectification error VRE(k) can be clearly confirmed. Further, since the signal component due to the cantilever resonance included in the source signal is larger than that in the case of FIG. 30, it can be seen that the periodicity of the vibration rectification error VRE(k) is clearer in I1 to I4 as compared with E1 to E4 in FIG. 30.

In any of FIGS. 28 to 33, the periodicity of the vibration rectification error VRE(k) is clear in the order of N=2048, 512, 128, and 32, and it can be seen that the larger the number of additions N in the product-sum operation processing, the higher the detection accuracy of the signal component due to the cantilever resonance.

1-9. Operational Effects

As described above, the first signal based on the processing target signal generated based on the source signal output from the sensor module 1 and the second signal based on the phase-shifted signal of the processing target signal include a signal component having periodicity generated by the sensor module 1, specifically, a signal component due to cantilever resonance, in common. Therefore, ergodic signal components such as noise are attenuated by the product-sum operation processing of the first signal and the second signal, while the signal components due to cantilever resonance strengthen or weaken each other according to the phase difference between the first signal and the second signal. As a result, the plurality of vibration rectification errors obtained by performing the product-sum operation processing a plurality of times by changing the shift amount have different magnitudes depending on the phase difference between the first signal and the second signal and the period of the signal component due to the cantilever resonance. Therefore, according to the first embodiment, the signal processing device 400 can detect the signal component due to the cantilever resonance included in the signal output from the sensor module 1 without performing the envelope processing. The signal processing device 400 may reduce the measurement error when detecting the periodicity by performing the product-sum operation processing a plurality of times with the same shift amount for a part of the signal processing device 400.

Further, according to the first embodiment, since the signal processing device 400 needs to acquire the source signal for a predetermined time only once in order to calculate a plurality of vibration rectification errors, high-speed arithmetic processing is possible, and environmental changes such as temperature changes in a short time when the source signal is acquired are extremely small, calculation errors caused by environmental changes are reduced.

Further, according to the first embodiment, if the first signal is a signal obtained by smoothing and filtering the processing target signal, the high-frequency noise components included in the first signal are reduced, and if the second signal is a signal obtained by smoothing and filtering the phase-shifted signal of the processing target signal, the high-frequency noise components included in the second signal are reduced, and therefore the detection accuracy of the signal components due to cantilever resonance is improved.

Further, according to the first embodiment, if the first signal is a signal obtained by removing or reducing the DC component of the processing target signal, each sample value of the first signal becomes smaller, and if the second signal is a signal obtained by removing or reducing the DC component of the phase-shifted signal of the processing target signal, each sample value of the second signal becomes smaller, and therefore the load of the product-sum operation of the first signal and the second signal is reduced, and the calculation accuracy is improved.

Further, according to the first embodiment, by making the number of additions N in the product-sum operation processing larger than the value obtained by dividing the sampling frequency of the source signal by the cantilever resonance frequency, the signal components due to the cantilever resonance included in the first signal and the second signal are integrated for one period or more, and therefore the signal components are effectively detected.

2. Second Embodiment

Hereinafter, regarding a second embodiment, the same components as those in the first embodiment are designated by the same reference numerals, the description overlapping with the first embodiment will be omitted or simplified, and the contents different from those in the first embodiment will be mainly described.

In the first embodiment, the smoothing filtering process is used as a filtering process for a processing target signal or a phase-shifted signal of the processing signal. When the source signal includes a signal component having a frequency of ½ of the cantilever resonance frequency, the smoothing filtering process does not reduce the signal component, and therefore, the maximum value of the vibration rectification error VRE(k) such as C1 in FIG. 27 increases or decreases and is not constant. Therefore, in the second embodiment, as the filtering process for the processing target signal and the phase-shifted signal of the processing signal, by using the band-limiting filtering process in which only the vicinity of the cantilever resonance frequency is set as a passing region, the influence of the signal component having the frequency of ½ of the cantilever resonance frequency on the calculated vibration rectification error VRE(k) is reduced.

For example, when the first signal is a signal obtained by the band-limiting filtering process of the processing target signal and the second signal is the phase-shifted signal itself of the processing target signal, the k-th vibration rectification error VRE(k) is calculated by Equation (6). In Equation (6), $f_{BPF}(S(i))$ is the i-th sample value of the first signal, and $S(i+k)$ is the i-th sample value of the second signal.

$$VRE(k)=(1/N)\Sigma_{i=0}^{N-1} f_{BPF}(s(i)) \cdot s(i+k) \tag{6}$$

Further, for example, when the first signal is a signal obtained by the band-limiting filtering process of the processing target signal and the second signal is a signal obtained by the smoothing filtering process of the phase-shifted signal of the processing target signal, the k-th vibration rectification error VRE(k) is calculated by Equation (7). In Equation (7), $f_{BPF}(S(i))$ is the i-th sample value of the first signal, and $f_{LPF}(S(i+k))$ is the i-th sample value of the second signal.

$$VRE(k)=(1/N)\Sigma_{i=0}^{N-1} f_{BPF}(s(i)) \cdot f_{LPF}(s(i+k)) \tag{7}$$

In Equations (6) and (7), division by N may be omitted. Further, in Equations (6) and (7), the first signal obtained by the band-limiting filtering process of the processing target signal is used, but the second signal obtained by the band-limiting filtering process of the phase-shifted signal of the processing target signal may be used.

Since the procedure of the signal processing method of the second embodiment is the same as that of FIG. 19, the illustration and description thereof will be omitted. Further, since the configuration of the signal processing device 400 of the second embodiment is the same as that of FIG. 18, the illustration and description thereof will be omitted.

Figure 34:
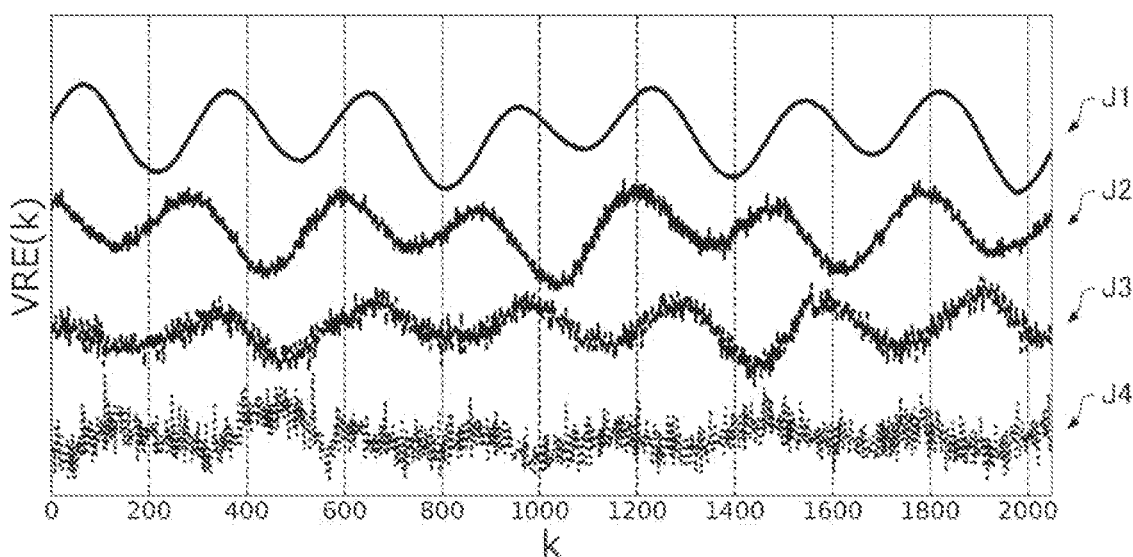
FIG. 34 is a diagram plotting vibration rectification errors in a second embodiment.
Figure 35:
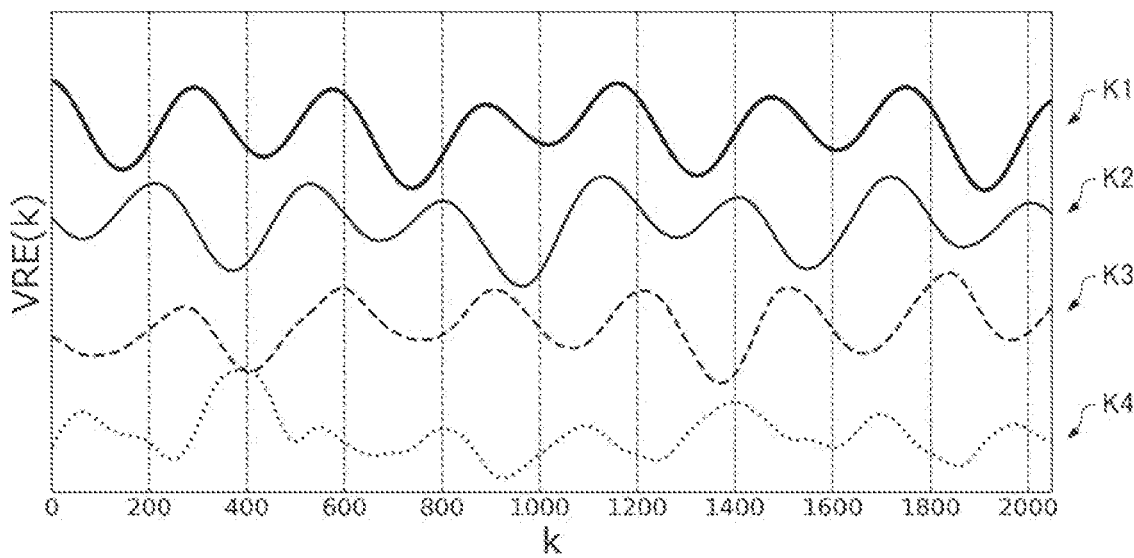
FIG. 35 is a diagram plotting vibration rectification errors in the second embodiment.

FIGS. 34 and 35 are diagrams plotting the vibration rectification error VRE(k) obtained by the product-sum operation with k=1 to 2048 and N=2048 by using the source signal acquired under each of the four measurement conditions. In FIGS. 34 and 35, the horizontal axis is k, the vertical axis is VRE(k), and VRE(k) is standardized so that the difference between the maximum value and the minimum value is a constant value. In FIGS. 34 and 35, the equation of the product-sum operation used to calculate the vibration rectification error VRE (k) is different.

FIG. 34 is a diagram plotting the vibration rectification error VRE(k) obtained by the product-sum operation of Equation (6). In FIG. 34, J1 is the vibration rectification error VRE(k) obtained by using the source signal acquired under the first measurement condition described above. J2 is the vibration rectification error VRE(k) obtained by using the source signal acquired under the second measurement condition described above. J3 is a vibration rectification error VRE(k) obtained by using the source signal acquired under the third measurement condition described above. J4 is a vibration rectification error VRE(k) obtained by using the source signal acquired under the fourth measurement condition described above. The noise components included in the first signal are reduced by performing the band-limiting filtering process of the processing target signal, and the periodicity of the vibration rectification error VRE(k) can be confirmed in J1 to J3. The distance between two adjacent maximum values of the vibration rectification error VRE(k) corresponds to the period of cantilever resonance. In J4, the periodicity of the vibration rectification error VRE(k) is unclear. Further, it can be seen from J1 to J4 that the larger the signal component due to the cantilever resonance included in the source signal, the clearer the periodicity of the vibration rectification error VRE(k). Further, since the band-limiting filtering process is performed on the processing target signal, the signal components having a frequency of ½ of the cantilever resonance frequency are reduced, in J1 and J2, the increase and decrease range of the maximum value of the vibration rectification error VRE(k) is smaller compared with B1 and B2 in FIG. 26.

FIG. 35 is a diagram plotting the vibration rectification error VRE(k) obtained by the product-sum operation of Equation (7). In FIG. 35, K1 is a vibration rectification error VRE(k) obtained by using the source signal acquired under the first measurement condition. K2 is a vibration rectification error VRE(k) obtained by using the source signal acquired under the second measurement condition. K3 is a vibration rectification error VRE(k) obtained by using the source signal acquired under the third measurement condition. K4 is a vibration rectification error VRE(k) obtained by using the source signal acquired under the fourth measurement condition. The noise components included in the first signal are reduced by performing the band-limiting filtering process on the processing target signal, the noise component included in the second signal is reduced by performing the smoothing filtering process on the phase-shifted signal of the processing target signal, and in any of K1 to K4, the periodicity of the vibration rectification error VRE(k) can be confirmed. Further, it can be seen from K1 to K4 that the larger the signal component due to the cantilever resonance included in the source signal, the clearer the periodicity of the vibration rectification error VRE(k). Further, since the band-limiting filtering process is performed on the processing target signal, the signal components having a frequency of ½ of the cantilever resonance frequency are reduced, in K1 and K2, the increase and decrease range of the maximum value of the vibration rectification error VRE(k) is smaller compared with C1 and C2 in FIG. 27.

Figure 36:
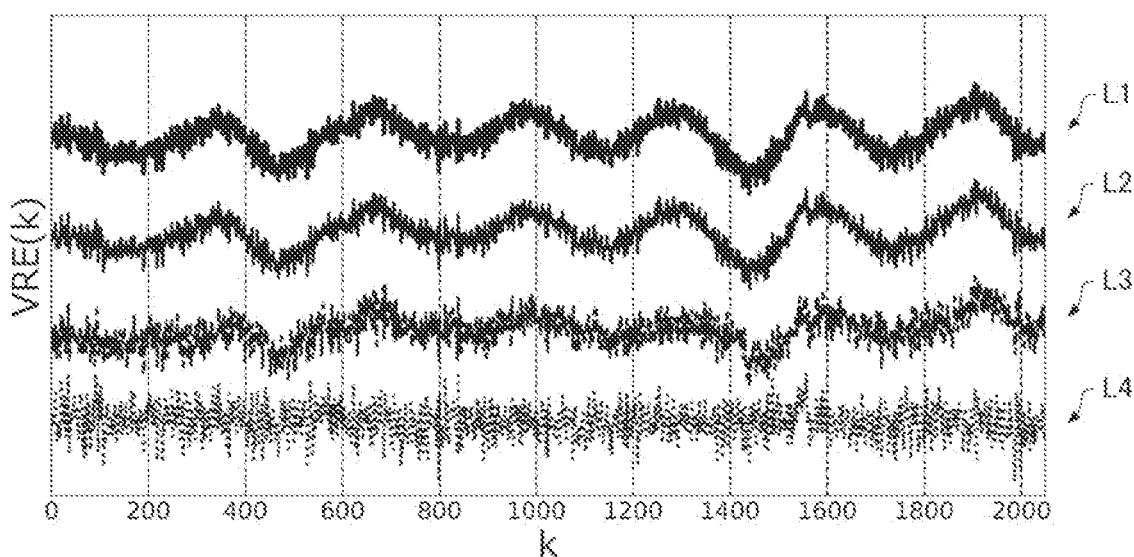
FIG. 36 is a diagram plotting vibration rectification errors in the second embodiment.
Figure 37:
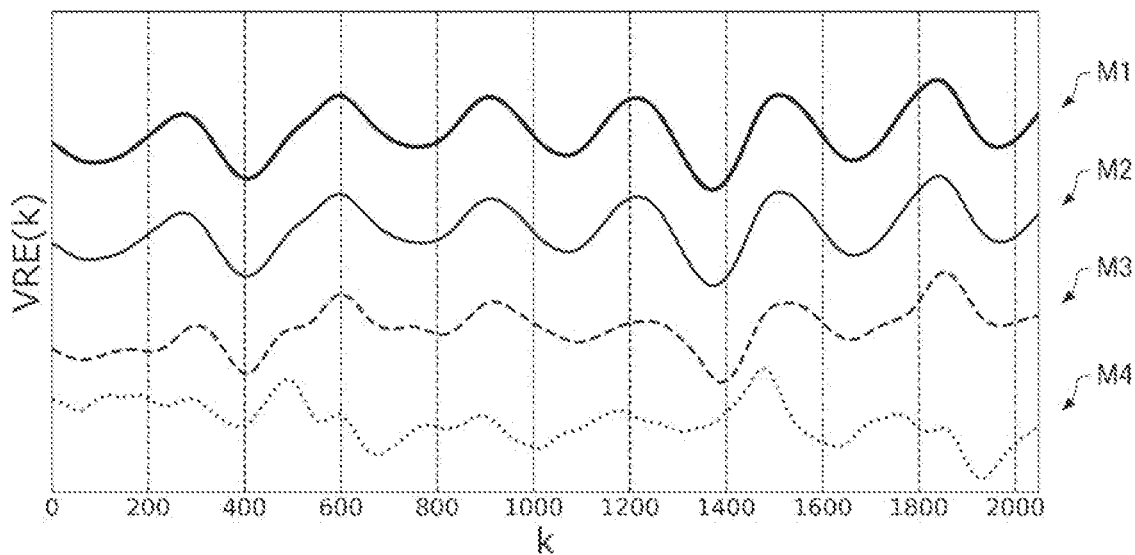
FIG. 37 is a diagram plotting vibration rectification errors in the second embodiment.

FIGS. 36 and 37 are diagrams plotting the vibration rectification error VRE(k) obtained by the product-sum operation in 4 cases of N=2048, 512, 128, and 32 with k=1 to 2048 by using the source signal acquired under the second measurement condition. In FIGS. 36 and 37, the horizontal axis is k, the vertical axis is VRE(k), and VRE(k) is standardized so that the difference between the maximum value and the minimum value is a constant value. In FIGS. 36 and 37, the equation of the product-sum operation used to calculate the vibration rectification error VRE (k) is different.

FIG. 36 is a plot of the vibration rectification error VRE(k) obtained by the product-sum operation of Equation (6). In FIG. 36, L1 is the vibration rectification error VRE(k) obtained with N=2048. L2 is the vibration rectification error VRE(k) obtained with N=512. L3 is the vibration rectification error VRE(k) obtained with N=128. L4 is the vibration rectification error VRE(k) obtained with N=32. The noise components included in the first signal are reduced by performing the band-limiting filtering process of the processing target signal, and the periodicity of the vibration rectification error VRE(k) can be confirmed in L1 and L2. In L3 and L4, the number of additions N of the product-sum operation is insufficient, and the periodicity of the vibration rectification error VRE(k) is unclear. Further, since the band-limiting filtering process is performed on the processing target signal, the signal components having a frequency of ½ of the cantilever resonance frequency are reduced, in L1, the increase and decrease range of the maximum value of the vibration rectification error VRE(k) is smaller compared with E1 in FIG. 29.

FIG. 37 is a plot of the vibration rectification error VRE(k) obtained by the product-sum operation of Equation (7). In FIG. 37, M1 is the vibration rectification error VRE(k) obtained with N=2048. M2 is the vibration rectification error VRE(k) obtained with N=512. M3 is the vibration rectification error VRE(k) obtained with N=128. M4 is the vibration rectification error VRE(k) obtained with N=32. The noise component included in the first signal is reduced by performing the band-limiting filtering process on the processing target signal, the noise component included in the second signal is reduced by performing the smoothing filtering process on the phase-shifted signal of the processing target signal, and in M1 to M3, the periodicity of the vibration rectification error VRE(k) can be confirmed. Further, as compared with L1 and L2 in FIG. 36, in M1 and M2, the periodicity of the vibration rectification error VRE(k) can be clearly confirmed. In M4, the number of additions N of the product-sum operation is insufficient, and the periodicity of the vibration rectification error VRE(k) is unclear. Further, since the band-limiting filtering process is performed on the processing target signal, the signal components having a frequency of ½ of the cantilever resonance frequency are reduced, in M1, the increase and decrease range of the maximum value of the vibration rectification error VRE(k) is smaller compared with F1 in FIG. 30.

Figure 38:
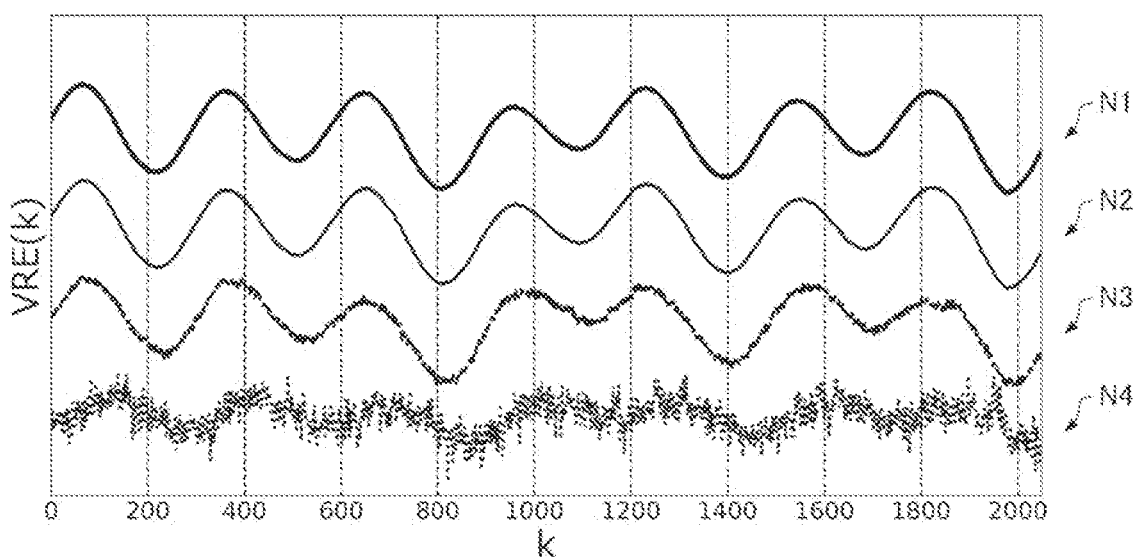
FIG. 38 is a diagram plotting vibration rectification errors in the second embodiment.
Figure 39:
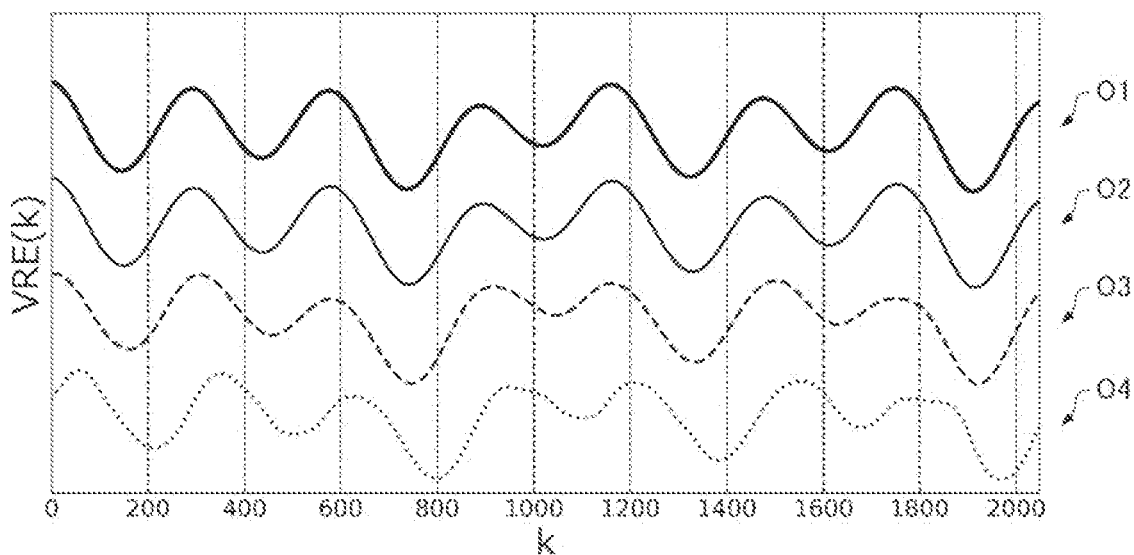
FIG. 39 is a diagram plotting vibration rectification errors in the second embodiment.

FIGS. 38 and 39 are diagrams plotting the vibration rectification error VRE(k) obtained by the product-sum operation in 4 cases of N=2048, 512, 128, and 32 with k=1 to 2048 by using the source signal acquired under the first measurement condition. In FIGS. 38 and 39, the horizontal axis is k, the vertical axis is VRE(k), and VRE(k) is standardized so that the difference between the maximum value and the minimum value is a constant value. In FIGS. 38 and 39, the equation of the product-sum operation used to calculate the vibration rectification error VRE (k) is different.

FIG. 38 is a plot of the vibration rectification error VRE(k) obtained by the product-sum operation of Equation (6). In FIG. 38, N1 is the vibration rectification error VRE(k) obtained with N=2048. N2 is the vibration rectification error VRE(k) obtained with N=512. N3 is the vibration rectification error VRE(k) obtained with N=128. N4 is the vibration rectification error VRE(k) obtained with N=32. The noise components included in the first signal are reduced by performing the band-limiting filtering process of the processing target signal, and the periodicity of the vibration rectification error VRE(k) can be confirmed in N1 to N3. In N4, the number of additions N of the product-sum operation is insufficient, and the periodicity of the vibration rectification error VRE(k) is unclear. Further, since the signal component due to the cantilever resonance included in the source signal is larger than that in the case of FIG. 36, it can be seen that the periodicity of the vibration rectification error VRE(k) is clearer in N1 to N3 as compared with L1 to L3 in FIG. 36. Further, since the band-limiting filtering process is performed on the processing target signal, the signal components having a frequency of ½ of the cantilever resonance frequency are reduced, in N1 to N3, the increase and decrease range of the maximum value of the vibration rectification error VRE(k) is smaller compared with H1 to H3 in FIG. 32.

FIG. 39 is a plot of the vibration rectification error VRE(k) obtained by the product-sum operation of Equation (7). In FIG. 39, O1 is the vibration rectification error VRE(k) obtained with N=2048. O2 is the vibration rectification error VRE(k) obtained with N=512. O3 is the vibration rectification error VRE(k) obtained with N=128. O4 is the vibration rectification error VRE(k) obtained with N=32. The noise component included in the first signal is reduced by performing the band-limiting filtering process on the processing target signal, the noise component included in the second signal is reduced by performing the smoothing filtering process on the phase-shifted signal of the processing target signal, and in any of O1 to O4, the periodicity of the vibration rectification error VRE(k) can be confirmed. Further, as compared with N1 to N4 in FIG. 38, in O1 to O4, the periodicity of the vibration rectification error VRE(k) can be clearly confirmed. Further, since the signal component due to the cantilever resonance included in the source signal is larger than that in the case of FIG. 37, it can be seen that the periodicity of the vibration rectification error VRE (k) is clearer in O1 to O4 as compared with M1 to M4 in FIG. 37. Further, since the band-limiting filtering process is performed on the processing target signal, the signal components having a frequency of ½ of the cantilever resonance frequency are reduced, in M1 to M4, the increase and decrease range of the maximum value of the vibration rectification error VRE(k) is smaller compared with I1 to I4 in FIG. 33.

According to the second embodiment described above, the same effect as that of the first embodiment is obtained. Further, according to the second embodiment, if the first signal is a signal obtained by the band-limiting filtering process of the processing target signal, many signal components other than the signal component of the resonance frequency included in the first signal are reduced, and if the second signal is a signal obtained by the band-limiting filtering process of the phase-shifted signal of the processing target signal, many signal components other than the signal component of the resonance frequency included in the second signal are reduced, and therefore the detection accuracy of the signal component of the resonance frequency is improved.

3. Third Embodiment

Hereinafter, regarding a third embodiment, the same components as those of the first embodiment or the second embodiment are designated by the same reference numerals, the description overlapping with the first embodiment or the second embodiment is omitted or simplified, and the contents different from the first embodiment and the second embodiment will be mainly described.

In the first embodiment and the second embodiment, when a part of the time-series signal included in the source signal is cut out to generate the processing target signal, in the first signal based on the processing target signal and the second signal based on the phase-shifted signal of the processing target signal, the first sample value and the last sample value become discontinuous, and due to the noise caused by this discontinuity, the accuracy of the vibration rectification error obtained by the product-sum operation may decrease. Therefore, in the third embodiment, in order to alleviate the discontinuity of the sample values, it is assumed that the first signal is a signal obtained by applying a window function to the processing target signal, or the second signal is a signal obtained by applying a window function to the phase-shifted signal of the processing target signal. The type of the window function is not particularly limited, and examples of the window function include a Hanning window function, a rectangular window function, a Gaussian window function, a Hamming window function, a Blackman window function, and a Kaiser window function.

The first signal may be a signal obtained by filtering the processing target signal and applying a window function. For example, the filtering process may be a smoothing filtering process or a band-limiting filtering process. Further, the first signal may be a signal obtained by removing or reducing the DC component of the processing target signal and applying a window function. Further, the first signal may be a signal obtained by removing or reducing the DC component of the processing target signal, filtering the signal, and applying a window function.

The second signal may be a signal obtained by filtering the phase-shifted signal of the processing target signal and applying a window function to the signal. For example, the filtering process may be a smoothing filtering process or a band-limiting filtering process. Further, the second signal may be a signal obtained by removing or reducing the DC component from the phase-shifted signal of the processing target signal and applying a window function to the signal. Further, the second signal may be a signal obtained by removing or reducing the DC component of the phase-shifted signal of the processing target signal, filtering the signal, and applying a window function.

Further, for example, when the first signal is a signal obtained by removing or reducing the DC component of the processing target signal filtering the signal, and applying a window function to the signal, and the second signal is a signal obtained by the smoothing filtering process of the phase-shifted signal of the processing target signal, the k-th vibration rectification error VRE(k) is calculated by Equation (8). In Equation (8), $F_{window}$ is a window function. Further, $F_{window}(i) \cdot f_{LPF}(S(i)))$ is the i-th sample value of the first signal, and $f_{LPF}(S(i+k))$ is the i-th sample value of the second signal.

$$VRE(k)=(1/N)\Sigma_{i=0}^{N-1}F_{window}(i) \cdot f_{LPF}(f_{HPF}(s(i))) \cdot f_{LPF}(s(i+k)) \qquad (8)$$

In Equation (8), division by N may be omitted. Further, in Equation (8), the first signal obtained by applying a window function to the processing target signal is used, but the second signal obtained by applying a window function to the phase-shifted signal of the processing target signal may be used.

Since the procedure of the signal processing method of the third embodiment is the same as that of FIG. 19, the illustration and description thereof will be omitted. Further, since the configuration of the signal processing device 400 of the third embodiment is the same as that of FIG. 18, the illustration and description thereof will be omitted.

Figure 40:
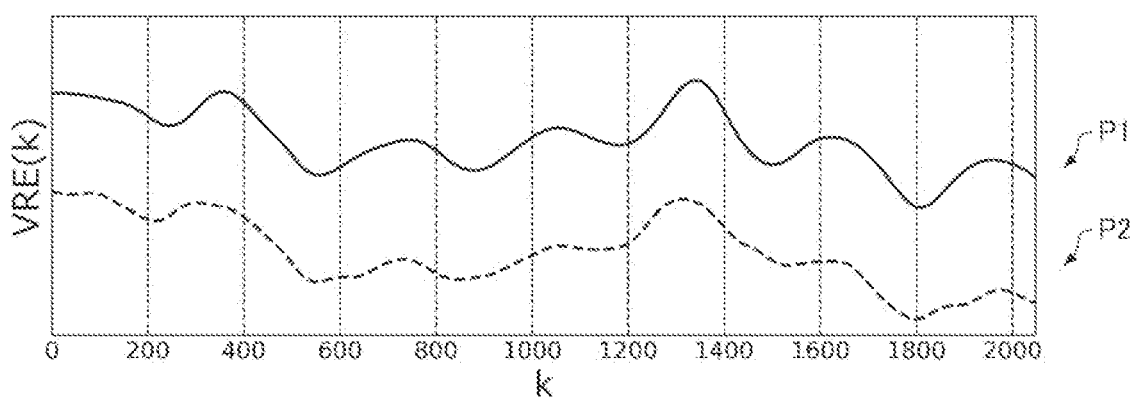
FIG. 40 is a diagram plotting vibration rectification errors in a third embodiment.

FIG. 40 is a diagram plotting the vibration rectification error VRE(k) obtained by the product-sum operation with k=1 to 2048 and N=256 by using the source signal acquired under the second measurement condition. In FIG. 40, the horizontal axis is k, the vertical axis is VRE(k), and VRE(k) is standardized so that the difference between the maximum value and the minimum value is a constant value. In FIG. 40, the equation of the product-sum operation used to calculate the vibration rectification error VRE(k) is different.

In FIG. 40, P1 is a vibration rectification error VRE(k) obtained by Equation (8) with the window function $F_{window}$ as the Hanning window function. P2 is the vibration rectification error VRE(k) obtained by the above Equation (5). Since the discontinuity of the sample value is alleviated by applying a window function to the processing target signal, the periodicity of the vibration rectification error VRE(k) of P1 is clearer than that of P2.

According to the third embodiment described above, the same effect as that of the first embodiment or the second embodiment is obtained. Further, according to the third embodiment, if the first signal is a signal obtained by applying a window function to the processing target signal, the discontinuity between the first sample value and the last sample value of the first signal is alleviated, and if the second signal is a signal obtained by applying a window function to the phase-shifted signal of the processing target signal, the discontinuity between the first sample value and the last sample value of the second signal is alleviated, and therefore the detection accuracy of signal component having periodicity is improved.

4. Fourth Embodiment

Hereinafter, regarding a fourth embodiment, the same components as any of the first to third embodiments are designated by the same reference numerals, the description overlapping with any of the first to third embodiments is omitted or simplified, and the contents different from those of the first to third embodiments will be mainly described.

Figure 41:
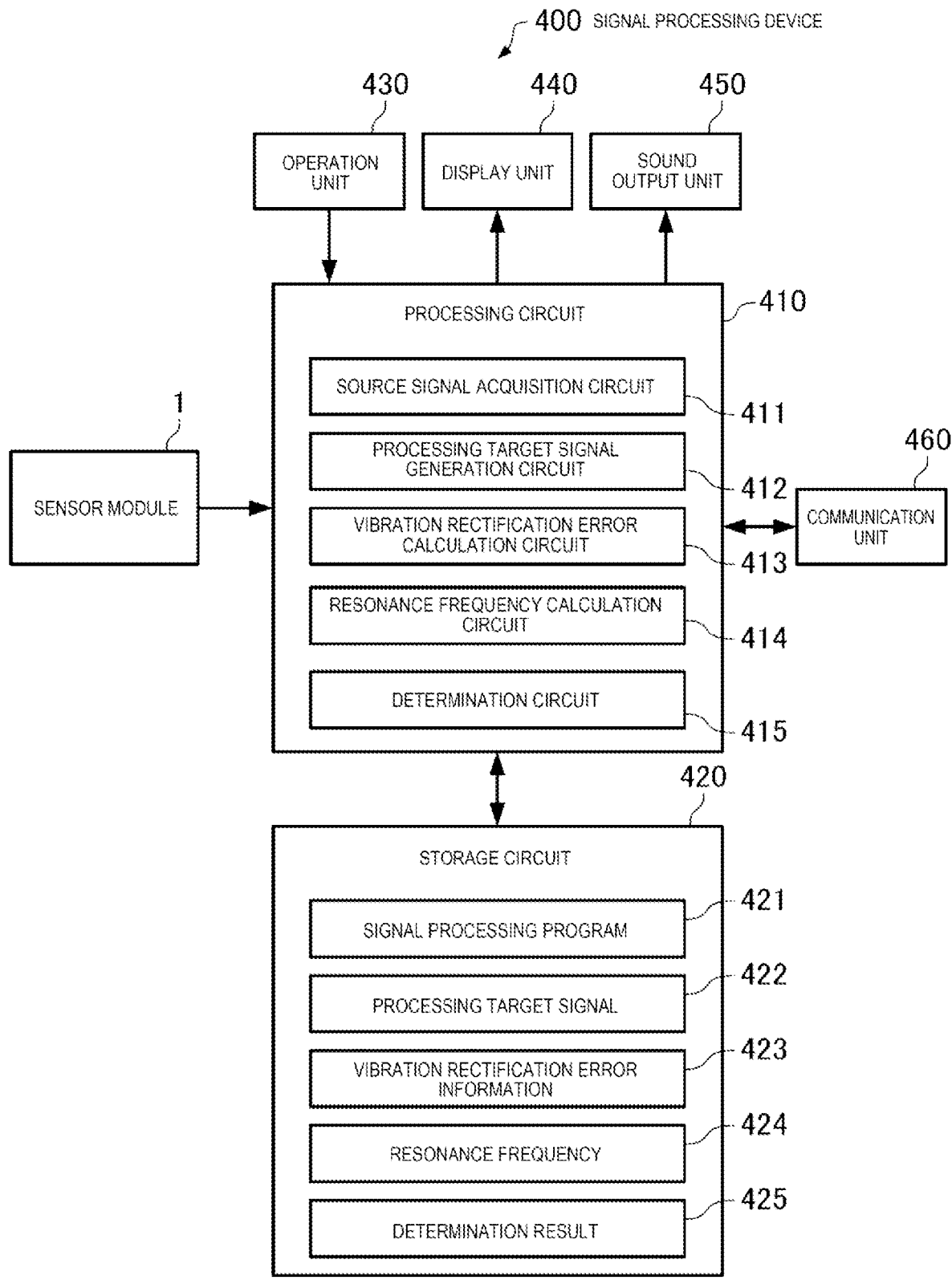
FIG. 41 is a diagram illustrating a configuration example of a signal processing device of a fourth embodiment.

FIG. 41 is a diagram illustrating a configuration example of the signal processing device 400 of the fourth embodiment. As illustrated in FIG. 41, the signal processing device 400 includes the processing circuit 410, a storage circuit 420, the operation unit 430, the display unit 440, the sound output unit 450, and the communication unit 460. The signal processing device 400 may have a configuration in which some of the components of FIG. 41 are omitted or changed, or other components are added.

Since the configurations and functions of the storage circuit 420, the operation unit 430, the display unit 440, the sound output unit 450, and the communication unit 460 are the same as those of any one of the first to third embodiments, the description thereof will be omitted.

By executing the signal processing program 421, the processing circuit 410 functions as a source signal acquisition circuit 411, a processing target signal generation circuit 412, a vibration rectification error calculation circuit 413, a resonance frequency calculation circuit 414, and a determination circuit 415. That is, the signal processing device 400 includes a source signal acquisition circuit 411, a processing target signal generation circuit 412, a vibration rectification error calculation circuit 413, a resonance frequency calculation circuit 414, and a determination circuit 415.

Since the functions of the source signal acquisition circuit 411, the processing target signal generation circuit 412, and the vibration rectification error calculation circuit 413 are the same as those of any one of the first to third embodiments, the description thereof will be omitted.

The resonance frequency calculation circuit 414 calculates the resonance frequency of the sensor module 1 which is an object, based on a plurality of vibration rectification errors calculated by the vibration rectification error calculation circuit 413. The resonance frequency of the sensor module 1 calculated by the resonance frequency calculation circuit 414 is stored in the storage circuit 420 as a resonance frequency 424. For example, the resonance frequency of the sensor module 1 is the cantilever resonance frequency. Specifically, the resonance frequency calculation circuit 414 reads out the vibration rectification error information 423 stored in the storage circuit 420 to acquire two k values $k_1$ and $k_2$ in which the vibration rectification error VRE(k) becomes two continuous maximum values or two continuous minimum values. Assuming that the frequency of the measured signal SIN is fx, the resonance frequency calculation circuit 414 can calculate a cantilever resonance frequency $f_{CL}$, by Equation (9).

$$f_{CL} = \frac{fx}{k_2 - k_1} \quad (9)$$

The resonance frequency calculation circuit 414 may acquire three or more k values that are three or more continuous maximum values or three or more continuous minimum values to calculate a plurality of cantilever resonance frequencies by Equation (9) and calculate the average value thereof as the cantilever resonance frequency $f_{CL}$.

The determination circuit 415 determines whether the resonance frequency calculated by the resonance frequency calculation circuit 414 is correct or not based on the difference between the maximum value and the minimum value of the plurality of vibration rectification errors calculated by the vibration rectification error calculation circuit 413. The determination result by the determination circuit 415 is stored in the storage circuit 420 as a determination result 425. Specifically, the resonance frequency calculation circuit 414 reads out the vibration rectification error information 423 stored in the storage circuit 420 to acquire the maximum value and the minimum value of the vibration rectification error VRE(k) and calculate the difference therebetween. The determination circuit 415 compares the difference between the maximum value and the minimum value with a predetermined threshold value, and when the difference is larger than the threshold value, determines that the calculated resonance frequency is correct, and when the difference is smaller than the threshold value, determines that the calculated resonance frequency is incorrect. That is, the determination circuit 415 determines that the resonance frequency is correct because the resonance frequency calculated in an environment in which the cantilever resonance is sufficiently excited is highly reliable.

Further, since the sensitivity of the physical quantity sensor 200 strongly correlates with the cantilever resonance frequency, the determination circuit 415 can also check the abnormal sensitivity of the physical quantity sensor 200 based on the resonance frequency calculated by the resonance frequency calculation circuit 414. For example, if the weight fixed to the cantilever is missing for some reason, the mass of the cantilever decreases and the cantilever resonance frequency is shifted to a high frequency. At the same time, the sensitivity of the physical quantity sensor 200 decreases, and the sensitivity of the physical quantity sensor 200 becomes abnormal. Further, when the cantilever is damaged by a strong impact or the like, the sensitivity of the physical quantity sensor 200 becomes abnormal and the cantilever resonance frequency is also shifted. Therefore, identifying the cantilever resonance frequency is one method for determining whether or not the sensitivity of the physical quantity sensor 200 is within the specifications. Accordingly, the determination circuit 415 can determine whether or not the sensitivity of the physical quantity sensor 200 is within the specifications depending on whether or not the resonance frequency calculated by the resonance frequency calculation circuit 414 is within a predetermined frequency range.

The RAM of the storage circuit 420 stores signals generated by the processing circuit 410 such as the processing target signal 422, the vibration rectification error information 423, the resonance frequency 424, and the determination result 425, and calculated information.

The display unit 440 may display information including an image obtained by plotting the vibration rectification error information 423, the resonance frequency 424, and the determination result 425 based on the display signal output from the processing circuit 410.

At least a part of the source signal acquisition circuit 411, the processing target signal generation circuit 412, the vibration rectification error calculation circuit 413, the resonance frequency calculation circuit 414, and the determination circuit 415 may be realized by dedicated hardware. Further, the signal processing device 400 may be a single device or may be composed of a plurality of devices. Further, for example, the processing circuit 410 and the storage circuit 420 are realized by a device such as a cloud server, and the device may calculate the vibration rectification error information 423, the resonance frequency 424, and the determination result 425 to transmit the calculated vibration rectification error information 423, resonance frequency 424, and determination result 425 to a terminal including an operation unit 430, the display unit 440, the sound output unit 450, and the communication unit 460 via a communication line.

Figure 42:
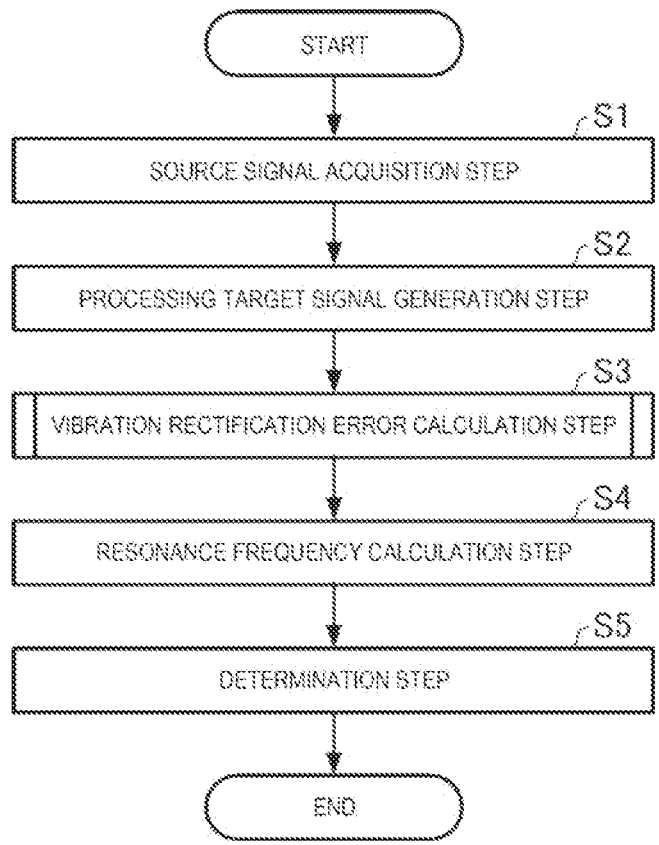
FIG. 42 is a flowchart illustrating a procedure of a signal processing method of a fourth embodiment.

FIG. 42 is a flowchart illustrating a procedure of a signal processing method of the fourth embodiment.

As illustrated in FIG. 42, the signal processing method of the fourth embodiment includes a source signal acquisition step S1, a processing target signal generation step S2, a vibration rectification error calculation step S3, and a resonance frequency calculation step S4, a determination step S5. The signal processing method of the present embodiment is performed by, for example, the signal processing device 400.

First, the signal processing device 400 performs the source signal acquisition step S1, the processing target signal generation step S2, and the vibration rectification error calculation step S3 in the same manner as in any of the first to third embodiments.

Next, in the resonance frequency calculation step S4, the signal processing device 400 calculates the resonance frequency of the sensor module 1 which is an object, based on the plurality of vibration rectification errors calculated in step S3.

Finally, in the determination step S5, the signal processing device 400 determines whether the resonance frequency calculated in step S4 is correct or not based on the difference between the maximum value and the minimum value of the plurality of vibration rectification errors calculated in step S3. Further, in the determination step S5, the signal processing device 400 may determine whether or not the sensitivity of the physical quantity sensor 200 is within the specifications based on the resonance frequency calculated in step S4.

In the determination step S5, the signal processing device 400 may calculate the difference between the maximum value and the minimum value of the plurality of vibration rectification errors calculated in step S3 to output the value of the difference as an index for determining whether the resonance frequency is correct or not, instead of determining whether the resonance frequency is correct or not. In this case, the signal processing device 400 may determine whether the resonance frequency is correct or not based on the determination index.

Figure 43:
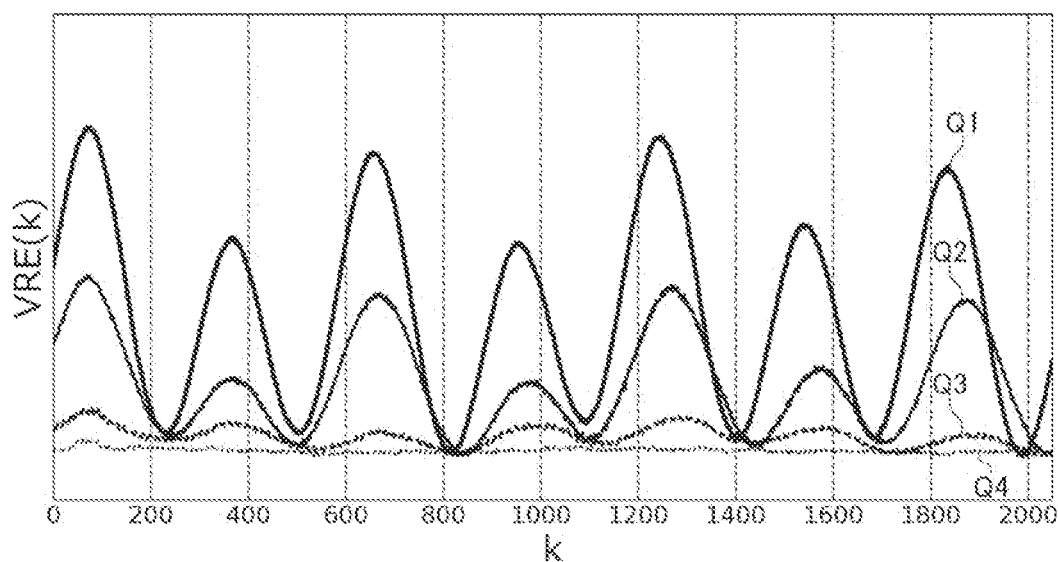
FIG. 43 is a diagram plotting vibration rectification errors in the fourth embodiment.
Figure 44:
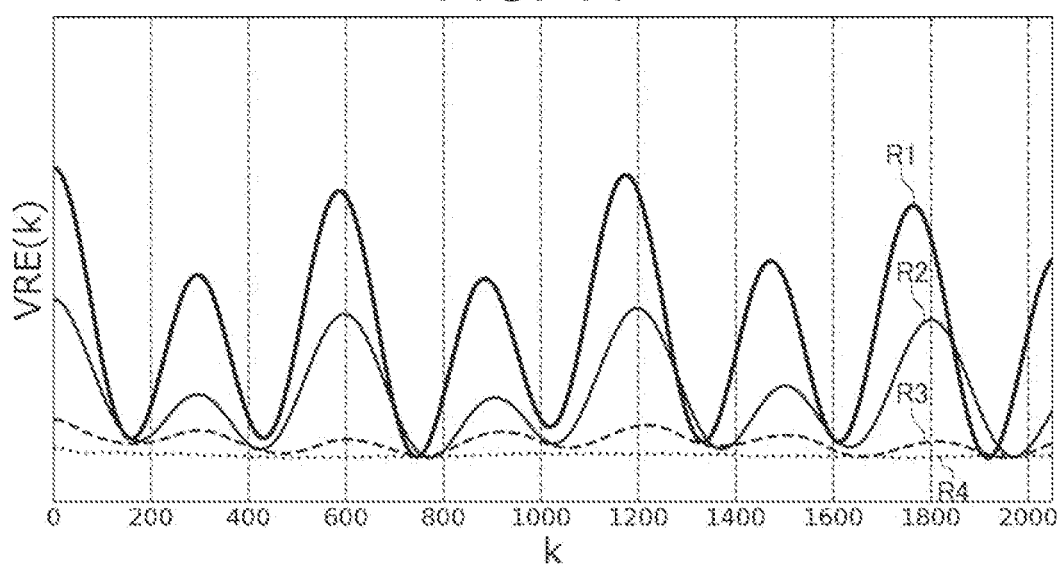
FIG. 44 is a diagram plotting vibration rectification errors in the fourth embodiment.

FIGS. 43 and 44 are diagrams plotting the vibration rectification error VRE(k) obtained by the product-sum operation with k=1 to 2048 and N=2048 by using the source signal acquired under each of the four measurement conditions. In FIGS. 43 and 44, the horizontal axis is k, and the vertical axis is VRE(k). In FIGS. 43 and 44, the equation of the product-sum operation used to calculate the vibration rectification error VRE (k) is different.

FIG. 43 is diagram plotting the vibration rectification error VRE(k) obtained by the product-sum operation of the above Equation (4). In FIG. 43, Q1 is a vibration rectification error VRE(k) obtained by using the source signal acquired under the first measurement condition. Q2 is a vibration rectification error VRE(k) obtained by using the source signal acquired under the second measurement condition. Q3 is a vibration rectification error VRE(k) obtained by using the source signal acquired under the third measurement condition. Q4 is a vibration rectification error VRE(k) obtained by using the source signal acquired under the fourth measurement condition.

FIG. 44 is a diagram plotting the vibration rectification error VRE(k) obtained by the product-sum operation of the above Equation (5). In FIG. 44, R1 is a vibration rectification error VRE(k) obtained by using the source signal acquired under the first measurement condition. R2 is a vibration rectification error VRE(k) obtained by using the source signal acquired under the second measurement condition. R3 is a vibration rectification error VRE(k) obtained by using the source signal acquired under the third measurement condition. R4 is a vibration rectification error VRE(k) obtained by using the source signal acquired under the fourth measurement condition.

For example, in the signal processing device 400, in Q1, Q2, R1, and R2, the difference between the maximum value and the minimum value of VRE(k) is larger than the threshold value, and therefore it is determined that the resonance frequency calculated by using VRE(k) of Q1, Q2, R1, and R2 is correct, and it is determined whether or not the sensitivity of the physical quantity sensor 200 is within the specifications based on the calculated resonance frequency. On the other hand, in Q3, Q4, R3 and R4, the difference between the maximum value and the minimum value of VRE(k) is smaller than the threshold value, and the signal processing device 400 uses VRE(k) of Q3, Q4, R3 and R4 to determine that the calculated resonance frequency is not correct.

According to the fourth embodiment described above, the same effects as those of the first to third embodiments are obtained. Further, according to the fourth embodiment, since the signal processing device 400 calculates the cantilever resonance frequency, the user or the signal processing device 400 can perform various analyses based on the cantilever resonance frequency.

Further, according to the fourth embodiment, the larger the cantilever resonance is excited, the larger the difference between the maximum value and the minimum value of the calculated plurality of vibration rectification errors becomes, and therefore the signal processing device 400 can determine whether the calculated cantilever resonance frequency is correct or not based on the difference. For example, only when it is determined that the calculated cantilever resonance frequency is correct, the user or the signal processing device 400 can perform various analyses based on the cantilever resonance frequency, for example, determine whether or not the sensitivity of the physical quantity sensor 200 is within the specifications.

5. Fifth Embodiment

Hereinafter, regarding a fifth embodiment, the same components as any of the first to fourth embodiments are designated by the same reference numerals, the description overlapping with any of the first to fourth embodiments is omitted or simplified, and the contents different from those of the first to fourth embodiments will be mainly described.

As described with reference to FIGS. 16A to 16D, in the frequency ratio measurement circuit 202 included in the physical quantity measurement device 2 of the sensor module 1, the vibration rectification error changes at regular periods with respect to the change in the group delay amount of the first low-pass filter 310. This period is determined by the cantilever resonance frequency and the frequency of the physical quantity detection element 40, and when the cantilever resonance frequency or the frequency of the physical quantity detection element 40 changes, the fluctuation period of the vibration rectification error also changes. Therefore, by measuring the period of the change in the vibration rectification error with respect to the change in the group delay amount of the first low-pass filter 310, it is possible to obtain a determination index as to whether or not the sensitivity of the physical quantity sensor 200 is within the specifications. Therefore, in the fifth embodiment, a plurality of vibration rectification errors are generated by changing the group delay amount of the first low-pass filter 310.

In the fifth embodiment, since the structure and functional configuration of the sensor module 1 are the same as those in FIGS. 1 to 8, the description thereof will be omitted.

In the fifth embodiment, the physical quantity measurement device 2 of the sensor module 1 has a normal operation mode for measuring the frequency ratio between the measured signal SIN and the reference signal CLK described above, and an inspection mode for checking the sensitivity of the physical quantity sensor 200. When the micro-control unit 210 receives a predetermined command from the signal processing device 400 via the interface circuit 230, the physical quantity measurement device 2 is set to the normal operation mode or the inspection mode. For example, in the manufacturing step of the sensor module 1, the signal processing device 400 may set the physical quantity measurement device 2 to the inspection mode, and the physical quantity measurement device 2 may check the sensitivity of the physical quantity sensor 200. The signal processing device 400 may select non-defective products of the sensor module 1 based on the result of the sensitivity check. Alternatively, after the sensor module 1 is installed and before operation, the signal processing device 400 may set the physical quantity measurement device 2 to the inspection mode, and the physical quantity measurement device 2 may check the sensitivity of the physical quantity sensor 200. If there is no abnormality in the sensitivity of the physical quantity sensor 200 based on the result of the sensitivity check, the signal processing device 400 sets the physical quantity measurement device 2 to the normal operation mode and operates the sensor module 1. In the normal operation mode, the measurement value with the vibration rectification error corrected can be obtained. Further, the signal processing device 400 may periodically set the physical quantity measurement device 2 to the inspection mode, and the physical quantity measurement device 2 may check the sensitivity of the physical quantity sensor 200. The normal operation mode is an example of a "first operation mode", and the inspection mode is an example of a "second operation mode".

In the inspection mode, the physical quantity sensor 200 is operated in a stable vibration environment, and the micro-control unit 210 of the physical quantity measurement device 2 functions as a control circuit to acquire the group delay amount dependence of the vibration rectification error based on the output signal of the physical quantity sensor 200 while changing the group delay amount of the first low-pass filter 310. Therefore, first, the micro-control unit 210 sets the cutoff frequency of the second low-pass filter 330 to be lower than that in the normal operation mode. Specifically, the micro-control unit 210 sets the cutoff frequency of the second low-pass filter 330 to, for example, several Hz so that the vibration rectification error included in the output value of the second low-pass filter 330 is emphasized. For example, the micro-control unit 210 may set the cutoff frequency to be lower than that in the normal operation mode by increasing the number of taps of the second low-pass filter 330.

Further, the micro-control unit 210 acquires the vibration rectification error of the measurement value while sequentially changing the number of taps na with respect to the first low-pass filter 310 having the configuration illustrated in FIG. 14, and stores the number of taps and the vibration rectification error in the storage unit 220 in association with each other.

The signal processing device 400 reads out the correspondence information between the number of taps and the vibration rectification error from the storage unit 220 via the interface circuit 230 to calculate the period in which the vibration rectification error changes from a graph plotting the relationship between the number of taps and the vibration rectification error as illustrated in FIG. 17. Since this period is determined by the cantilever resonance frequency and the frequency of the physical quantity detection element 40, the signal processing device 400 can back-calculate the cantilever resonance frequency. The signal processing device 400 can determine whether or not the sensitivity of the physical quantity sensor 200 is within the specifications based on the calculated cantilever resonance frequency.

Alternatively, the micro-control unit 210 may read out the correspondence information between the number of taps and the vibration rectification error from the storage unit 220 to calculate the cantilever resonance frequency based on the graph plotting the relationship between the number of taps and the vibration rectification error and determine whether or not the sensitivity of the physical quantity sensor 200 is within the specifications.

The first low-pass filter 310 is an example of the "first filter". The second low-pass filter 330 is an example of the "second filter".

Figure 45:
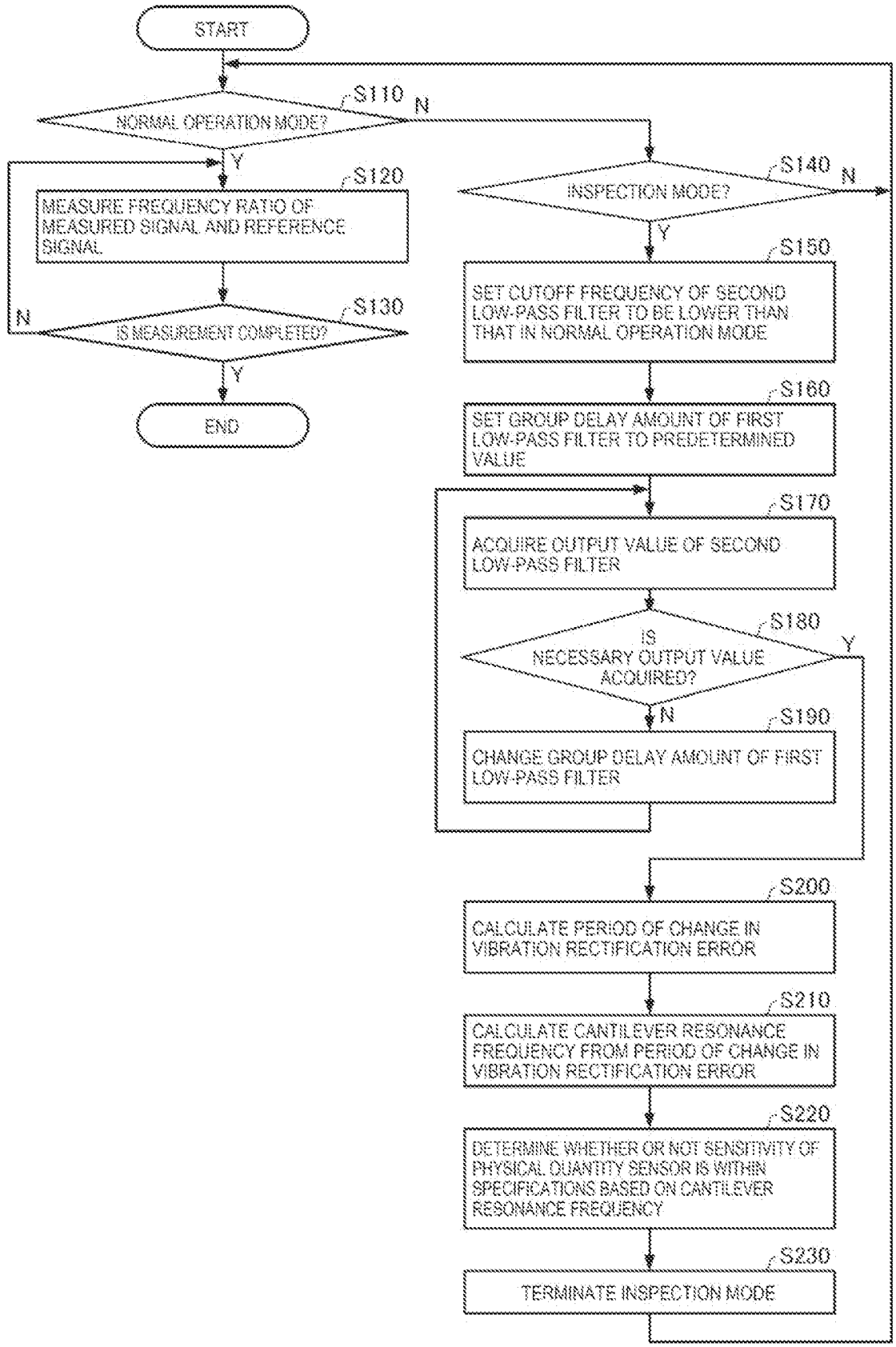
FIG. 45 is a diagram illustrating a configuration example of a signal processing device according to a fifth embodiment.

FIG. 45 is a flowchart illustrating an example of a procedure of a signal processing method of the fifth embodiment.

As illustrated in FIG. 45, first, when the normal operation mode is set in step S110, the physical quantity measurement device 2 measures the frequency ratio of the measured signal SIN and the reference signal CLK in step S120.

In step S130, the physical quantity measurement device 2 repeats step S120 until the measurement is completed.

When the normal operation mode is not set in step S110 and the inspection mode is set in step S140, in step S150, the physical quantity measurement device 2 sets the cutoff frequency of the second low-pass filter 330 to be lower than that in the normal operation mode.

Next, in step S160, the physical quantity measurement device 2 sets the group delay amount of the first low-pass filter 310 to a predetermined value. Specifically, the physical quantity measurement device 2 sets the number of taps na to a predetermined value.

Next, in step S170, the physical quantity measurement device 2 acquires the output value of the second low-pass filter 330.

Next, in step S180, the physical quantity measurement device 2 determines whether or not all the output values of the second low-pass filter 330 necessary for the sensitivity determination have been acquired.

When the acquisition of the required output value is not completed, the physical quantity measurement device 2 changes the group delay amount of the first low-pass filter 310 in step S190. Specifically, the physical quantity measurement device 2 changes the number of taps na.

When the acquisition of the required output value is completed, in step S200, the signal processing device 400 or the physical quantity measurement device 2 calculates the period of change in the vibration rectification error by using the output values of the plurality of second low-pass filters 330 acquired in the step S170.

Next, in step S210, the signal processing device 400 or the physical quantity measurement device 2 calculates the cantilever resonance frequency from the period of change in the vibration rectification error.

Next, in step S220, the signal processing device 400 or the physical quantity measurement device 2 determines whether or not the sensitivity of the physical quantity sensor 200 is within the specifications based on the cantilever resonance frequency.

In step S230, the inspection mode of the physical quantity measurement device 2 is terminated, and steps S110 and subsequent steps are repeated.

In the fifth embodiment described above, in the normal operation mode of the physical quantity measurement device 2, as described in the first embodiment, the first low-pass filter 310 operates in synchronization with the measured signal SIN, and the second low-pass filter 330 operates in synchronization with the reference signal CLK different from the measured signal SIN, and therefore non-linearity occurs in the relationship between the frequency delta-sigma modulated signal input to the first low-pass filter 310 and the output signal of the second low-pass filter 330. The vibration rectification error caused by this non-linearity changes according to the group delay amount of the first low-pass filter 310. Therefore, according to the fifth embodiment, in the normal operation mode of the physical quantity measurement device 2, by setting the group delay amount of the first low-pass filter 310 to an appropriate value, the vibration rectification error caused by this non-linearity and the vibration rectification error caused by the asymmetry of the measured signal SIN cancel each other out, and the vibration rectification error included in the output signal of the second low-pass filter 330 is reduced.

On the other hand, in the inspection mode of the physical quantity measurement device 2, by setting the cutoff frequency of the second low-pass filter 330 to be lower than that in the normal operation mode, the vibration rectification error included in the signal output from the second low-pass filter 330 is emphasized. Therefore, by acquiring the output signal of the second low-pass filter 330 while changing the group delay amount of the first low-pass filter 310, information indicating the relationship between the group delay amount and the vibration rectification error can be obtained. The period of change in the vibration rectification error included in this information correlates with the period of the signal component due to the cantilever resonance included in the measured signal SIN. Therefore, according to the fifth embodiment, in the inspection mode of the physical quantity measurement device 2, it is possible to detect the signal component having periodicity included in the measured signal SIN without performing the envelope processing. Further, for example, the physical quantity measurement device or the signal processing device 400 can calculate the cantilever resonance frequency of the physical quantity sensor 200 by using the information indicating the relationship between the group delay amount and the vibration rectification error to determine whether or not the sensitivity of the physical quantity sensor 200 is within the specifications based on the cantilever resonance frequency.

6. Modification Example

The present disclosure is not limited to the present embodiment, and various modifications can be made within the scope of the gist of the present disclosure.

For example, in each of the above embodiments, the sensor module 1 includes three physical quantity sensors 200, but the number of the physical quantity sensors 200 included in the sensor module 1 may be one, two, or four or more.

In addition, in each of the above embodiments, as the physical quantity sensor 200, the sensor module 1 provided with an acceleration sensor is described as an example, but the sensor module 1 may include sensors such as an angular velocity sensor, a pressure sensor, and an optical sensor as the physical quantity sensor 200. In addition, the sensor module 1 may be provided with two or more types of physical quantity sensors among various physical quantity sensors such as an acceleration sensor, an angular velocity sensor, a pressure sensor, and an optical sensor.

In addition, in each of the above embodiments, an element configured by using quartz crystal as the physical quantity detection element 40 included in the physical quantity sensor 200 is given as an example, but the physical quantity detection element 40 may be configured by using a piezoelectric element other than quartz crystal, or may be a capacitance type MEMS element. MEMS is an abbreviation for micro electro mechanical systems.

The present disclosure is not limited to the present embodiment, and various modifications can be made within the scope of the gist of the present disclosure.

The above embodiments and modification examples are merely examples, and the present disclosure is not limited thereto. For example, it is possible to appropriately combine each embodiment and each modification example.

The present disclosure includes substantially the same configuration as the configuration described in the embodiments (for example, a configuration having the same function, method, and result, or a configuration having the same object and effect). In addition, the present disclosure includes a configuration in which a non-essential part of the configuration described in the embodiment is replaced. In addition, the present disclosure includes a configuration that exhibits the same operational effects as the configuration described in the embodiment or a configuration that can achieve the same object. In addition, the present disclosure includes a configuration in which a known technique is added to the configuration described in the embodiment.

The following contents are derived from the above-described embodiments and modification examples.

The signal processing method according to one aspect includes a processing target signal generation step of generating a processing target signal which is a time-series signal based on a source signal which is a time-series signal output from an object, and a vibration rectification error calculation step of performing product-sum operation processing of a first signal based on the processing target signal and a second signal based on a phase-shifted signal of the processing target signal a plurality of times by changing a shift amount to calculate a plurality of vibration rectification errors.

In this signal processing method, the first signal based on the processing target signal generated based on the source signal and the second signal based on the phase-shifted signal of the processing target signal include the signal component having periodicity generated by the object in common. Therefore, ergodic signal components such as noise are attenuated by the product-sum operation processing of the first signal and the second signal, while the signal components having periodicity strengthen or weaken each other according to the phase difference between the first signal and the second signal. As a result, the plurality of vibration rectification errors obtained by performing the product-sum operation processing a plurality of times by changing the shift amount have different magnitudes depending on the phase difference between the first signal and the second signal and the period of the signal components having periodicity. Therefore, according to this signal processing method, it is possible to detect a signal component having periodicity included in a signal output from an object without performing envelope processing.

Further, according to this signal processing method, since it is necessary to acquire the source signal for a predetermined time only once in order to calculate a plurality of vibration rectification errors, high-speed arithmetic processing is possible, and environmental changes such as temperature changes in a short time when the source signal is acquired are extremely small, calculation errors caused by environmental changes are reduced.

In the signal processing method according to one aspect, the first signal may be a signal obtained by filtering the processing target signal.

According to this signal processing method, the noise components included in the first signal are reduced by the filtering process, and therefore the detection accuracy of the signal component having periodicity is improved.

In the signal processing method according to one aspect, the second signal may be a signal obtained by filtering a phase-shifted signal of the processing target signal.

According to this signal processing method, the noise components included in the second signal are reduced by the filtering process, and therefore the detection accuracy of the signal component having periodicity is improved.

In the signal processing method according to one aspect, the filtering process may be a smoothing filtering process.

According to this signal processing method, the smoothing filtering process reduces the high-frequency noise components included in the first signal or the second signal, and therefore the detection accuracy of the signal component having periodicity is improved.

In the signal processing method according to one aspect, the filtering process may be a band-limiting filtering process.

According to this signal processing method, the band-limiting filtering process reduces many signal components other than the signal components having periodicity included in the first signal and the second signal, and therefore the detection accuracy of signal components having periodicity is improved.

In the signal processing method according to one aspect, the first signal may be a signal obtained by removing or reducing the DC component of the processing target signal.

According to this signal processing method, each sample value of the first signal becomes smaller, and therefore the load of the product-sum operation of the first signal and the second signal is reduced, and the calculation accuracy is improved.

In the signal processing method according to one aspect, the second signal may be a signal obtained by removing or reducing the DC component of the phase-shifted signal of the processing target signal.

According to this signal processing method, each sample value of the second signal becomes smaller, and therefore the load of the product-sum operation of the first signal and the second signal is reduced, and the calculation accuracy is improved.

In the signal processing method according to one aspect, the first signal may be a signal obtained by applying a window function to the processing target signal.

According to this signal processing method, because the discontinuity between the first sample value and the last sample value of the first signal is alleviated, the detection accuracy of the signal component having periodicity is improved.

In the signal processing method according to one aspect, the second signal may be a signal obtained by applying a window function to a phase-shifted signal of the processing target signal.

According to this signal processing method, because the discontinuity between the first sample value and the last sample value of the second signal is alleviated, the detection accuracy of the signal component having periodicity is improved.

In the signal processing method according to one aspect, the number of additions in the product-sum operation processing may be larger than a value obtained by dividing a sampling frequency of the source signal by a resonance frequency of the object.

According to this signal processing method, in the product-sum operation processing, the signal components of the resonance frequency of the object included in the first signal and the second signal are integrated for one period or more, and therefore the signal component of the resonance frequency is effectively detected.

The signal processing method according to one aspect may further include a resonance frequency calculation step of calculating a resonance frequency of the object based on the plurality of vibration rectification errors.

According to this signal processing method, the resonance frequency of the object is calculated, and therefore the user can perform various analyses based on the resonance frequency.

The signal processing method according to one aspect may further include a determination step of determining whether the calculated resonance frequency is correct or not based on the difference between a maximum value and a minimum value of the plurality of vibration rectification errors.

In this signal processing method, the larger the resonance is excited in the object, the larger the difference between the maximum value and the minimum value of the calculated plurality of vibration rectification errors becomes, and therefore it is possible to determine whether the calculated resonance frequency is correct or not based on the difference. According to this signal processing method, for example, the user can perform various analyses based on the resonance frequency only when it is determined that the calculated resonance frequency is correct.

The signal processing device according to one aspect includes a processing target signal generation circuit that generates a processing target signal which is a time-series signal based on a source signal which is a time-series signal output from an object, and a vibration rectification error calculation circuit that performs product-sum operation processing of a first signal based on the processing target signal and a second signal based on the phase-shifted signal of the processing target signal a plurality of times by changing a shift amount to generate a plurality of vibration rectification errors.

In this signal processing device, the first signal based on the processing target signal generated based on the source signal and the second signal based on the phase-shifted signal of the processing target signal include a signal component having periodicity output from the object in common. Therefore, ergodic signal components such as noise are attenuated by the product-sum operation processing of the first signal and the second signal, while the signal components having periodicity strengthen or weaken each other according to the phase difference between the first signal and the second signal. As a result, the plurality of vibration rectification errors obtained by performing the product-sum operation processing a plurality of times by changing the shift amount have different magnitudes depending on the phase difference between the first signal and the second signal and the period of the signal components having periodicity. Therefore, according to this signal processing device, it is possible to detect a signal component having periodicity included in a signal output from an object without performing envelope processing.

Further, according to this signal processing device, since it is necessary to acquire the source signal for a predetermined time only once in order to calculate a plurality of vibration rectification errors, high-speed arithmetic processing is possible, and environmental changes such as temperature changes in a short time when the source signal is acquired are extremely small, calculation errors caused by environmental changes are reduced.

The physical quantity measurement device according to one aspect includes a reference signal generation circuit that outputs a reference signal, a frequency delta-sigma modulation circuit that performs frequency delta-sigma modulation on the reference signal by using a measured signal to generate a frequency delta-sigma modulated signal, a first filter that operates in synchronization with the measured signal and has a variable group delay amount, and a second filter that operates in synchronization with the reference signal, in which the first filter is provided on a signal path from an output of the frequency delta-sigma modulation circuit to an input of the second filter, and the physical quantity measurement device has a first operation mode for measuring a frequency ratio of the measured signal and the reference signal, and a second operation mode in which a cutoff frequency of the second filter is lower than that in the first operation mode.

In this physical quantity measurement device, in the first operation mode, the first filter operates in synchronization with the measured signal, and the second filter operates in synchronization with a reference signal different from the measured signal, and therefore non-linearity occurs in the relationship between the frequency delta-sigma modulated signal and the output signal of the second filter. The vibration rectification error caused by this non-linearity changes according to the group delay amount of the first filter. Therefore, according to this physical quantity measurement device, in the first operation mode, by setting the group delay amount of the first filter to an appropriate value, the vibration rectification error caused by this non-linearity and the vibration rectification error caused by the asymmetry of the measured signal cancel each other out, and the vibration rectification error included in the output signal of the second filter is reduced.

Further, in this physical quantity measurement device, in the second operation mode, by setting the cutoff frequency of the second filter to be lower than that in the first operation mode, the vibration rectification error included in the signal output from the second filter is emphasized. Therefore, by acquiring the output signal of the second filter while changing the group delay amount of the first filter, information indicating the relationship between the group delay amount and the vibration rectification error can be obtained. The period of change in the vibration rectification error included in this information correlates with the period of the signal component having periodicity included in the measured signal. Therefore, according to this physical quantity measurement device, in the second operation mode, it is possible to detect the signal component having periodicity included in the measured signal without performing the envelope processing.

The sensor module according to one aspect includes the physical quantity measurement device according to still another aspect, and a physical quantity sensor, in which the measured signal is a signal based on an output signal of the physical quantity sensor.

According to this sensor module, by providing the physical quantity measurement device, in the first operation mode, a highly accurate measurement value of the physical quantity with reduced vibration rectification error can be obtained, and in the second operation mode, the signal component of the resonance frequency generated by the structural resonance of the physical quantity sensor can be detected.

What is claimed is:

1. A signal processing method comprising:
   a processing target signal generation step of generating a processing target signal which is a time-series signal based on a source signal which is a time-series signal output from an object;
   a vibration rectification error calculation step of calculating a plurality of vibration rectification errors by performing product-sum operation processing of a first signal based on the processing target signal and a second signal based on a phase-shifted signal of the processing target signal a plurality of times by changing a group delay amount of a low-pass filter;
   a resonance frequency calculation step of calculating a resonance frequency of the object based on the plurality of vibration rectification errors; and
   a determination step of determining whether the calculated resonance frequency is correct or not based on a difference between a maximum value and a minimum value of the plurality of vibration rectification errors.

2. The signal processing method according to claim 1, wherein
   the first signal is a signal obtained by performing a filtering process on the processing target signal.

3. The signal processing method according to claim 1, wherein
   the second signal is a signal obtained by performing a filtering process on the phase-shifted signal of the processing target signal.

4. The signal processing method according to claim 2, wherein
   the filtering process is a smoothing filtering process.

5. The signal processing method according to claim 2, wherein
   the filtering process is a band-limiting filtering process.

6. The signal processing method according to claim 1, wherein
   the first signal is a signal obtained by removing or reducing DC component of the processing target signal.

7. The signal processing method according to claim 1, wherein
   the second signal is a signal obtained by removing or reducing DC component of the phase-shifted signal of the processing target signal.

8. The signal processing method according to claim 1, wherein
   the first signal is a signal obtained by applying a window function to the processing target signal.

9. The signal processing method according to claim 1, wherein
   the second signal is a signal obtained by applying a window function to the phase-shifted signal of the processing target signal.

10. The signal processing method according to claim 1, wherein
    the number of additions in the product-sum operation processing is larger than a value obtained by dividing a sampling frequency of the source signal by a resonance frequency of the object.

11. A signal processing device comprising:
    a processing target signal generation circuit configured to generate a processing target signal which is a time-series signal based on a source signal which is a time-series signal output from an object;
    a vibration rectification error calculation circuit configured to generate a plurality of vibration rectification errors by performing product-sum operation processing of a first signal based on the processing target signal and a second signal based on a phase-shifted signal of the processing target signal a plurality of times by changing a group delay amount of a low-pass filter;
    a resonance frequency calculation circuit configured to calculate a resonance frequency of the object based on the plurality of vibration rectification errors; and
    a determination circuit configured to determine whether the calculated resonance frequency is correct or not based on a difference between a maximum value and a minimum value of the plurality of vibration rectification errors.

* * * * *